United States Patent
Torii et al.

(10) Patent No.: US 7,185,540 B2
(45) Date of Patent: Mar. 6, 2007

(54) PIEZOELECTRIC ELEMENT, INK JET HEAD, ANGULAR VELOCITY SENSOR, METHOD FOR MANUFACTURING THE SAME, AND INK JET RECORDING APPARATUS

(75) Inventors: Hideo Torii, Osaka (JP); Eiji Fujii, Osaka (JP); Atsushi Tomozawa, Osaka (JP); Akiko Murata, Osaka (JP); Ryoichi Takayama, Osaka (JP); Taku Hirasawa, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/409,469

(22) Filed: Apr. 21, 2006

(65) Prior Publication Data

US 2006/0187272 A1  Aug. 24, 2006

Related U.S. Application Data

(62) Division of application No. 10/462,358, filed on Jun. 16, 2003, now Pat. No. 7,083,270.

(30) Foreign Application Priority Data

Jun. 20, 2002 (JP) .............................. 2002-180273
Jun. 20, 2002 (JP) .............................. 2002-180292

(51) Int. Cl.
 *G01P 9/04* (2006.01)
 *H01L 41/047* (2006.01)
 *H01L 41/083* (2006.01)

(52) U.S. Cl. .................. 73/504.16; 310/360; 310/363; 310/370

(58) Field of Classification Search ............. 73/504.16; 310/370

See application file for complete search history.

(56) References Cited

U.S. PATENT DOCUMENTS 5,438,231 A * 8/1995 Khoshnevisan et al. .... 310/321

(Continued)

FOREIGN PATENT DOCUMENTS

JP   06116095 A   4/1994

(Continued)

OTHER PUBLICATIONS

R. Takayama et al.; "Preparation of epitaxial $Pb(Zr_xTi_{1-x})O_3$ thin films and their crystallographic, pyroelectric, and ferroelectric properties"; Journal of Applied Physics; vol. 65, No. 4; Feb. 15, 1989; pp. 1666-1670.

(Continued)

*Primary Examiner*—Hezron Williams
*Assistant Examiner*—John C Hanley
(74) *Attorney, Agent, or Firm*—Harness, Dickey & Pierce, PLC

(57) ABSTRACT

In a piezoelectric element 20, a first electrode layer 2 made of an alloy of at least one metal selected from the group consisting of cobalt, nickel, iron, manganese and copper and a noble metal is formed on a silicon substrate 1, and a piezoelectric layer 3 made of a rhombohedral or tetragonal perovskite oxide (e.g., PZT) is formed on the first electrode layer 2 so that the piezoelectric layer 3 is preferentially oriented along the (001) plane.

2 Claims, 24 Drawing Sheets

U.S. PATENT DOCUMENTS

| | | | |
|---|---|---|---|
| 5,691,593 A | 11/1997 | Takeuchi et al. | |
| 5,998,236 A | 12/1999 | Roeder et al. | |
| 6,194,818 B1 * | 2/2001 | Sumi et al. | 310/311 |
| 7,083,270 B2 * | 8/2006 | Torii et al. | 347/68 |

FOREIGN PATENT DOCUMENTS

| | | |
|---|---|---|
| JP | 10081016 A | 3/1998 |
| JP | 10209517 A | 8/1998 |
| JP | 11191646 A | 7/1999 |
| JP | 2000252544 A | 9/2000 |
| JP | 2001088294 A | 4/2001 |
| JP | 2001332041 A | 11/2001 |

OTHER PUBLICATIONS

P. Muralt et al.; "Texture control of $PbTiO_3$ and $Pb(Zr,Ti)TiO_3$ thin films with $TiO_2$ Seeding"; Journal of Applied Physics; vol. 83, No. 7; Apr. 1, 1998; pp. 3835-3841.

* cited by examiner

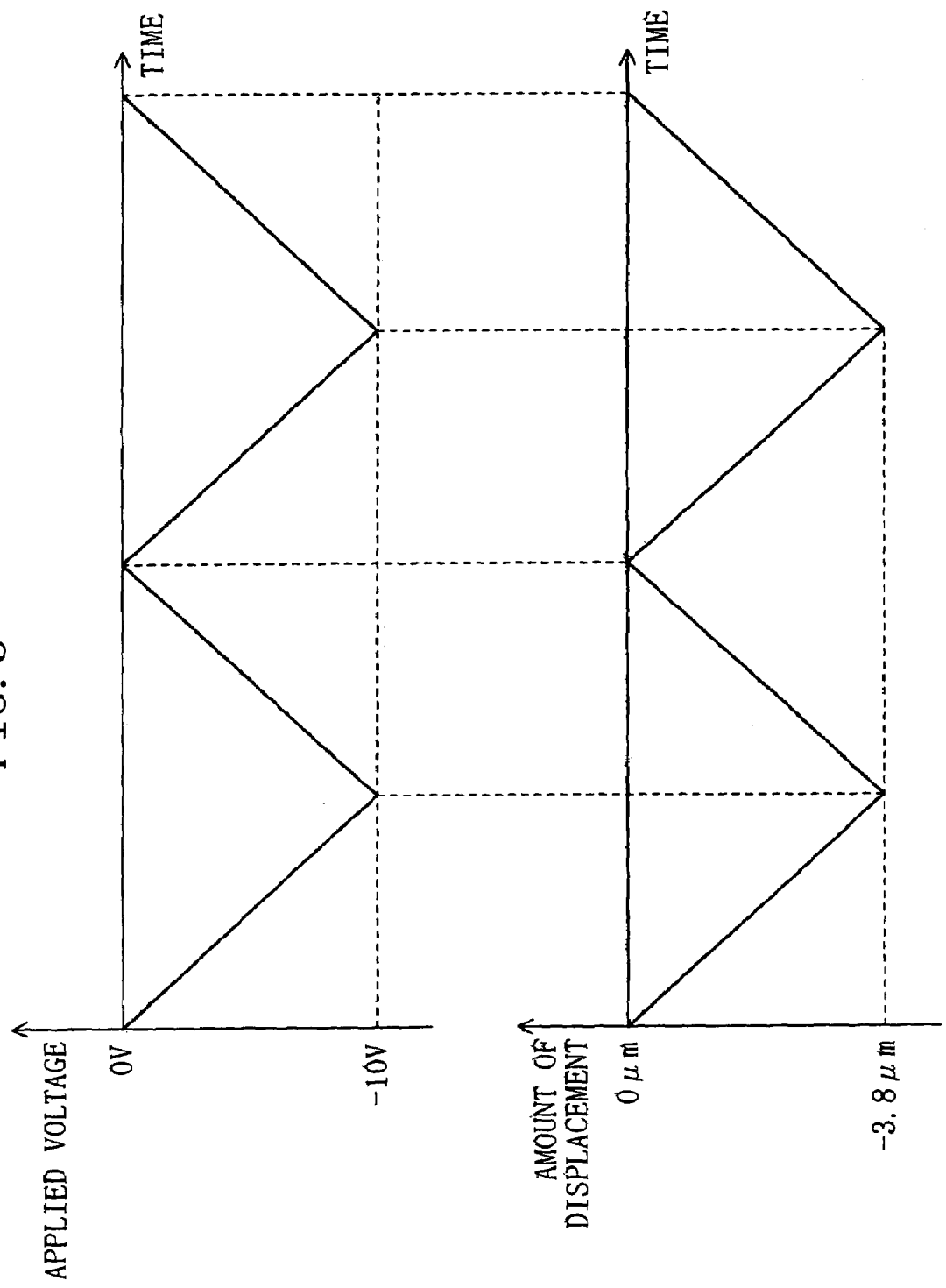

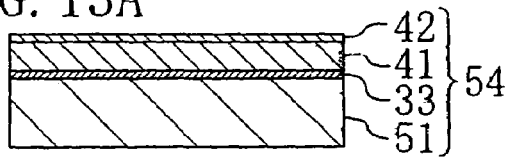
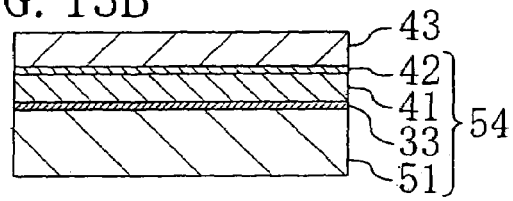
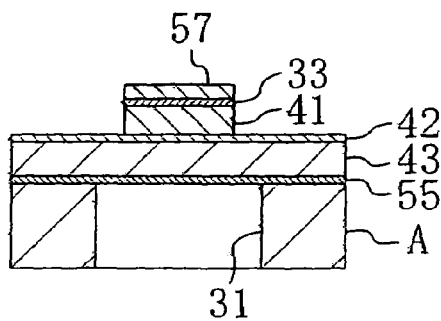
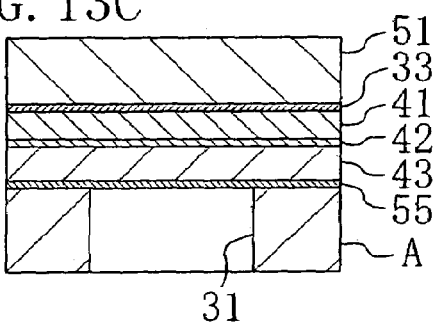
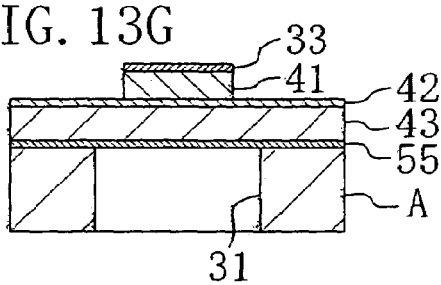
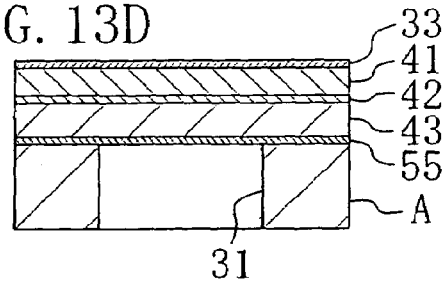
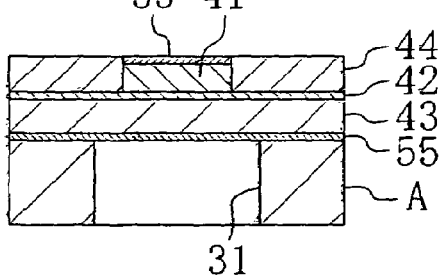
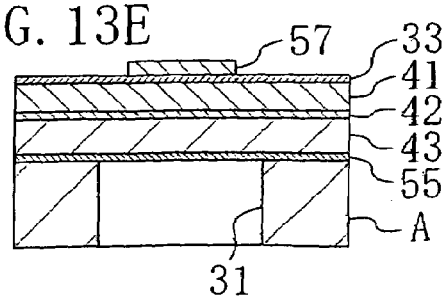
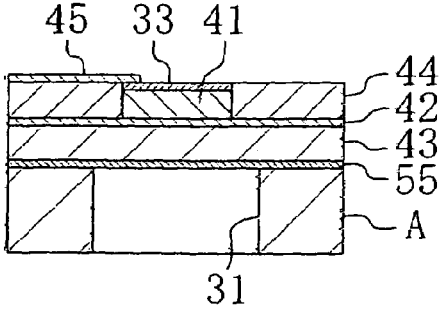

PIEZOELECTRIC ELEMENT, INK JET HEAD, ANGULAR VELOCITY SENSOR, METHOD FOR MANUFACTURING THE SAME, AND INK JET RECORDING APPARATUS

CROSS-REFERENCE TO RELATED APPLICATIONS

This application is a divisional of U.S. patent application Ser. No. 10/462,358 filed on Jun. 16, 2003 now U.S. Pat. No. 7,083,270, which claims the benefit of Japanese Patent Application Nos. 2002-180273 and 2002-180292 both filed Jun. 20, 2002. The disclosure(s) of the above application(s) are incorporated herein by reference.

BACKGROUND OF THE INVENTION

The present invention relates to a piezoelectric element having an electro-mechanical conversion function, an ink jet head using the piezoelectric element, an angular sensor, a method for manufacturing the same, and an ink jet recording apparatus including the ink jet head as printing means.

Generally, a piezoelectric material is a material capable of converting a mechanical energy to an electrical energy and vice versa. A typical example of a piezoelectric material is lead zirconate titanate having a perovskite crystalline structure ($Pb(Zr,Ti)O_3$) (hereinafter referred to as "PZT"). In PZT, the greatest piezoelectric displacement is obtained in the <001> direction (the c axis direction) in the case of a tetragonal system, and in the <111> direction in the case of a rhombohedral system. However, many of the piezoelectric materials are polycrystals made up of a collection of crystal grains, and the crystallographic axes of the crystal grains are oriented randomly. Therefore, the spontaneous polarizations Ps are also arranged randomly.

Along with the recent downsizing of electronic appliances, there is a strong demand for reducing the size of piezoelectric elements using a piezoelectric material. In order to meet the demand, more piezoelectric elements are used in the form of thin films whose volumes can be significantly reduced from those of sinters, which have conventionally been used in various applications, and active researches and developments have been made for reducing the thickness of thin-film piezoelectric elements. For example, in the case of tetragonal PZT, the spontaneous polarization Ps is oriented in the c axis direction. Therefore, in order to realize superior piezoelectric characteristics even with a reduced thickness, the c axes of crystal grains forming a PZT thin film need to be aligned vertical to the substrate plane. In order to realize such an alignment, a method as follows has been used in the prior art. On a single crystal substrate made of magnesium oxide (MgO) having an NaCl-type crystalline structure, which has been cut out so that the surface thereof is along the crystal orientation of the (100) plane, a (100)-oriented Pt electrode thin film is formed as a lower electrode on the substrate by a sputtering method, and a PZT thin film having a desirable crystallinity and whose c axis is oriented vertical to the surface of the Pt electrode is formed on the Pt electrode at a temperature of 600 to 700° C. (see, for example, Journal of Applied Physics vol. 65 No. 4 (published on 15 Feb. 1989 from the American Physical Society) pp. 1666–1670, and Japanese Laid-Open Patent Publication No. 10-209517).

It is characteristic of this method that an MgO single-crystal substrate, which makes it possible to realize a piezoelectric thin film that is preferentially oriented in the crystallographic direction in which superior piezoelectric characteristics are exhibited. However, since the MgO single crystal is a very expensive material, it is very costly to mass-produce industrial products using piezoelectric elements including piezoelectric thin films that are formed by this method.

In view of this, various methods have been developed for forming a well-oriented film of a piezoelectric material on an inexpensive substrate such as a silicon substrate. For example, as a method for controlling the plane along which the crystal of a piezoelectric layer such as PZT is preferentially oriented, Japanese Laid-Open Patent Publication No. 2001-88294 discloses a manufacturing method (a sol-gel method) including: forming a base layer whose main component is zirconium oxide on the surface of a substrate; forming a lower electrode containing iridium on the base layer; depositing a very thin titanium layer on the lower electrode; forming an amorphous piezoelectric precursor thin film containing metal element and oxygen element, which forms a ferroelectric that exhibits piezoelectric characteristics, on the titanium layer; and crystallizing the amorphous thin film through a heat treatment at a high temperature, thereby turning the amorphous thin film into a piezoelectric thin film that exhibits a piezoelectric property. It is also disclosed that it is possible to control the crystal orientation of the piezoelectric thin film by controlling the thickness of the titanium layer.

However, while the method disclosed in Japanese Laid-Open Patent Publication No. 2001-88294, supra, is a desirable method that does not use an expensive MgO single-crystal substrate, it is difficult to obtain a well-oriented film having a desirable crystallinity in the film formation process, as in the case of forming a piezoelectric thin film on an MgO single-crystal substrate, because the piezoelectric thin film is formed by a sol-gel method. In view of this, an amorphous piezoelectric precursor thin film is first formed, and then the layered structure including the substrate and the precursor thin film is subjected to a heat treatment in the final step, so that the crystallographic axes are preferentially oriented in a desirable direction.

Thus, when piezoelectric elements are mass-produced with a sol-gel method, the amorphous piezoelectric precursor thin film is likely to be cracked due to changes in the volume during the degreasing step of removing organic substances. Moreover, in the step of heating and crystallizing the amorphous piezoelectric precursor thin film at a high temperature, the film is likely to be cracked or peeled off from the lower electrode due to crystal changes. Furthermore, the heat treatment step after the deposition process adds to the number of steps, whereby the production yield may be reduced.

On the other hand, according to Japanese Laid-Open Patent Publication No. 2001-88294, supra, states that attempts were made to control the orientation of a PZT film, which is a typical ferroelectric thin film, by using a method other than a sol-gel method (including an MOD method) (in which an amorphous thin film is once formed and then the thin film is turned into a crystalline thin film through an aftertreatment such as a heat treatment for crystallization), i.e., by using a method in which a crystalline thin film is directly formed without the crystallization step using a heat treatment, e.g., a sputtering method, a laser ablation method or a CVD method, and that the orientation could not be controlled by any method other than a sol-gel method. The reason is stated to be as follows. The crystallization of the PZT film proceeds gradually from the lower electrode side to the upper electrode side with a sol-gel method, whereas with a CVD method or a sputtering method, the crystallization of the PZT film proceeds randomly, resulting in irregular crystallization, and thus making the orientation control difficult.

SUMMARY OF THE INVENTION

The present invention has been made in view of the above, and has an object to provide a reliable piezoelectric element with desirable piezoelectric characteristics at low cost.

In order to achieve the object set forth above, the present invention uses an electrode layer made of an alloy of at least one metal selected from the group consisting of cobalt, nickel, iron, manganese and copper and a noble metal, and a piezoelectric layer made of a rhombohedral or tetragonal perovskite oxide is formed on the electrode layer so that the piezoelectric layer is preferentially oriented along the (001) plane.

Specifically, a piezoelectric element of the present invention includes: a first electrode layer; a piezoelectric layer provided on the first electrode layer; and a second electrode layer provided on the piezoelectric layer, wherein: the first electrode layer is made of an alloy of at least one metal selected from the group consisting of cobalt, nickel, iron, manganese and copper and a noble metal; and the piezoelectric layer is made of a rhombohedral or tetragonal perovskite oxide that is preferentially oriented along a (001) plane.

With such a structure, when the piezoelectric layer is formed on the first electrode layer by a sputtering method, or the like, the first electrode layer functions as a crystal orientation control layer, whereby the piezoelectric layer is likely to be oriented along the (001) plane (since the (100) plane and the (001) plane are the same in a rhombohedral system, the rhombohedral (100) orientation is included herein), even if the first electrode layer is oriented along the (111) plane, or the like. Specifically, the first electrode layer, which serves as a base layer immediately under the piezoelectric layer, is made of an alloy material including metal (e.g., cobalt, nickel, iron, manganese or copper) atoms, which are relatively likely to chemically adsorb oxygen, and noble metal (e.g., platinum) atoms, which are unlikely to be oxidized, and it is inferred that the surface of the first electrode layer is a smooth surface along which the metal atoms are present in a dotted pattern among the noble metal atoms. When a piezoelectric layer made of a perovskite crystalline structure oxide (preferably with a lead content that exceeds the stoichiometric composition) such as PZT is formed on the first electrode layer by a sputtering method, an inert argon gas mixed with oxygen is used as a sputtering gas so as to stabilize the amount of oxygen of the oxide. In this process, the oxygen atoms of the gas are first adsorbed onto the metal (e.g., cobalt) atoms that are present in a dotted pattern along the smooth surface of the first electrode film. The adsorption occurs while taking a stable coordination of an NaCl-type crystalline structure, and the perovskite crystalline structure oxide, which has the same coordination relationship between metal (e.g., lead) atoms and oxygen atoms, continuously grows thereon. It is believed that since the oxygen partial pressure during the deposition process is relatively low and there is a small amount of oxygen in the deposition atmosphere, the phenomenon in which only oxygen atoms are arranged in layers (in which the (111) plane grows) is less likely to occur, whereby the (001) plane, on which metal (lead) atoms and oxygen atoms are alternately arranged in layers, grows more easily. Of course, a piezoelectric film also grows over the noble metal atoms. However, the piezoelectric film is a collection of grains having random crystal planes (including crystal grains oriented along the (001) plane). Moreover, the first electrode layer is normally oriented along the (111) plane when a silicon substrate, or the like, is used. Therefore, a region of the piezoelectric layer above a portion of the surface of the first electrode layer where the metal (e.g., cobalt) atoms do not exist may be oriented in a direction other than along the (001) plane (e.g., along the (111) plane) or may be amorphous. However, it is believed that since a (001)-oriented portion grows more easily in an oxygen-containing deposition atmosphere, as described above, the (001)-oriented portion of the piezoelectric film formed over the metal atoms grows at a higher rate, and the (001)-oriented portion grows while gradually expanding in the lateral direction to form an inverted cone shape, and while suppressing the growth of crystal grains oriented along a face other than the (001) plane along which the crystal growth rate is low (e.g., grains oriented along the (111) plane), whereby the (001)-oriented portion eventually extends across the entire surface of the piezoelectric film. Thus, the cross-sectional area of the (001)-oriented region taken along the plane perpendicular to the thickness direction of the piezoelectric layer gradually increases in the direction away from the first electrode layer toward the other side (i.e., toward the second electrode layer). When the thickness of the piezoelectric layer is about 20 nm, the (001)-oriented region extends substantially across the entire surface. As a result, if the thickness of the piezoelectric layer is set to be 0.5 µm or more, for example, the (001)-oriented region extends across a major portion of the piezoelectric layer, and it is possible to sufficiently obtain a degree of (001) orientation of 90% or more.

The crystal orientation of the piezoelectric layer can be controlled as described above because the piezoelectric material is a substance having a perovskite crystalline structure, and the arrangement and the crystal lattice spacing of the metal (e.g., lead) atoms and the oxygen atoms are substantially identical to those of an oxide of a rock-salt (NaCl) structure, which is a stable substance produced through oxidization of an easily-oxidized metal such as cobalt, nickel, iron, manganese and copper. Thus, the crystal orientation of the piezoelectric layer can be controlled by using a thin film formation process of a type where a material substance deposits onto an underlying layer to form a film, as in a sputtering method.

Thus, the first electrode layer has a function of controlling the crystal orientation of the piezoelectric layer, in addition to the function as an electrode. Therefore, even with a deposition method, other than a sol-gel method, in which a crystalline thin film is directly formed on an inexpensive substrate such as a silicon substrate without the crystallization step using a heat treatment (e.g., a sputtering method or a CVD method), it is possible to obtain a piezoelectric layer with a desirable orientation, whereby it is possible to eliminate the step of heating and crystallizing the deposited piezoelectric layer, which is necessary in a sol-gel method. As a result, it is possible to obtain a piezoelectric element, with which the occurrence of crack and the characteristics deviation can be reduced, and which exhibits a desirable characteristics reproducibility, a reduced characteristics deviation, and a desirable reliability, even if it is mass-produced industrially. As the piezoelectric element is used while applying an electric field in the direction vertical to the surface of the piezoelectric layer thereof, the (001) orientation is advantageous, particularly with a tetragonal perovskite PZT film, because the direction of the electric field is then parallel to the <001> polarization axis direction, thus resulting in an increased piezoelectric effect. Moreover, since the polarization rotation due to the application of an electric field does not occur, it is possible to suppress the deviation in the piezoelectric characteristics of the piezoelectric element and to improve the reliability thereof On the other hand, with a rhombohedral perovskite PZT film, since the polarization axis extends in the <111> direction, the (100) orientation results in an angle of about 54° between the direction of the electric field and the direction of the polarization axis. Nevertheless, by improving the (100) orientation property, the polarization can keep a constant angle with respect to the electric field application. Therefore, also in this case, the polarization rotation due to the electric field application does not occur, whereby it is possible to suppress the deviation in the piezoelectric characteristics of the piezoelectric element and to improve the reliability thereof (for example, in a non-oriented PZT film, the polarization axes are oriented in various directions, and application of an electric field urges the polarization axes to be aligned parallel to the electric field, whereby the piezoelectric characteristics may become voltage dependent and vary significantly, or a sufficient reliability may not be maintained due to aging).

Moreover, a piezoelectric layer having a desirable crystal orientation is easily obtained without using an expensive MgO single-crystal substrate. Therefore, it is possible to reduce the manufacturing cost by using an inexpensive substrate, such as a glass substrate, a metal substrate, a ceramic substrate or an Si substrate.

Furthermore, even if the thickness of the piezoelectric layer is 1 µm or more, it is not necessary to repeat the same step a number of times to obtain a thick film, as with a sol-gel method (with which a thick film cannot be formed by a single iteration of the application step), and the piezoelectric layer can be formed easily by a sputtering method, or the like. Thus, it is possible to suppress a decrease in the production yield.

In the piezoelectric element of the present invention, it is preferred that an orientation control layer made of a cubic or tetragonal perovskite oxide that is preferentially oriented along a (100) or (001) plane is provided between the first electrode layer and the piezoelectric layer.

In this way, by forming the orientation control layer on the first electrode layer by a sputtering method, or the like, the orientation control layer is likely to be oriented along the (100) or (001) plane (the (100) plane and the (001) plane are the same in a cubic system), as is the piezoelectric layer of the piezoelectric element, even if the first electrode layer is oriented along the (111) plane, or the like. By forming a piezoelectric layer having a similar crystalline structure to that of the orientation control layer on the orientation control layer, the piezoelectric layer will be oriented along the (001) plane due to the orientation control layer. With the provision of such an orientation control layer, it is possible to use a piezoelectric material of desirable piezoelectric characteristics for the piezoelectric layer while using a material capable of further improving the crystallinity or the orientation for the orientation control layer. As a result, it is possible to easily obtain a piezoelectric layer with a high crystal orientation and a high stability. Note that in the orientation control layer, a region that is not oriented along the (100) or (001) plane may be present not only in the vicinity of the surface of the first electrode layer but also on the piezoelectric layer side. Even in such a case, if the thickness of the orientation control layer is 0.01 µm or more, a (100)- or (001)-oriented region extends across a major portion of the surface of the orientation control layer that is closer to the piezoelectric layer, with the degree of (001) orientation of the piezoelectric layer being as high as 90% or more.

Moreover, with the provision of such an orientation control layer, it is possible to obtain a piezoelectric layer with a desirable orientation, even with a deposition method, other than a sol-gel method, in which a crystalline thin film is directly formed on an inexpensive substrate such as a silicon substrate without the crystallization step using a heat treatment at a temperature less than 600° C. (e.g., a sputtering method or a CVD method). Thus, it is possible to eliminate the step of heating and crystallizing the deposited piezoelectric layer, which is necessary in a sol-gel method. Moreover, as compared with a case where the orientation control layer is not provided, the film can be formed at a lower temperature, and it is possible to obtain a piezoelectric element with an even more desirable characteristics reproducibility, a further reduced characteristics deviation, and an even higher reliability.

It is preferred that the orientation control layer is made of lead lanthanum titanate or a material obtained by adding at least one of magnesium and manganese to lead lanthanum titanate.

With a sputtering method, for example, a crystalline film of lead lanthanum titanate can more easily be formed stably than that of PZT having particularly desirable piezoelectric characteristics. Therefore, by using such a material for the orientation control layer, it is possible to easily form a (100)- or (001)-oriented film at a relatively low temperature. This is particularly advantageous in a case where PZT is used for the piezoelectric layer. Since the crystalline structure of lead lanthanum titanate is identical to that of PZT, when the piezoelectric layer is formed on the orientation control layer, a PZT film having a similar ion arrangement to that of lead lanthanum titanate grows directly on the surface of lead lanthanum titanate. Thus, the crystal can easily be oriented along the (001) plane even at a low temperature.

Moreover, the orientation control layer may be made of a strontium-containing perovskite oxide. In such a case, it is preferred that the orientation control layer contains strontium titanate.

As can lead lanthanum titanate, a strontium-containing perovskite oxide can be formed at lower temperatures as compared with PZT, and the like, and it is more likely, with a strontium-containing perovskite oxide, that a thin film having a desirable orientation and a desirable crystallinity is obtained. Particularly, when strontium titanate is contained, it is possible to reliably improve the (100) or (001) orientation property and the crystallinity of the orientation control layer, and thus the orientation of the piezoelectric layer.

In the piezoelectric element of the present invention, it is preferred that the noble metal of the first electrode layer is at least one noble metal selected from the group consisting of platinum, iridium, palladium and ruthenium.

In this way, the first electrode layer is made of a material that is capable of withstanding the temperatures at which various films of the piezoelectric element are formed by a sputtering method, or the like, and that is suitable as an electrode material.

Moreover, in the piezoelectric element of the present invention, it is preferred that a content of at least one metal selected from the group consisting of cobalt, nickel, iron, manganese and copper in the first electrode layer is greater than zero and less than or equal to 26 mol %.

The metal content is preferably less than or equal to 26 mol %, because the crystallinity and the orientation of the piezoelectric layer (orientation control layer) deteriorate when the metal content exceeds 26 mol %.

Furthermore, in the piezoelectric element of the present invention, it is preferred that the first electrode layer is provided on a substrate; and an adhesive layer for improving adhesion between the substrate and the first electrode layer is provided between the substrate and the first electrode layer.

In this way, it is possible to improve the adhesion between the substrate and the first electrode layer, thereby preventing peeling off during the manufacture of the piezoelectric element, and also making peeling off less likely to occur while a voltage is applied between the first and second electrode layers.

It is preferred that the adhesive layer is made of at least one material selected from the group consisting of titanium, tantalum and molybdenum.

In this way, it is possible to obtain a material suitable for improving the adhesion between the substrate and the first electrode layer.

A first ink jet head of the present invention includes: a piezoelectric element in which a first electrode layer, a piezoelectric layer and a second electrode layer are layered in this order; a vibration layer provided on one surface of the piezoelectric element that is closer to the second electrode layer; and a pressure chamber member bonded to one surface of the vibration layer that is away from the piezoelectric element and including a pressure chamber for storing ink therein, in which the vibration layer is displaced in a thickness direction by a piezoelectric effect of the piezoelectric layer of the piezoelectric element so as to discharge the ink out of the pressure chamber, wherein: the first electrode layer of the piezoelectric element is made of an alloy of at least one metal selected from the group consisting of cobalt, nickel, iron, manganese and copper and a noble metal; and the piezoelectric layer is made of a rhombohedral or tetragonal perovskite oxide that is preferentially oriented along a (001) plane.

Thus, by forming the first electrode layer, the piezoelectric layer, the second electrode layer and the vibration layer in this order on the substrate by a sputtering method, or the like, and removing the substrate after bonding the pressure chamber member to the vibration layer, it is possible to obtain an ink jet head with a piezoelectric element having a similar structure to that of the piezoelectric element of the present invention. As a result, the ink-discharge performance is improved, and even when many pressure chambers and nozzle holes are provided, and piezoelectric elements are provided so as to correspond to the respective pressure chambers (nozzle holes), it is possible to suppress the deviation among the piezoelectric elements and to stably discharge ink from every nozzle hole. Moreover, since the ink-discharge performance is high, it is possible to provide a large margin with which to adjust the power supply voltage, whereby it is possible to easily make an adjustment so as to suppress the deviation in the ink discharge.

In the first ink jet head of the present invention, it is preferred that an orientation control layer made of a cubic or tetragonal perovskite oxide that is preferentially oriented along a (100) or (001) plane is provided between the first electrode layer and the piezoelectric layer of the piezoelectric element.

Thus, by forming the first electrode layer, the orientation control layer, the piezoelectric layer, the second electrode layer and the vibration layer in this order on the substrate by a sputtering method, or the like, and removing the substrate after bonding the pressure chamber member to the vibration layer, the ink-discharge performance of the ink jet head can be made stable and high, and the deviation in the ink discharge can easily be controlled.

A second ink jet head of the present invention includes: a piezoelectric element in which a first electrode layer, a piezoelectric layer and a second electrode layer are layered in this order; a vibration layer provided on one surface of the piezoelectric element that is closer to the first electrode layer; and a pressure chamber member bonded to one surface of the vibration layer that is away from the piezoelectric element and including a pressure chamber for storing ink therein, in which the vibration layer is displaced in a thickness direction by a piezoelectric effect of the piezoelectric layer of the piezoelectric element so as to discharge the ink out of the pressure chamber, wherein: the first electrode layer of the piezoelectric element is made of an alloy of at least one metal selected from the group consisting of cobalt, nickel, iron, manganese and copper and a noble metal; and the piezoelectric layer is made of a rhombohedral or tetragonal perovskite oxide that is preferentially oriented along a (001) plane.

Thus, by using the pressure chamber member as a substrate, and forming the vibration layer, the first electrode layer, the piezoelectric layer and the second electrode layer in this order on the pressure chamber member by a sputtering method, or the like, it is possible to obtain an ink jet head with similar functions and effects to those of the first ink jet head of the present invention.

In the second ink jet head of the present invention, it is preferred that an orientation control layer made of a cubic or tetragonal perovskite oxide that is preferentially oriented along a (100) or (001) plane is provided between the first electrode layer and the piezoelectric layer of the piezoelectric element.

Thus, by using the pressure chamber member as a substrate, and forming the vibration layer, the first electrode layer, the orientation control layer, the piezoelectric layer and the second electrode layer in this order on the pressure chamber member by a sputtering method, or the like, it is possible to obtain an ink jet head with similar functions and effects to those of the first ink jet head of the present invention and with an orientation control layer provided in the piezoelectric element.

An angular velocity sensor of the present invention includes a substrate including a fixed portion and at least a pair of vibrating portions extending from the fixed portion in a predetermined direction, in which a first electrode layer, a piezoelectric layer and a second electrode layer are layered in this order at least on each of the vibrating portions of the substrate, and the second electrode layer on each of the vibrating portions is patterned into at least one driving electrode for vibrating the vibrating portion in a width direction thereof and at least one detection electrode for detecting a displacement of the vibrating portion in a thickness direction thereof, wherein: the first electrode layer is made of an alloy of at least one metal selected from the group consisting of cobalt, nickel, iron, manganese and copper and a noble metal; and the piezoelectric layer is made of a rhombohedral or tetragonal perovskite oxide that is preferentially oriented along a (001) plane.

Each vibrating portion of the substrate is vibrated in the width direction thereof by applying a voltage between the driving electrode of the second electrode layer and the first electrode layer. When the vibrating portion deforms in the thickness direction due to the Coriolis force while it is being vibrated, a voltage is generated between the detection electrode of the second electrode layer and the first electrode layer, whereby the angular velocity can be calculated based on the magnitude of the voltage (the Coriolis force). The portion for detecting the angular velocity (the vibrating portion) is a piezoelectric element similar to the piezoelectric element of the present invention. Therefore, the piezoelectric constant can be increased to be about 40 times as large as that of a conventional angular velocity sensor using quartz, and thus the size thereof can be reduced significantly. Moreover, even if the angular velocity sensors are mass-produced industrially, it is possible to obtain angular velocity sensors with a high characteristics reproducibility and a small characteristics deviation, and with a high breakdown voltage and a high reliability.

In the angular velocity sensor of the present invention, it is preferred that an orientation control layer made of a cubic or tetragonal perovskite oxide that is preferentially oriented along a (100) or (001) plane is provided between the first electrode layer and the piezoelectric layer.

A method for manufacturing the piezoelectric element of the present invention includes the steps of: forming a first electrode layer made of an alloy of at least one metal selected from the group consisting of cobalt, nickel, iron, manganese and copper and a noble metal on a substrate by a sputtering method; forming a piezoelectric layer made of a rhombohedral or tetragonal perovskite oxide that is preferentially oriented along a (001) plane on the first electrode layer by a sputtering method; and forming a second electrode layer on the piezoelectric layer.

In this way, it is possible to easily manufacture the piezoelectric element of the present invention.

Alternatively, a method for manufacturing the piezoelectric element of the present invention includes the steps of: forming a first electrode layer made of an alloy of at least one metal selected from the group consisting of cobalt, nickel, iron, manganese and copper and a noble metal on a substrate by a sputtering method; forming an orientation control layer made of a cubic or tetragonal perovskite oxide that is preferentially oriented along a (100) or (001) plane on the first electrode layer by a sputtering method; forming a piezoelectric layer made of a rhombohedral or tetragonal perovskite oxide that is preferentially oriented along a (001) plane on the orientation control layer by a sputtering method; and forming a second electrode layer on the piezoelectric layer.

In this way, it is possible to easily manufacture a piezoelectric element in which an orientation control layer is provided between the first electrode layer and the piezoelectric layer.

A method for manufacturing the first ink jet head of the present invention includes the steps of: forming the first electrode layer made of an alloy of at least one metal selected from the group consisting of cobalt, nickel, iron, manganese and copper and a noble metal on a substrate by a sputtering method; forming the piezoelectric layer made of a rhombohedral or tetragonal perovskite oxide that is preferentially oriented along a (001) plane on the first electrode layer by a sputtering method; forming the second electrode layer on the piezoelectric layer; forming the vibration layer on the second electrode layer; bonding a pressure chamber member for forming the pressure chamber on one surface of the vibration layer that is away from the second electrode layer; and removing the substrate after the bonding step.

In this way, it is possible to easily manufacture the first ink jet head of the present invention.

Alternatively, a method for manufacturing the first ink jet head of the present invention includes the steps of: forming the first electrode layer made of an alloy of at least one metal selected from the group consisting of cobalt, nickel, iron, manganese and copper and a noble metal on a substrate by a sputtering method; forming the orientation control layer made of a cubic or tetragonal perovskite oxide that is preferentially oriented along a (100) or (001) plane on the first electrode layer by a sputtering method; forming the piezoelectric layer made of a rhombohedral or tetragonal perovskite oxide that is preferentially oriented along a (001) plane on the orientation control layer by a sputtering method; forming the second electrode layer on the piezoelectric layer; forming the vibration layer on the second electrode layer; bonding a pressure chamber member for forming the pressure chamber on one surface of the vibration layer that is away from the second electrode layer; and removing the substrate after the bonding step.

In this way, it is possible to easily manufacture the first ink jet head of the present invention, in which the orientation control layer is provided in the piezoelectric element.

A method for manufacturing the second ink jet head of the present invention includes the steps of: forming the vibration layer on a pressure chamber substrate for forming the pressure chamber; forming the first electrode layer made of an alloy of at least one metal selected from the group consisting of cobalt, nickel, iron, manganese and copper and a noble metal on the vibration layer by a sputtering method; forming the piezoelectric layer made of a rhombohedral or tetragonal perovskite oxide that is preferentially oriented along a (001) plane on the first electrode layer by a sputtering method; forming the second electrode layer on the piezoelectric layer; and forming the pressure chamber in the pressure chamber substrate.

In this way, it is possible to easily manufacture the second ink jet head of the present invention.

Alternatively, a method for manufacturing the second ink jet head of the present invention includes the steps of: forming the vibration layer on a pressure chamber substrate for forming the pressure chamber; forming the first electrode layer made of an alloy of at least one metal selected from the group consisting of cobalt, nickel, iron, manganese and copper and a noble metal on the vibration layer by a sputtering method; forming the orientation control layer made of a cubic or tetragonal perovskite oxide that is preferentially oriented along a (100) or (001) plane on the first electrode layer by a sputtering method; forming the piezoelectric layer made of a rhombohedral or tetragonal perovskite oxide that is preferentially oriented along a (001) plane on the orientation control layer by a sputtering method; forming the second electrode layer on the piezoelectric layer; and forming the pressure chamber in the pressure chamber substrate.

In this way, it is possible to easily manufacture the second ink jet head of the present invention, in which the orientation control layer is provided in the piezoelectric element.

A method for manufacturing the angular velocity sensor of the present invention includes the steps of forming the first electrode layer made of an alloy of at least one metal selected from the group consisting of cobalt, nickel, iron, manganese and copper and a noble metal on the substrate by a sputtering method; forming the piezoelectric layer made of a rhombohedral or tetragonal perovskite oxide that is preferentially oriented along a (001) plane on the first electrode layer by a sputtering method; forming the second electrode layer on the piezoelectric layer; patterning the second electrode layer so as to form the driving electrode and the detection electrode; patterning the piezoelectric layer and the first electrode layer; and patterning the substrate so as to form the fixed portion and the vibrating portions.

In this way, it is possible to easily manufacture the angular velocity sensor of the present invention.

Alternatively, a method for manufacturing the angular velocity sensor of the present invention includes the steps of: forming the first electrode layer made of an alloy of at least one metal selected from the group consisting of cobalt, nickel, iron, manganese and copper and a noble metal on the substrate by a sputtering method; forming the orientation control layer made of a cubic or tetragonal perovskite oxide that is preferentially oriented along a (100) or (001) plane on the first electrode layer by a sputtering method; forming the piezoelectric layer made of a rhombohedral or tetragonal perovskite oxide that is preferentially oriented along a (001) plane on the orientation control layer by a sputtering method; forming the second electrode layer on the piezoelectric layer; patterning the second electrode layer so as to form the driving electrode and the detection electrode; patterning the piezoelectric layer, the orientation control layer and the first electrode layer; and patterning the substrate so as to form the fixed portion and the vibrating portions.

In this way, it is possible to easily manufacture the angular velocity sensor of the present invention, in which the orientation control layer is provided in the portion for detecting the angular velocity.

A first ink jet recording apparatus of the present invention includes an ink jet head, the ink jet head including: a piezoelectric element in which a first electrode layer, a piezoelectric layer and a second electrode layer are layered in this order; a vibration layer provided on one surface of the piezoelectric element that is closer to the second electrode layer; and a pressure chamber member bonded to one surface of the vibration layer that is away from the piezoelectric element and including a pressure chamber for storing ink therein, the ink jet head being capable of being relatively moved with respect to a recording medium, in which while the ink jet head is moved with respect to the recording medium, the vibration layer is displaced in a thickness direction by a piezoelectric effect of the piezoelectric layer of the piezoelectric element in the ink jet head so as to discharge the ink out of the pressure chamber through a nozzle hole communicated to the pressure chamber onto the recording medium, thereby recording information, wherein: the first electrode layer of the piezoelectric element in the ink jet head is made of an alloy of at least one metal selected from the group consisting of cobalt, nickel, iron, manganese and copper and a noble metal; and the piezoelectric layer is made of a rhombohedral or tetragonal perovskite oxide that is preferentially oriented along a (001) plane.

A second ink jet recording apparatus of the present invention includes an ink jet head, the ink jet head including: a piezoelectric element in which a first electrode layer, a piezoelectric layer and a second electrode layer are layered in this order; a vibration layer provided on one surface of the piezoelectric element that is closer to the first electrode layer; and a pressure chamber member bonded to one surface of the vibration layer that is away from the piezoelectric element and including a pressure chamber for storing ink therein, the ink jet head being capable of being relatively moved with respect to a recording medium, in which while the ink jet head is moved with respect to the recording medium, the vibration layer is displaced in a thickness direction by a piezoelectric effect of the piezoelectric layer of the piezoelectric element in the ink jet head so as to discharge the ink out of the pressure chamber through a nozzle hole communicated to the pressure chamber onto the recording medium, thereby recording information, wherein: the first electrode layer of the piezoelectric element in the ink jet head is made of an alloy of at least one metal selected from the group consisting of cobalt, nickel, iron, manganese and copper and a noble metal; and the piezoelectric layer is made of a rhombohedral or tetragonal perovskite oxide that is preferentially oriented along a (001) plane.

The first and second ink jet recording apparatuses of the present invention both use an ink jet head with which it is possible to easily control the deviation in the ink discharge, whereby it is possible to suppress the deviation in the recording operation onto the recording medium, thus improving the reliability of the recording apparatus.

In the first and second ink jet recording apparatuses of the present invention, it is preferred that an orientation control layer made of a cubic or tetragonal perovskite oxide that is preferentially oriented along a (100) or (001) plane is provided between the first electrode layer and the piezoelectric layer of the piezoelectric element in the ink jet head.

Thus, it is possible to stably and easily obtain an ink jet recording apparatus with a high reliability.

BRIEF DESCRIPTION OF THE DRAWINGS

FIG. 3 is a characteristics diagram illustrating the amount of displacement of a tip of the piezoelectric element of FIG. 1 in response to a triangular voltage applied between a first electrode layer and a second electrode layer of the piezoelectric element.

FIG. 13A to FIG. 13I illustrate steps in a method for manufacturing the ink jet head of FIG. 10.

DESCRIPTION OF THE PREFERRED EMBODIMENTS

Embodiments of the present invention will now be described with reference to the drawings.

Embodiment 1

Figure 1:
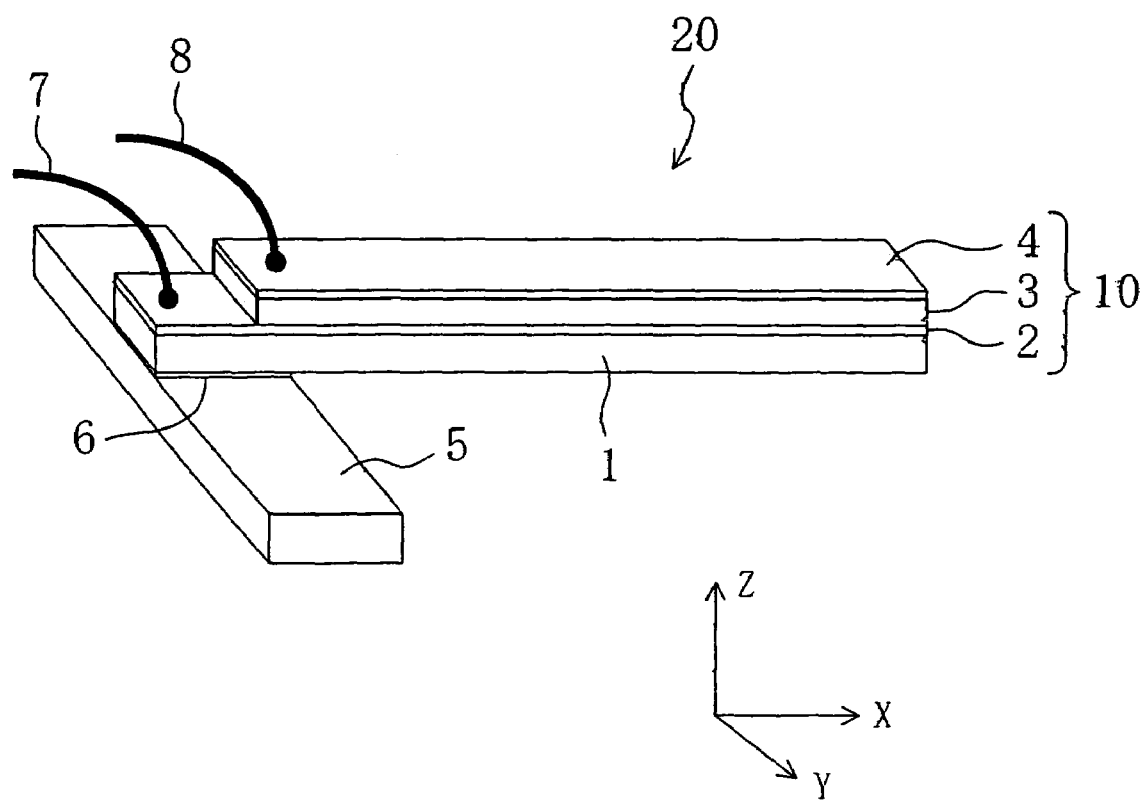
FIG. 1 is a perspective view illustrating a piezoelectric element according to an embodiment of the present invention.

FIG. 1 is a perspective view illustrating a piezoelectric element 20 according to an embodiment of the present invention. As illustrated in FIG. 1, the piezoelectric element 20 of the present embodiment includes a silicon substrate 1 of a flat strip shape having a length of 15.0 mm, a thickness of 0.30 mm and a width of 3.0 mm, and a layered structure 10 provided on the silicon substrate 1. A 3.0-mm end portion of the piezoelectric element 20 is fixed, via an epoxy adhesive 6, to a stainless steel support substrate 5 having a width of 3.0 mm, a length of 10.0 mm and a thickness of 1.0 mm and extending in the direction perpendicular to the piezoelectric element 20 (the Y axis direction in the coordinate system of FIG. 1), thus forming a cantilever. Note that the substrate 1 is not limited to a silicon substrate, but may alternatively be a glass substrate, a metal substrate, a ceramic substrate, or the like.

The layered structure 10 includes a first electrode layer 2 provided on the silicon substrate 1, a piezoelectric layer 3 provided on the first electrode layer 2 and a second electrode layer 4 provided on the piezoelectric layer 3, and is obtained by depositing the first electrode layer 2, the piezoelectric layer 3 and the second electrode layer 4 in this order on the substrate 1 by a sputtering method. Note that the deposition method for the various films is not limited to a sputtering method, but may alternatively be any other suitable deposition method as long as a crystalline thin film is directly formed without the crystallization step using a heat treatment (e.g., a CVD method), and the deposition method for the second electrode layer 4 may be a sol-gel method, or the like. Moreover, an adhesive layer for improving the adhesion between the silicon substrate 1 and the first electrode layer 2 may be formed between the silicon substrate 1 and the first electrode layer 2 (see a variation of Embodiment 2 to be described later). The adhesive layer may be formed of at least one material selected from the group consisting of titanium, tantalum and molybdenum.

The first electrode layer 2 is made of an iridium (Ir) thin film having a thickness of 0.10 μm and containing 6 mol % of cobalt (Co). Thus, the first electrode layer 2 is made of an alloy of cobalt and iridium as a noble metal, and forms an electrode/crystal orientation control layer that has a function of controlling the crystal orientation of the piezoelectric layer 3 as will be described later, in addition to the function as an electrode. Note that the first electrode layer 2 may be made of an alloy of at least one metal selected from the group consisting of cobalt, nickel, iron, manganese and copper and a noble metal, and the noble metal may be at least one noble metal selected from the group consisting of platinum, iridium, palladium and ruthenium. Furthermore, the first electrode layer 2 may contain a very slight amount of oxygen in its composition, in addition to the alloy of at least one metal selected from the group consisting of cobalt, nickel, iron, manganese and copper and a noble metal. The content of at least one metal selected from the group consisting of cobalt, nickel, iron, manganese and copper is preferably greater than zero and less than or equal to 26 mol % so that the crystal orientation can be controlled desirably. Furthermore, the thickness of the first electrode layer 2 may be in the range of 0.05 to 2 μm.

The piezoelectric layer 3 is formed across the entire upper surface of the first electrode layer 2 excluding the 3.0-mm (base) end portion thereof that is bonded to the stainless steel support substrate 5 (i.e., a portion of the upper surface of the first electrode layer 2 having a width of 3.0 mm and a length of 12.0 mm), and is made of a rhombohedral or tetragonal perovskite oxide that is preferentially oriented along a (001) plane (since the (100) plane and the (001) plane are the same in a rhombohedral system, the rhombohedral (100) orientation is included herein). In the present embodiment, the piezoelectric layer 3 is made of a PZT thin film having a thickness of 2.50 μm, and the composition of PZT is Zr/Ti=53/47 (thus making it rhombohedral). Note that the Zr/Ti composition is not limited to 53/47, but may be any other suitable composition as long as it is in the range of 30/70 to 70/30. Moreover, the material of the piezoelectric layer 3 is not limited to any particular material, as long as it is a piezoelectric material whose main component is PZT, e.g., those obtained by adding an additive such as Sr, Nb, Al or Mg to PZT. In addition, La-containing PZT (i.e., PLZT) may be used. Furthermore, the thickness of the piezoelectric layer 3 is not limited to any particular thickness as long as it is in the range of 0.5 to 5.0 μm.

The second electrode layer 4 is made of a platinum (Pt) thin film having a thickness of 0.25 μm, and lead wires 7 and 8 are connected to the first electrode layer 2 and the second electrode layer 4, respectively. Note that the material of the second electrode layer 4 is not limited to Pt, but may alternatively be any suitable conductive material, and the thickness thereof is not limited to any particular thickness as long as it is in the range of 0.1 to 0.4 μm.

When a voltage is applied between the first electrode layer 2 and the second electrode layer 4 of the piezoelectric element 20 via the lead wires 7 and 8, the piezoelectric layer 3 expands in the X axis direction in the coordinate system of FIG. 1 (the longitudinal direction of the piezoelectric layer 3). The amount of expansion ΔL(m) of the piezoelectric layer 3 can be expressed as follows:

$$\Delta L = d_{31} * L * E / t$$

where E(V) is the applied voltage, t(m) is the thickness of the piezoelectric layer 3, L(m) is the length of the piezoelectric layer 3, and $d_{31}$ (pm/V) is the piezoelectric constant of the piezoelectric layer 3.

An upper portion of the piezoelectric layer 3 that is attached to the second electrode layer 4 having a small thickness expands in the X axis direction, whereas the expansion of a lower portion thereof that is attached to the silicon substrate 1 via the first electrode layer 2 is restricted by the thick silicon substrate 1. As a result, the tip end side of the piezoelectric element 20, which is opposite to the base end (the end at which the lead wires 7 and 8 are connected) fixed to the stainless steel support substrate 5 is displaced in the negative direction along the Z axis in the coordinate system of FIG. 1 (the downward direction in FIG. 1). Thus, the tip of the piezoelectric element 20 can be vertically reciprocated within a predetermined displacement range by repeating application and removal of a voltage at a constant frequency. The displacement characteristics of the piezoelectric element 20 can be evaluated by measuring the relationship between the applied voltage and the displacement range of the tip of the piezoelectric element 20.

Next, a method for manufacturing the piezoelectric element 20 will be described with reference to FIG. 2A to FIG. 2E.

Figure 2A:
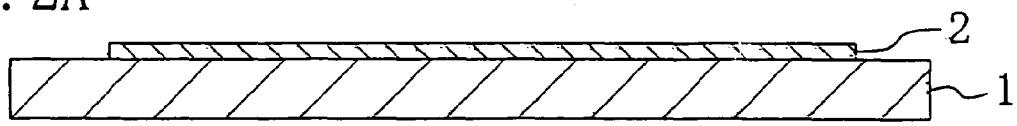
FIG. 2A to FIG. 2E illustrate steps in a method for manufacturing the piezoelectric element of FIG. 1.

First, as illustrated in FIG. 2A, the first electrode layer 2 made of an iridium film containing 6 mol % of cobalt is formed, by an RF sputtering method, to a thickness of 0.10 µm on the silicon substrate 1 having a size of 20 mm×20 mm and a thickness of 0.30 mm whose (001) plane has been polished, while using a stainless steel mask (not shown) having a thickness of 0.2 mm and including therein rectangular openings having a width of 5.0 mm and a length of 18.0 mm.

Specifically, using a three-target RF magnetron sputtering apparatus, the cobalt-containing iridium film is formed through a sputtering process by applying high-frequency powers of 100 W and 200 W to the first (cobalt) and second (iridium) targets, respectively, of the three-target sputtering apparatus (the third target is not used) for 15 minutes while keeping the temperature of the silicon substrate 1 at 400° C. in a mixed gas of argon and oxygen (gas volume ratio: $Ar:O_2=15:1$) as a sputtering gas at a total gas pressure of 0.25 Pa.

Then, the piezoelectric layer 3 made of a PZT film having a thickness of 2.50 µm is formed, by an RF magnetron sputtering method, precisely in a predetermined position on the surface of the first electrode layer 2 by using a stainless steel mask (thickness: 0.2 mm) including therein rectangular openings having a width of 5.0 mm and a length of 12.0 mm. The method for forming the piezoelectric layer 3 made of a PZT film will be described later in greater detail.

Figure 2B:
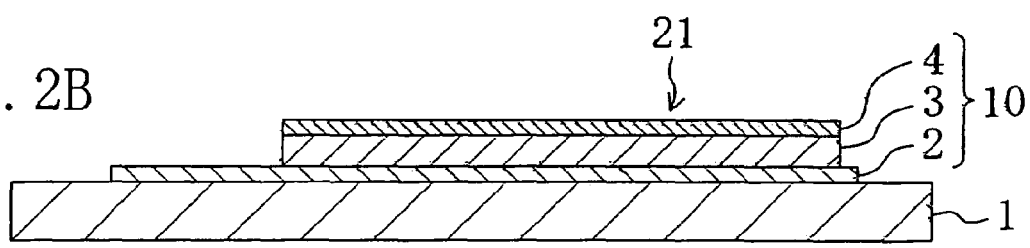

Then, the second electrode layer 4 made of platinum and having a thickness of 0.25 µm is formed, by an RF sputtering method, on the surface of the piezoelectric layer 3 by using a stainless steel mask of the same shape as that of the mask used in the formation of the piezoelectric layer 3, thereby obtaining a structure 21 in which the layered structure 10 including the piezoelectric layer 3 is provided on the silicon substrate 1, as illustrated in FIG. 2B.

Figure 2C:
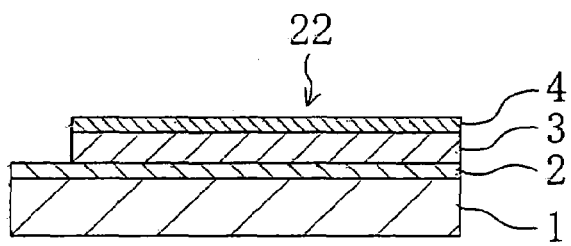

Then, as illustrated in FIG. 2C, the structure 21 is cut by a dicing saw into a strip-shaped piece having a width of 3.0 mm and a length of 15.0 mm so that a portion of the first electrode layer 2 is exposed in a square portion having a size of 3.0 mm×3.0 mm at one end of the strip-shaped piece. This strip-shaped piece is a piezoelectric element precursor 22 in which the second electrode layer 4 is exposed over a portion of the first electrode layer 2 having a width of 3.0 mm and a length of 12.0 mm.

Figure 2D:
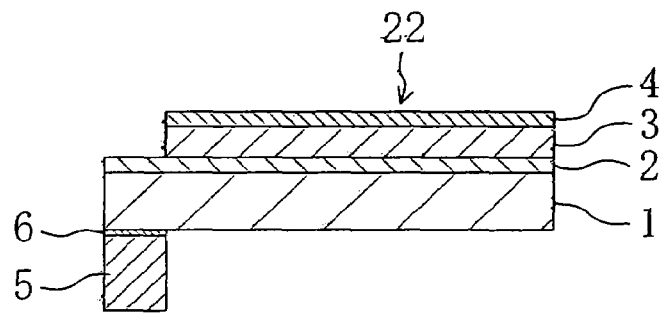

Then, as illustrated in FIG. 2D, one end of the silicon substrate 1 of the piezoelectric element precursor 22 is bonded to the stainless steel support substrate 5 by using the epoxy adhesive 6.

Figure 2E:
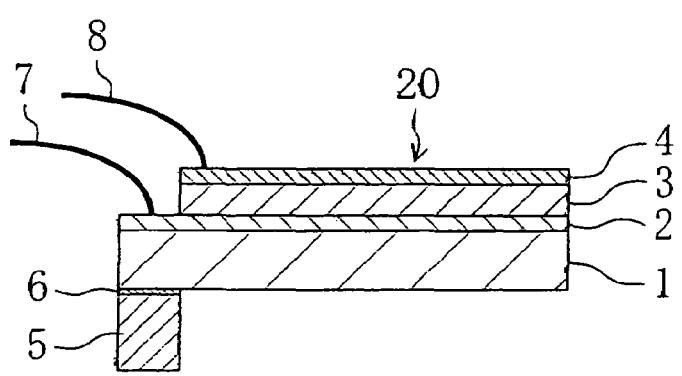

Next, as illustrated in FIG. 2E, the lead wire 7 having a diameter of 0.1 mm and made of gold is connected to an exposed portion of the first electrode layer 2 of the piezoelectric element precursor 22 by using a conductive adhesive (silver paste), and the lead wire 8, similar to the lead wire 7, is connected to one end of the second electrode layer 4 that is closer to the exposed portion of the first electrode layer 2 by wire bonding, thereby obtaining the piezoelectric element 20.

Now, the method for forming the piezoelectric layer 3 will be described in greater detail. Using an RF magnetron sputtering apparatus, the piezoelectric layer 3 is formed through a sputtering process by applying a high-frequency power of 600 W to a sinter target, which is prepared by adding a 5 mol % excess of lead oxide (PbO) to lead lanthanum zirconate titanate ($PbZr_{0.53}Ti_{0.47}O_3$), for 125 minutes in a deposition chamber while keeping the temperature of the silicon substrate 1, on which the first electrode layer 2 made of a cobalt-containing iridium film has been formed, at 600° C. In the deposition process, a mixed gas of argon and oxygen (gas volume ratio: $Ar:O_2=19:1$) is used as the sputtering gas, and the total gas pressure is kept at 0.3 Pa.

The piezoelectric layer 3 is grown by using, as a nucleus, cobalt existing in a dotted pattern on one surface of the first electrode layer 2 that is closer to the piezoelectric layer 3, whereby it is likely to be oriented along the (001) plane over cobalt. Specifically, cobalt (or nickel, iron, manganese, copper) is likely to adsorb oxygen in the sputtering gas during the formation of the piezoelectric layer 3, and the adsorption occurs while taking a stable coordination of an NaCl-type crystalline structure. As a result, PZT, which has the same coordination relationship between metal (lead) atoms and oxygen atoms, continuously grows thereon. The oxygen partial pressure during the deposition process is relatively low and there is a small amount of oxygen in the deposition atmosphere. Therefore, the phenomenon in which only oxygen atoms are arranged in layers (in which the (111) plane grows) is less likely to occur, whereby the (001) plane, on which metal (lead) atoms and oxygen atoms are alternately arranged in layers, grows more easily. On the other hand, since the silicon substrate 1 is used, the first electrode layer 2 is oriented along the (111) plane, and a region of the piezoelectric layer 3 above a portion of the surface of the first electrode layer 2 where cobalt does not exist may be oriented in a direction other than along the (001) plane (e.g., along the (111) plane) or may be amorphous (amorphous in the case of an iridium film). However, since a (001)-oriented portion grows more easily in an oxygen-containing deposition atmosphere as described above, the (001)-oriented portion of the PLT film over cobalt grows at a higher rate than the growth of crystal grains oriented in a direction other than along the (001) plane in a region of the piezoelectric layer 3 above a portion of the surface of the first electrode layer 2 where cobalt does not exist. Therefore, the (001)-oriented portion grows while gradually expanding in the lateral direction to form an inverted cone shape, and while suppressing the growth of crystal grains oriented in a direction other than along the (001) plane. As a result, when the thickness of the piezoelectric layer 3 is about 20 nm, the (001)-oriented region extends substantially across the entire surface. As a result, if the thickness of the piezoelectric layer 3 is set to be 0.5 µm or more, the (001)-oriented region extends across a major portion of the surface of piezoelectric layer 3, with the degree of (001) orientation (the degree of rhombohedral (100) orientation) being as high as 90% or more.

Now, specific examples of the present invention will be described.

First, as a piezoelectric element of Example 1, the same piezoelectric element as that of the embodiment described above was produced by the same manufacturing method. Note that during the production process, the films of the first electrode layer and the piezoelectric layer were subjected to a composition analysis with an X-ray microanalyzer, and the crystalline orientation degree of the piezoelectric layer was examined through an analysis by an X-ray diffraction method.

A composition analysis of the first electrode layer (an iridium film) showed that the film was made of iridium containing 6 mol % of cobalt. Moreover, a composition analysis of the piezoelectric layer (a PZT film) showed that the cation composition ratio of the PZT film was Pb:Zr:Ti=1.00:0.53:0.47 and thus the PZT film had a chemical composition that can be expressed as $Pb(Zr_{0.53}Ti_{0.47})O_3$.

Furthermore, an analysis by an X-ray diffraction method showed that the piezoelectric layer was a thin film having a perovskite crystalline structure and preferentially oriented along the (001) plane with the degree of (001) orientation being 99% (i.e., a thin film whose <001> axis extends perpendicular to the surface thereof). Herein, the crystalline orientation degree of a PZT film is the proportion (in percent) of the peak intensity of the (001) plane with respect to the sum of peak intensities from the (001), (100), (010), (110), (011), (101) and (111) planes as read from the X-ray diffraction pattern of the PZT film.

Next, a triangular voltage of 0 V to −10 V was applied via lead wires between the first electrode layer and the second electrode layer of the piezoelectric element of Example 1 so as to measure the amount of displacement of the tip of the piezoelectric element vertically reciprocating in the Z axis direction in the coordinate system of FIG. 1.

FIG. 3 illustrates the amount of displacement of the tip of the piezoelectric element in response to a voltage applied at a frequency of 100 Hz. As illustrated in FIG. 3, when a voltage of 0 V to −10 V was applied, the maximum amount of displacement of the tip of the piezoelectric element was 3.8 μm.

Three silicon substrates were prepared with the first electrode layer being formed thereon under the same conditions for the piezoelectric element of Example 1, and the same PZT films as that of the piezoelectric element of Example 1 were formed by using the three substrates. The three substrates were subjected to the sputtering process for 2, 5 and 20 minutes, respectively. The thicknesses of the obtained PZT films were 0.02 μm, 0.09 μm and 0.40 μm, respectively. The degree of (001) orientation of each of the PZT films was examined by an X-ray diffraction method.

As a result, the degrees of (001) orientation of the PZT films having the thicknesses of 0.02 μm, 0.09 μm and 0.40 μm were 85%, 95% and 98%, respectively. This shows that the crystal orientation of the PZT film is such that the (001) orientation becomes more dominant as the film growth proceeds, starting from the surface of the first electrode.

Next, piezoelectric elements of Example 2 to Example 39 whose first electrode layers have different compositions and thicknesses were produced by changing the materials of the targets of the three-target RF magnetron sputtering apparatus and controlling the sputtering power and the sputtering time. Table 1 below shows the target material, the sputtering power and the sputtering time used for forming the first electrode layer for each of the piezoelectric elements.

TABLE 1

| | | Sputtering conditions for forming first electrode layer | | | |
|---|---|---|---|---|---|
| | | Target composition and sputtering power of 3-target sputtering apparatus | | | |
| | | First target composition (Sputtering power) | Second target composition (Sputtering power) | Third target composition (Sputtering power) | Deposition time (min) |
| Examples | 1 | Co(100 W) | Ir(200 W) | — | 15 |
| | 2 | Co(60 W) | Ir(200 W) | — | 35 |
| | 3 | Co(120 W) | Ir(200 W) | — | 14 |
| | 4 | Co(120 W) | Pt(180 W) | — | 20 |
| | 5 | Co(120 W) | Pd(180 W) | — | 15 |
| | 6 | Co(140 W) | Ru(200 W) | — | 25 |
| | 7 | Co(150 W) | Ir(200 W) | — | 25 |
| | 8 | Co(155 W) | Ir(200 W) | — | 12 |
| | 9 | Co(165 W) | Ir(200 W) | — | 11 |
| | 10 | Co(180 W) | Ir(200 W) | — | 10 |
| | 11 | Ni(65 W) | Ir(200 W) | — | 35 |
| | 12 | Ni(95 W) | Ir(200 W) | — | 15 |
| | 13 | Ni(115 W) | Pt(180 W) | — | 14 |
| | 14 | Ni(130 W) | Pd(180 W) | — | 20 |
| | 15 | Ni(145 W) | Ir(200 W) | — | 26 |
| | 16 | Ni(165 W) | Pt(180 W) | — | 24 |
| | 17 | Ni(175 W) | Ir(200 W) | — | 11 |
| | 18 | Fe(60 W) | Pt(180 W) | — | 35 |
| | 19 | Fe(120 W) | Pd(180 W) | — | 14 |
| | 20 | Fe(135 W) | Ir(200 W) | — | 12 |
| | 21 | Fe(165 W) | Ir(200 W) | — | 17 |
| | 22 | Mn(60 W) | Ir(200 W) | — | 35 |
| | 23 | Mn(105 W) | Pt(180 W) | — | 29 |
| | 24 | Mn(135 W) | Ir(200 W) | — | 14 |
| | 25 | Mn(155 W) | Ir(200 W) | — | 12 |
| | 26 | Mn(165 W) | Ir(200 W) | — | 22 |
| | 27 | Cu(45 W) | Pt(180 W) | — | 32 |
| | 28 | Cu(65 W) | Pt(180 W) | — | 15 |
| | 29 | Cu(120 W) | Ir(200 W) | — | 20 |
| | 30 | Cu(135 W) | Pt(180 W) | — | 10 |
| | 31 | Cu(150 W) | Ir(200 W) | — | 28 |
| | 32 | Co(120 W) | Ir(200 W) | Pt(200 W) | 4 |
| | 33 | Co(145 W) | Ir(200 W) | Ru(160 W) | 17 |
| | 34 | Ni(120 W) | Pt(180 W) | Pd(100 W) | 40 |
| | 35 | Cu(90 W) | Ir(90 W) | Pd(180 W) | 19 |
| | 36 | Cu(125 W) | Ir(100 W) | Pt(180 W) | 20 |
| | 37 | Co(100 W) | Pt(180 W) | Pd(90 W) | 19 |
| | 38 | Co(90 W) | Ir(200 W) | Ru(80 W) | 28 |
| | 39 | Fe(90 W) | Pt(180 W) | Ru(80 W) | 30 |

As in Example 1, for each of the piezoelectric elements of Example 2 to Example 39, the thickness and the composition of the first electrode layer and the degree of (001) orientation of the piezoelectric layer were examined, and the amount of displacement (maximum amount of displacement) of the tip of the piezoelectric element in response to an applied triangular voltage was measured. The results are shown in Table 2 below.

TABLE 2

|  |  | First electrode layer | | Degree of (001) orientation of PZT film | Evaluation of piezoelectric elements | |
|---|---|---|---|---|---|---|
|  |  | Composition (analytical value) | Thickness (μm) |  | Displacement (μm) | Overall quality |
| Examples | 1 | Co(6%)—Ir(94%) | 0.10 | 99 | 3.8 | Good |
|  | 2 | Co(1%)—Ir(99%) | 0.22 | 99 | 3.5 | Good |
|  | 3 | Co(14%)—Ir(86%) | 0.10 | 98 | 3.8 | Good |
|  | 4 | Co(14%)—Pt(84%) | 0.15 | 97 | 3.6 | Good |
|  | 5 | Co(16%)—Pd(84%) | 0.10 | 99 | 3.8 | Good |
|  | 6 | Co(20%)—Ru(80%) | 0.20 | 99 | 3.5 | Good |
|  | 7 | Co(24%)—Ir(76%) | 0.20 | 99 | 3.5 | Good |
|  | 8 | Co(26%)—Ir(74%) | 0.10 | 97 | 3.7 | Good |
|  | 9 | Co(30%)—Ir(70%) | 0.10 | 65 | 2.7 | Fair |
|  | 10 | Co(40%)—Ir(60%) | 0.10 | 60 | 2.6 | Fair |
|  | 11 | Ni(1%)—Ir(99%) | 0.22 | 99 | 3.6 | Good |
|  | 12 | Ni(5%)—Ir(95%) | 0.10 | 99 | 3.8 | Good |
|  | 13 | Ni(10%)—Pt(90%) | 0.10 | 99 | 3.9 | Good |
|  | 14 | Ni(15%)—Pd(85%) | 0.15 | 99 | 3.9 | Good |
|  | 15 | Ni(20%)—Ir(80%) | 0.20 | 99 | 3.5 | Good |
|  | 16 | Ni(25%)—Pt(75%) | 0.20 | 99 | 3.8 | Good |
|  | 17 | Ni(30%)—Ir(70%) | 0.10 | 65 | 2.7 | Fair |
|  | 18 | Fe(1%)—Pt(99%) | 0.22 | 99 | 3.9 | Good |
|  | 19 | Fe(15%)—Pd(85%) | 0.10 | 99 | 3.9 | Good |
|  | 20 | Fe(25%)—Ir(75%) | 0.10 | 99 | 3.8 | Good |
|  | 21 | Fe(30%)—Ir(70%) | 0.15 | 69 | 2.8 | Fair |
|  | 22 | Mn(1%)—Ir(99%) | 0.20 | 99 | 3.5 | Good |
|  | 23 | Mn(8%)—Pt(92%) | 0.20 | 99 | 3.8 | Good |
|  | 24 | Mn(20%)—Ir(80%) | 0.10 | 98 | 3.7 | Good |
|  | 25 | Mn(25%)—Ir(75%) | 0.10 | 98 | 3.8 | Good |
|  | 26 | Mn(30%)—Ir(70%) | 0.20 | 68 | 2.6 | Good |
|  | 27 | Cu(1%)—Pt(99%) | 0.20 | 99 | 3.6 | Good |
|  | 28 | Cu(4%)—Pt(96%) | 0.10 | 99 | 3.8 | Good |
|  | 29 | Cu(15%)—Ir(85%) | 0.15 | 99 | 3.6 | Good |
|  | 30 | Cu(25%)—Pt(75%) | 0.08 | 99 | 3.8 | Good |
|  | 31 | Cu(31%)—Ir(69%) | 0.25 | 66 | 2.4 | Fair |
|  | 32 | Co(6%)—Ir(40%)—Pt(56%) | 0.06 | 99 | 3.8 | Good |
|  | 33 | Co(8%)—Ir(72%)—Ru(20%) | 0.15 | 97 | 3.4 | Good |
|  | 34 | Ni(10%)—Pt(88%)—Pd(10%) | 0.30 | 98 | 3.5 | Good |
|  | 35 | Cu(8%)—Ir(10%)—Pd(82%) | 0.15 | 99 | 3.7 | Good |
|  | 36 | Cu(15%)—Ir(20%)—Pt(65%) | 0.20 | 98 | 3.4 | Good |
|  | 37 | Co(5%)—Pt(80%)—Pd(15%) | 0.15 | 99 | 3.6 | Good |
|  | 38 | Co(4%)—Ir(91%)—Ru(5%) | 0.20 | 98 | 3.4 | Good |
|  | 39 | Fe(4%)—Pt(90%)—Ru(6%) | 0.20 | 99 | 3.4 | Good |
| Comp. Examples | 1 | — | — | 23 | 2.4 | Poor |
|  | 2 | Ir(100%) | 0.10 | 22 | 2.3 | Poor |

It can be seen that the degree of (001) orientation of the piezoelectric layer of each example of the present invention is substantially higher than those of comparative examples to be described later. Particularly, when the content of at least one metal selected from the group consisting of cobalt, nickel, iron, manganese and copper in the first electrode layer is 26 mol % or less, a degree of (001) orientation of 90% or more can reliably be obtained, and the maximum amount of displacement of the tip of the piezoelectric element can be large.

Note that while a PZT film of the same composition was used as the piezoelectric layer for all the piezoelectric elements of Example 1 to Example 39, similar results were obtained with PZT films of different Ti/Zr molar ratios. Moreover, the piezoelectric layer may be an La-containing PZT film (PLZT film) or a PZT film containing ion of Nb, Mg, or the like, and a (001)-oriented film was obtained as in the piezoelectric elements of Example 1 to Example 39 as long as the film was an oxide film having a perovskite crystalline structure.

Next, piezoelectric elements of Comparative Example 1 and Comparative Example 2 were produced as follows.

The piezoelectric element of Comparative Example 1 was produced through a production process partly according to Japanese Laid-Open Patent Publication No. 2001-88294, forming a piezoelectric thin film by a sputtering method. First, by using a sputtering apparatus, a similar silicon substrate to that used in Example 1 was put into an electric furnace at 1100° C., and subjected to an oxidization process for 22 hours while supplying dry oxygen, thereby forming a silicon oxide film having a thickness of about 1 μm on the surface. A thin film of zirconium oxide having a thickness of 0.4 μm was formed on the surface of the substrate by a reactive sputtering method with a zirconium target while introducing oxygen (sputtering power: 200 W, degree of vacuum 0.3 Pa), a first electrode layer made of an iridium thin film having a thickness of 1.0 μm was formed on the surface of the zirconium oxide film by using an RF magnetron sputtering apparatus with an iridium target, and a titanium thin film having a thickness of 0.06 μm was formed on the surface of the first electrode layer by using a DC magnetron sputtering apparatus with a titanium target and using the same stainless steel mask as that used in the embodiment described above. Furthermore, a PZT film having the same composition as that of Example 1 was formed on the surface of the titanium film by a similar method to that of Example 1, and a second electrode layer similar to that of Example 1 made of a platinum thin film having a thickness of 0.25 μm was formed, after which the obtained structure was machined as in Example 1, thereby producing a piezoelectric element having the same shape as that of Example 1 (FIG. 1).

Figure 4:
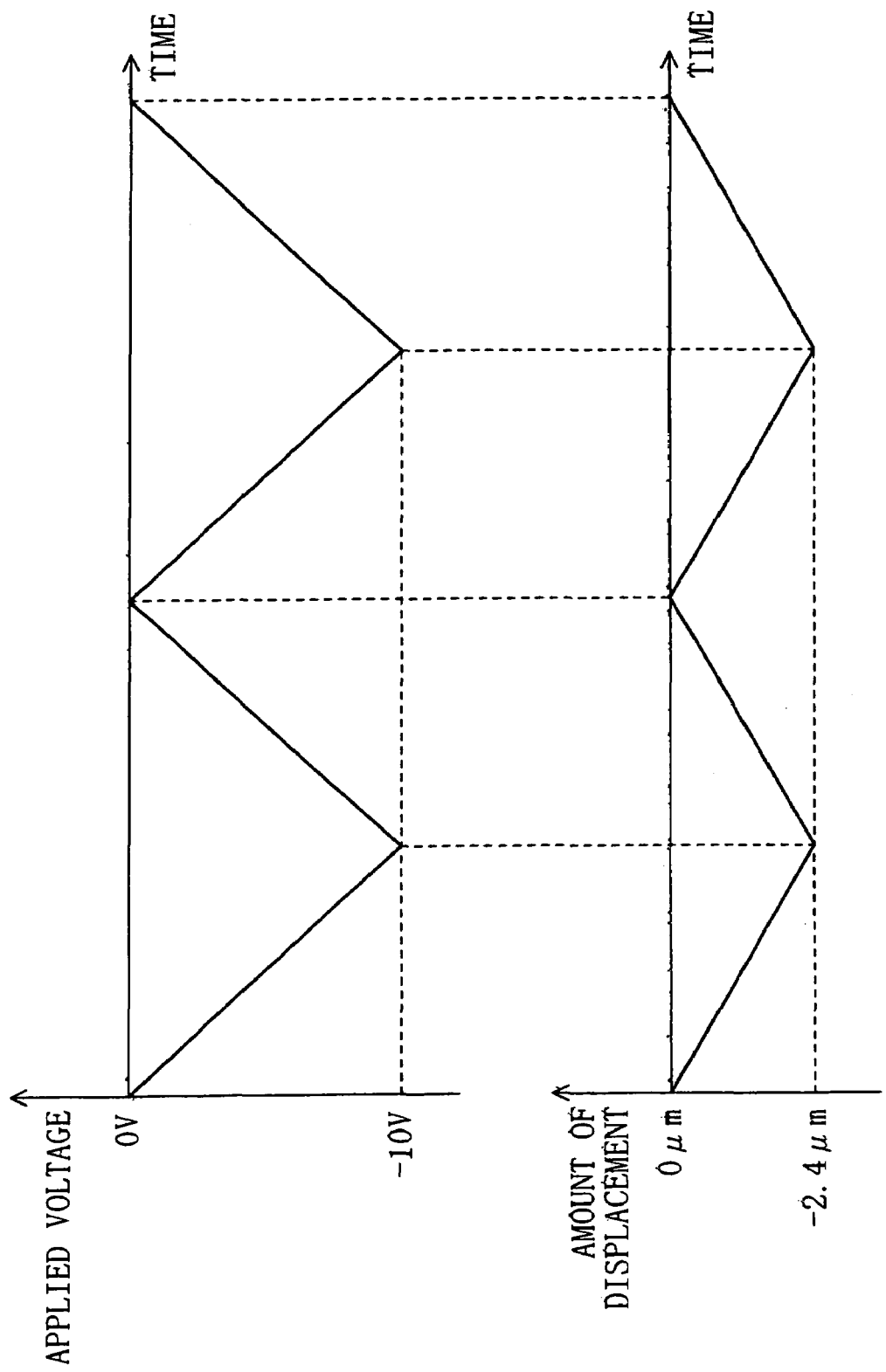
FIG. 4 is a diagram similar to FIG. 3 for a piezoelectric element of Comparative Example 1.

The degree of (001) orientation of the PZT film of the piezoelectric layer in the piezoelectric element of Comparative Example 1 was examined to be 23%. Moreover, the amount of displacement of the tip of the piezoelectric element of Comparative Example 1 in response to an applied triangular voltage was measured as illustrated in FIG. 4, indicating that the maximum amount of displacement was 2.4 μm (note that the crystalline orientation degree and the maximum amount of displacement are shown in Table 2 along with those of the examples of the present invention and Comparative Example 2 to be described below).

It can be seen that with the structure of the piezoelectric element of Comparative Example 1, it is difficult to control the crystal orientation of the piezoelectric thin film and a PZT film with a high degree of (001) orientation cannot be obtained when using a sputtering method for producing the piezoelectric layer, as described in Japanese Laid-Open Patent Publication No. 2001-88294.

Next, the piezoelectric element of Comparative Example 2 was produced. The piezoelectric element of Comparative Example 2 differs from those of the examples of the present invention in that the iridium film of the first electrode layer does not contain a metal such as cobalt. Specifically, the first electrode layer is formed by a sputtering process for 16 minutes while setting the sputtering power to the first, cobalt target to 0 W and setting the sputtering power to the second, iridium target to 200 W. Thus, the piezoelectric element was produced under the same conditions as those of Example 1 except that the first electrode layer was an iridium film having a thickness of 0.10 μm, which is believed not to function as a crystal orientation control layer.

The piezoelectric layer of the piezoelectric element of Comparative Example 2 was analyzed by an X-ray diffraction method, showing an X-ray diffraction pattern with high-intensity diffraction peaks for the (111) and (110) planes other than the (001) plane, indicating that it was not a (001)-oriented thin film as in Example 1, and the degree of (001) orientation was 22%. It is believed that the first electrode layer, not containing a metal such as cobalt, did not function as a crystal orientation control layer, whereby the degree of (001) orientation of the PZT film thereon was low.

Moreover, the amount of displacement of the tip of the piezoelectric element of Comparative Example 2 in response to an applied triangular voltage was measured, indicating that the maximum amount of displacement was 2.3 μm.

Next, a piezoelectric element of Example 40 having the same shape as that of Example 1 was produced by the same method as that of Example 1 by using a substrate of a flat strip shape having a length of 15.0 mm and a width of 3.0 mm and made of a heat-resisting crystallized glass (thickness: 0.30 mm, thermal expansion coefficient: $87 \times 10^{-7}/°C$.) that does not deform even at 700° C. as a substrate, instead of using a silicon substrate (having a flat strip shape having a length of 15.0 mm, a thickness of 0.30 mm and a width of 3.0 mm).

Moreover, using the same substrate as that of Example 40, a piezoelectric element of Example 41 was produced as in Example 7, a piezoelectric element of Example 42 was produced as in Example 13, a piezoelectric element of Example 43 was produced as in Example 19, a piezoelectric element of Example 44 was produced as in Example 32, and a piezoelectric element of Comparative Example 3 was produced as in Comparative Example 2 where the first electrode layer was made only of iridium.

For each of the piezoelectric elements of Example 40 to Example 44 and Comparative Example 3 produced by using a glass substrate as described above, the thickness and the composition of the first electrode layer and the degree of (001) orientation of the piezoelectric layer were examined, and the amount of displacement (maximum amount of displacement) of the tip of the piezoelectric element in response to an applied triangular voltage was measured. The results are shown in Table 3 below.

TABLE 3

|  |  | First electrode layer | | Degree of (001) orientation of PZT film | Evaluation of piezoelectric elements | |
|---|---|---|---|---|---|---|
|  |  | Composition (analytical value) | Thickness (μm) |  | Displacement (μm) | Overall quality |
| Examples | 40 | Co(6%)—Ir(94%) | 0.10 | 99 | 4.3 | Good |
|  | 41 | Co(24%)—Ir(76%) | 0.20 | 99 | 4.2 | Good |
|  | 42 | Ni(10%)—Pt(90%) | 0.10 | 99 | 4.3 | Good |
|  | 43 | Fe(15%)—Pd(85%) | 0.10 | 99 | 4.2 | Good |
|  | 44 | Co(6%)—Ir(40%)—Pt(56%) | 0.06 | 99 | 4.2 | Good |
| Comp. Examples | 3 | Ir(100%) | 0.10 | 23 | 2.6 | Poor |

It can be seen that even when the substrate is made of a glass different from silicon, the piezoelectric element of the present invention has a piezoelectric layer having a high degree of (001) orientation and a high degree of piezoelectric displacement. Moreover, it was found that although the amount of displacement in response to an applied voltage varies depending on the substrate material, it is possible to realize stable displacement characteristics.

Embodiment 2

Figure 5:
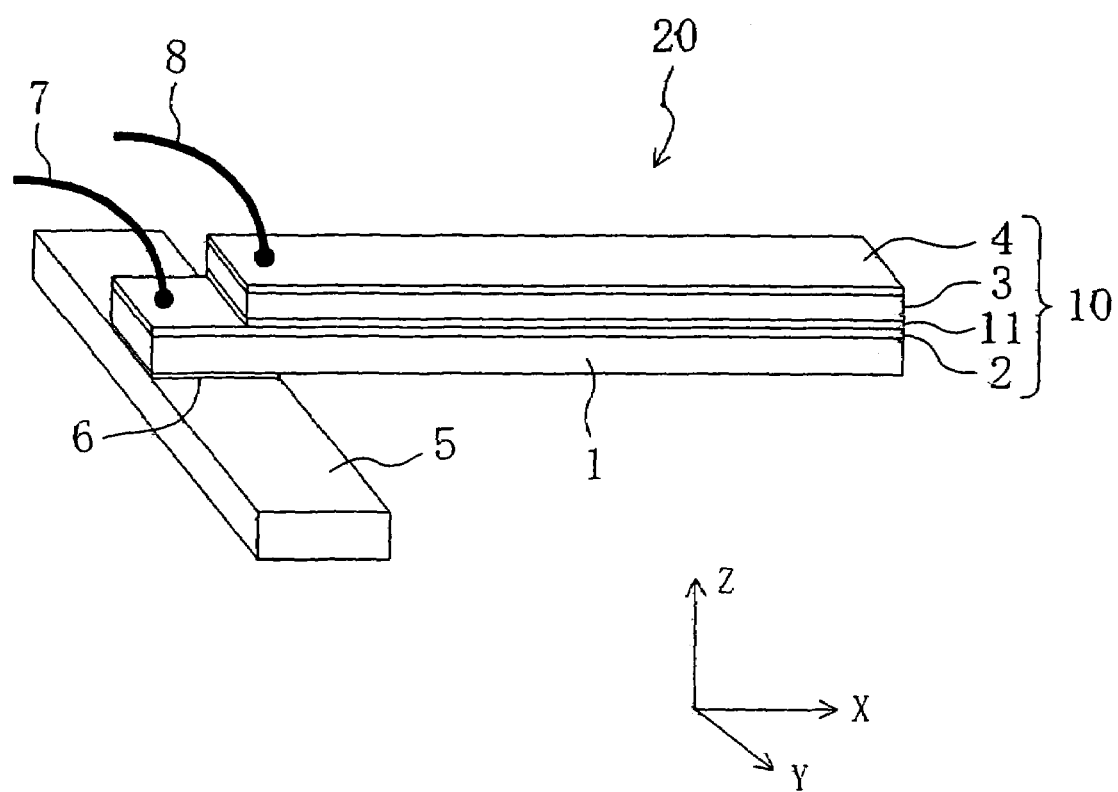
FIG. 5 is a perspective view illustrating another piezoelectric element according to an embodiment of the present invention.

FIG. 5 illustrates another piezoelectric element according to an embodiment of the present invention (note that the same components as those of FIG. 1 will be denoted by the same reference numerals and will not be further described below). The piezoelectric element of the present embodiment is similar to the piezoelectric element of Embodiment 1 except that it further includes an orientation control layer 11 between the first electrode layer 2 and the piezoelectric layer 3.

Specifically, as in Embodiment 1, the piezoelectric element 20 of the present embodiment includes the silicon substrate 1 and the layered structure 10 provided on the silicon substrate 1, and a 3.0-mm end portion of the piezoelectric element 20 is fixed, via the epoxy adhesive 6, to the stainless steel support substrate 5, thus forming a cantilever. Note that also in the present embodiment, the substrate 1 is not limited to a silicon substrate, but may alternatively be a glass substrate, a metal substrate, a ceramic substrate, or the like.

The layered structure 10 includes the first electrode layer 2 provided on the silicon substrate 1, the orientation control layer 11 provided on the first electrode layer 2, the piezoelectric layer 3 provided on the orientation control layer 11 and the second electrode layer 4 provided on the piezoelectric layer 3, and is obtained by depositing the first electrode layer 2, the orientation control layer 11, the piezoelectric layer 3 and the second electrode layer 4 in this order on the substrate 1 by a sputtering method. Note that also in the present embodiment, the deposition method for the various films is not limited to a sputtering method, but may alternatively be any other suitable deposition method as long as a crystalline thin film is directly formed without the crystallization step using a heat treatment (e.g., a CVD method), and the deposition method for the second electrode layer 4 may be a sol-gel method, or the like.

As in Embodiment 1, the first electrode layer 2 is made of an alloy of cobalt and iridium, and forms an electrode/crystal orientation control layer that has a function of controlling the crystal orientation of the orientation control layer 11 and, in turn, that of the piezoelectric layer 3 as will be described later, in addition to the function as an electrode. Note however that in the present embodiment, the cobalt content is 1 mol %, and the thickness is 0.22 µm. Note that also in the present embodiment, the first electrode layer 2 may be made of an alloy of at least one metal selected from the group consisting of cobalt, nickel, iron, manganese and copper and a noble metal, and the noble metal may be at least one noble metal selected from the group consisting of platinum, iridium, palladium and ruthenium. Furthermore, the first electrode layer 2 may contain a very slight amount of oxygen in its composition, in addition to the alloy of at least one metal selected from the group consisting of cobalt, nickel, iron, manganese and copper and a noble metal. The content of at least one metal selected from the group consisting of cobalt, nickel, iron, manganese and copper is preferably greater than zero and less than or equal to 26 mol % so that the crystal orientation can be controlled desirably. Furthermore, the thickness of the first electrode layer 2 may be in the range of 0.05 to 2 µm.

The orientation control layer 11 is made of a cubic or tetragonal perovskite oxide that is preferentially oriented along a (100) or (001) plane. In the present embodiment, the orientation control layer 11 is made of lead lanthanum titanate (composition ratio: Pb:La:Ti=1.12:0.08:1.00), and the thickness thereof is 0.02 µm. The crystal orientation of the orientation control layer 11 is controlled by the first electrode layer 2, thereby controlling the crystal orientation of the piezoelectric layer 3. Note that the material of the orientation control layer 11 is not limited to lead lanthanum titanate, but may alternatively be a material obtained by adding at least one of magnesium and manganese to lead lanthanum titanate, and may be a strontium-containing perovskite oxide, which can be formed at a relatively low temperature as compared with PZT, or the like, as can lead lanthanum titanate. In such a case, it is particularly preferred that strontium titanate ($SrTiO_3$) is contained. Strontium titanate may be contained solely, or lead titanate, lead lanthanum titanate, barium titanate, etc., may be contained in addition to strontium titanate. Moreover, the thickness of the orientation control layer 11 is not limited to any particular thickness as long as it is in the range of 0.01 to 0.2 µm.

As in Embodiment 1, the piezoelectric layer 3 is a PZT thin film (Zr/Ti=53/47) having a thickness of 2.50 µm and made of a rhombohedral or tetragonal perovskite oxide that is preferentially oriented along a (001) plane. Note that also in the present embodiment, the Zr/Ti composition is not limited to 53/47, but may be any other suitable composition as long as it is in the range of 30/70 to 70/30. Moreover, the material of the piezoelectric layer 3 is not limited to any particular material, as long as it is a piezoelectric material whose main component is PZT, e.g., those obtained by adding an additive such as Sr, Nb, Al or Mg to PZT. In addition, La-containing PZT (i.e., PLZT) may be used. Furthermore, the thickness of the piezoelectric layer 3 is not limited to any particular thickness as long as it is in the range of 0.5 to 5.0 µm.

As in Embodiment 1, the second electrode layer 4 is made of a platinum thin film having a thickness of 0.25 µm, but the material may alternatively be any suitable conductive material, and the thickness thereof is not limited to any particular thickness as long as it is in the range of 0.1 to 0.4 µm.

As in Embodiment 1, the displacement characteristics of the piezoelectric element 20 can be evaluated by applying a voltage between the first and second electrode layers 2 and 4 via the lead wires 7 and 8 connected to the first and second electrode layers 2 and 4, respectively, and measuring the relationship between the applied voltage and the displacement range of the tip of the piezoelectric element 20.

Next, a method for manufacturing the piezoelectric element 20 will be described with reference to FIG. 6A to FIG. 6E.

Figure 6A:
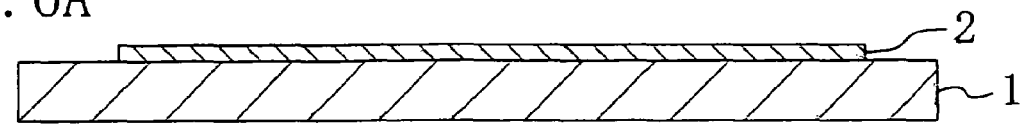
FIG. 6A to FIG. 6E illustrate steps in a method for manufacturing the piezoelectric element of FIG. 5.

First, as in Embodiment 1, the first electrode layer 2 made of an iridium film containing 1 mol % of cobalt is formed, by an RF sputtering method (see the row "Example 45" in Table 4 below for specific conditions), on the silicon substrate 1 having a size of 20 mm×20 mm whose (001) plane has been polished, while using a stainless steel mask including therein rectangular openings having a width of 5.0 mm and a length of 18.0 mm (see FIG. 6A).

Then, the orientation control layer 11 made of a lead lanthanum titanate having a thickness of 0.02 µm is formed, by an RF magnetron sputtering method, precisely in a predetermined position on the surface of the first electrode layer 2 by using a stainless steel mask including therein rectangular openings having a width of 5.0 mm and a length of 12.0 mm, after which the piezoelectric layer 3 made of a PZT film having a thickness of 2.50 µm is formed, by an RF magnetron sputtering method, precisely in a predetermined position on the surface of the orientation control layer 11. The method for forming the orientation control layer 11 and the piezoelectric layer 3 will be described later in greater detail.

Figure 6B:
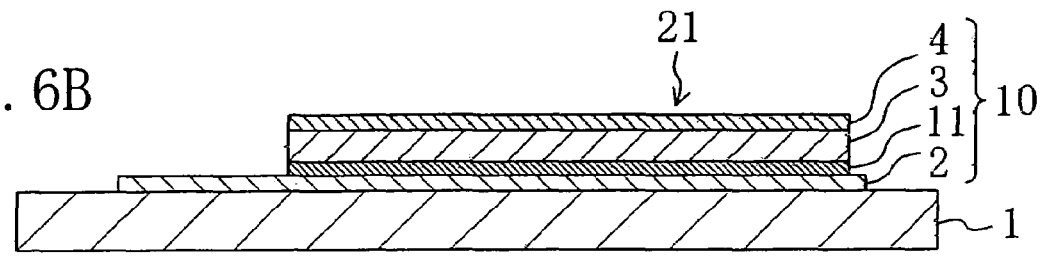

Next, as in Embodiment 1, the second electrode layer 4 is formed by an RF sputtering method on the surface of the piezoelectric layer 3, thereby obtaining the structure 21 in which the layered structure 10 is provided on the silicon substrate 1 (see FIG. 6B).

Figure 6C:
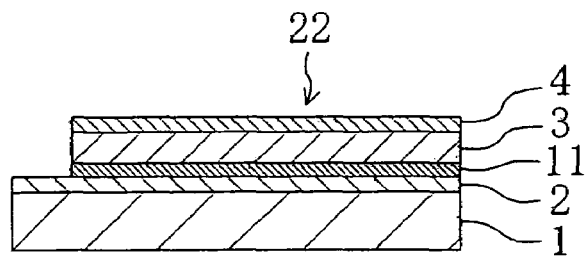
Figure 6D:
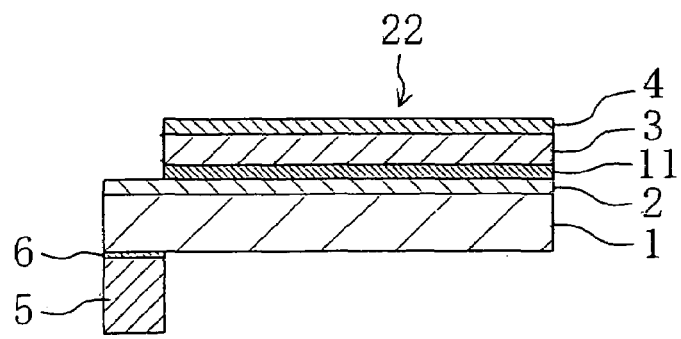

Then, the structure 21 is cut by a dicing saw as in Embodiment 1, thereby obtaining the piezoelectric element precursor 22 (see FIG. 6C).

Figure 6E:
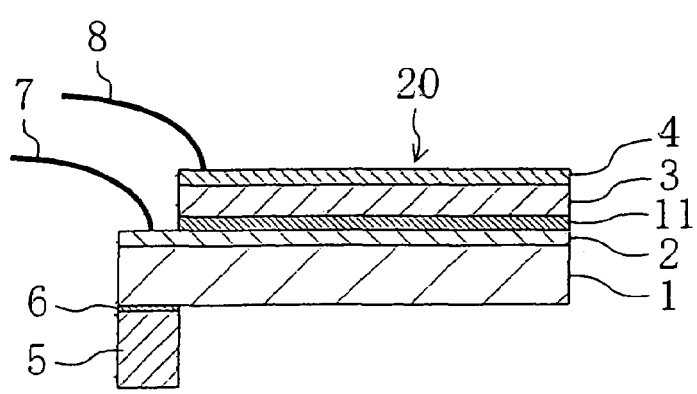

Then, as in Embodiment 1, one end of the silicon substrate 1 of the piezoelectric element precursor 22 is bonded to the stainless steel support substrate 5 by using the epoxy adhesive 6 (see FIG. 6D), after which the lead wire 7 is connected to an exposed portion of the first electrode layer 2 of the piezoelectric element precursor 22, and the lead wire 8 is connected to the second electrode layer 4, thereby obtaining the piezoelectric element 20 (see FIG. 6E).

Now, the method for forming the orientation control layer 11 and the piezoelectric layer 3 will be described in greater detail. An RF magnetron sputtering apparatus is used, which includes two deposition chambers of the same structure such that the substrate on which thin films are to be formed can be moved from one chamber to another without breaking the vacuum. A sinter target (composition molar ration: Pb:La:Ti=1.12:0.08:1.00) prepared by adding an about 20 mol % excess of PbO to stoichiometric lead lanthanum titanate (molar ratio: Pb:La:Ti=0.92:0.08:1.00) is attached to one deposition chamber, and a sinter target prepared by adding a 5 mol % excess of lead oxide (PbO) to lead lanthanum zirconate titanate ($PbZr_{0.53}Ti_{0.47}O_3$) is attached to the other deposition chamber. Using this apparatus, the films of the orientation control layer 11 and the piezoelectric layer 3 are formed by sputtering on the silicon substrate 1, on which the first electrode layer 2 has been formed.

First, in the deposition chamber to which the lead lanthanum titanate target is attached, the silicon substrate 1, on which the first electrode layer 2 has been formed, is kept at a temperature of 550° C., and a thin film made of lead lanthanum titanate containing an excessive amount of lead and having a perovskite crystalline structure in which the <001> axis is oriented perpendicular to the surface thereof is formed to a thickness of 0.02 μm on the surface of the first electrode layer 2. The sputtering process is performed by applying a high-frequency power of 300 W for 10 minutes while using a mixed gas of argon and oxygen (gas volume ratio: $Ar:O_2=19:1$) as a sputtering gas and keeping the total gas pressure at 0.3 Pa.

Next, the silicon substrate 1, on which the orientation control layer 11 has been formed, is transferred into the other deposition chamber to which the lead lanthanum zirconate titanate target is attached without breaking the vacuum. Then, the piezoelectric layer 3 having a thickness of 2.50 μm and whose composition can be represented as $Pb_{1.00}(Zr_{0.53}Ti_{0.47})O_3$ is formed on the orientation control layer 11 while keeping the temperature of the substrate 1 at 500° C. The sputtering process is performed by applying a high-frequency power of 700 W for 50 minutes while using a mixed gas of argon and oxygen (gas volume ratio: $Ar:O_2=19:1$) as a sputtering gas and keeping the total gas pressure at 0.3 Pa.

As with the piezoelectric layer 3 of Embodiment 1, the orientation control layer 11 is grown by using, as a nucleus, cobalt existing in a dotted pattern on one surface of the first electrode layer 2 that is closer to the orientation control layer 11, whereby it is likely to be oriented along the (100) or (001) plane over cobalt. Furthermore, by using lead lanthanum titanate for the orientation control layer 11, it is possible to easily and stably form a (100)- or (001)-oriented film at a relatively low temperature. The crystalline structure of lead lanthanum titanate is identical to that of PZT. Therefore, when the piezoelectric layer 3 made of PZT is formed on the orientation control layer 11, a PZT film having a similar ion arrangement to that of lead lanthanum titanate grows directly on the surface of lead lanthanum titanate. Thus, the piezoelectric layer 3 is controlled by the orientation control layer 11 to be oriented along the (001) plane (since the (100) plane and the (001) plane are the same in a rhombohedral system, the rhombohedral (100) orientation is included herein), with the degree of (001) orientation (the degree of rhombohedral (100) orientation) being as high as 90% or more.

Note that in the orientation control layer 11, a region that is not oriented along the (100) or (001) plane may be present not only in the vicinity of the surface of the first electrode layer 2 but also on the side closer to the piezoelectric layer 3. Even in such a case, if the thickness of the orientation control layer 11 is 0.01 μm or more, a (100)- or (001)-oriented region extends across a major portion of the surface of the orientation control layer 11 that is closer to the piezoelectric layer 3, with the degree of (001) orientation of the piezoelectric layer 3 being as high as 90% or more.

Figure 7:
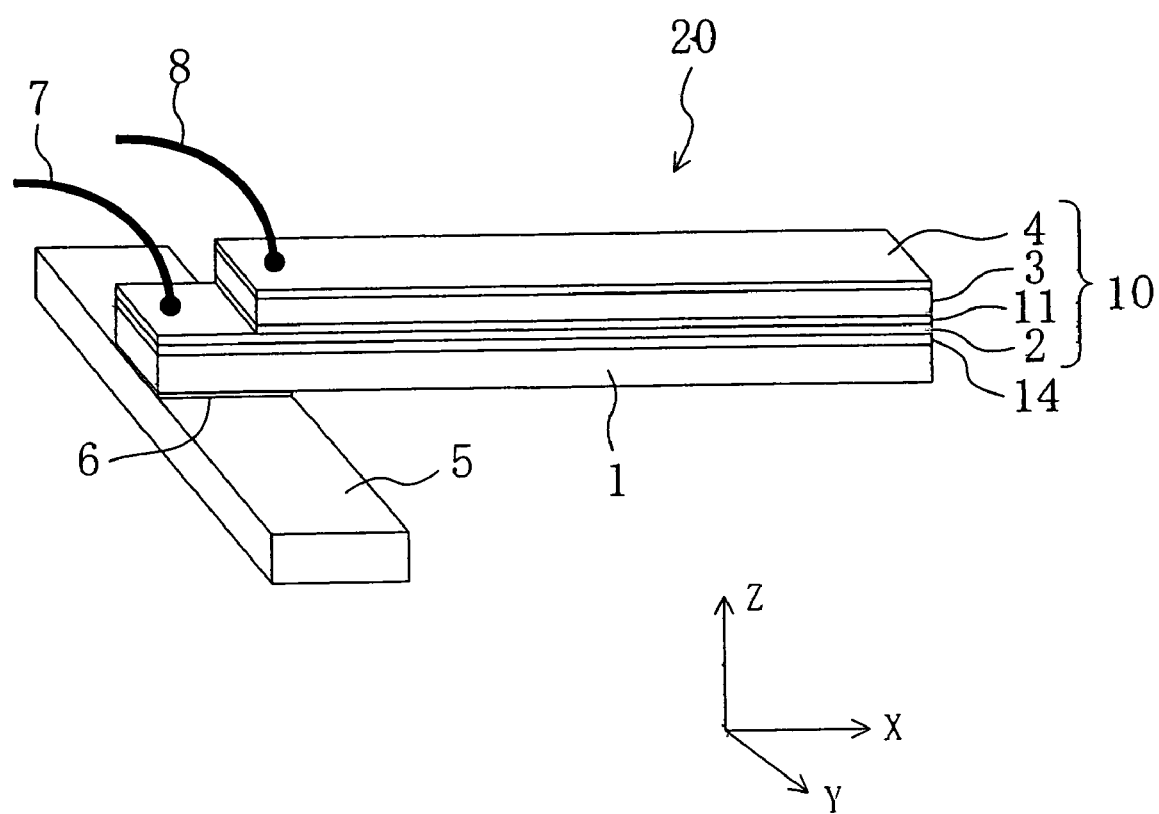
FIG. 7 is a perspective view illustrating a variation of the piezoelectric element of FIG. 5.

FIG. 7 illustrates a variation of the piezoelectric element 20 of Embodiment 2 (note that the same components as those of FIG. 5 will be denoted by the same reference numerals and will not be further described below). The piezoelectric element of the present variation further includes an adhesive layer 14 between the silicon substrate 1 and the first electrode layer 2.

Thus, the piezoelectric element 20 of the present variation is similar in structure to that of Embodiment 2 except for the provision of the adhesive layer 14. Note however that the material and, the thickness of the first electrode layer 2 are different from those of Embodiment 2. In the present variation, the first electrode layer 2 is made of a platinum film having a thickness of 0.15 μm and containing 14 mol % of cobalt.

The adhesive layer 14 is provided for improving the adhesion between the silicon substrate 1 and the first electrode layer 2. The adhesive layer 14 is made of titanium and has a thickness of 0.006 μm. Note that the material of the adhesive layer 14 is not limited to any particular material as long as it is at least one material selected from the group consisting of titanium, tantalum and molybdenum, and the thickness of the adhesive layer 14 is not limited to any particular thickness as long as it is in the range of 0.005 to 1 μm.

A method for manufacturing the piezoelectric element will be described with reference to FIG. 8A to FIG. 8E.

The adhesive layer 14 made of a titanium film having a thickness of 0.006 μm is formed, by an RF sputtering method, on the silicon substrate 1 having a size of 20 mm×20 mm whose (001) plane has been polished, while using a stainless steel mask including therein rectangular openings having a width of 5.0 mm and a length of 18.0 mm. The titanium film is formed through a sputtering process by applying a high-frequency power of 100 W for 2 minutes while keeping the temperature of the substrate 1 at 400° C. in an argon gas as a sputtering gas whose gas pressure is kept at 1 Pa. Then, the first electrode layer 2 made of a platinum film containing 14 mol % of cobalt is formed as in Embodiment 2 to a thickness of 0.15 μm on the adhesive layer 14 while using the same stainless steel mask (see FIG. 8A).

Figure 8A:
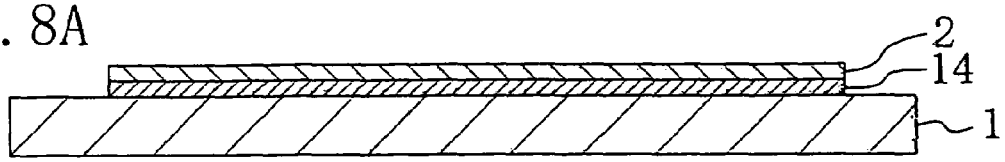
FIG. 8A to FIG. 8E illustrate steps in a method for manufacturing the piezoelectric element of FIG. 7.
Figure 8B:
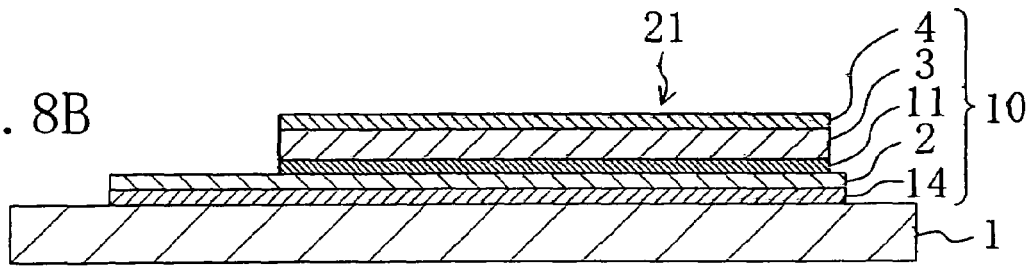
Figure 8C:
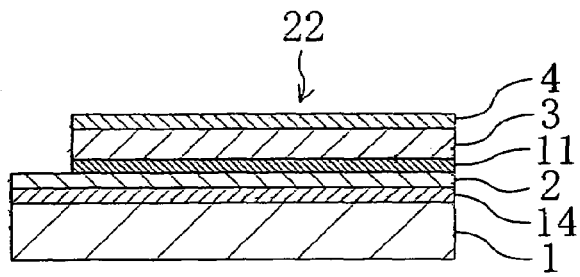

Then, as in Embodiment 2, the orientation control layer 11 is formed on the first electrode layer 2, the piezoelectric layer 3 is formed on the orientation control layer 11, and the second electrode layer 4 is formed on the piezoelectric layer 3, thereby obtaining the structure 21 in which the layered structure 10 is provided on the silicon substrate 1 (see FIG. 8B).

Figure 8D:
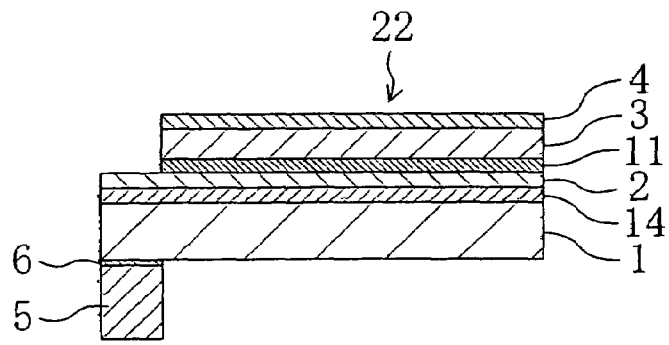
Figure 8E:
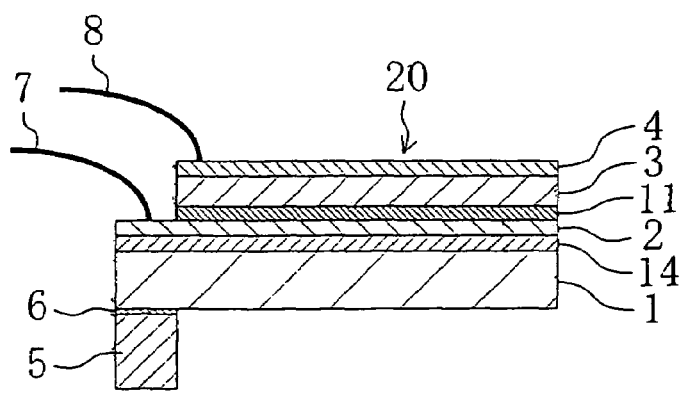

Next, as in Embodiment 2, the structure 21 is precisely cut by a dicing saw to obtain the piezoelectric element precursor 22 (see FIG. 8C), and then one end of the silicon substrate 1 is bonded to the stainless steel support substrate 5 (see FIG. 8D). Then, the lead wires 7 and 8 are connected to the first and second electrode layers 2 and 4, respectively, thus obtaining the piezoelectric element 20 (see FIG. 8E).

Thus, by providing the adhesive layer 14 between the silicon substrate 1 and the first electrode layer 2, it is possible to improve the adhesion between the silicon substrate 1 and the first electrode layer 2, thereby preventing peeling off during the manufacture of the piezoelectric element 20, and also making peeling off less likely to occur while a voltage is applied between the first and second electrode layers 2 and 4.

Now, specific examples of the present invention will be described.

First, the same piezoelectric element as that of FIG. 5 was produced by the same manufacturing method as that described above as the piezoelectric element of Example 45. Note that during the production process, the films of the first electrode layer, the orientation control layer and the piezoelectric layer were subjected to a composition analysis, and the crystalline orientation degree of the piezoelectric layer was examined through an analysis by an X-ray diffraction method.

A composition analysis of the first electrode layer (an iridium film) with an X-ray microanalyzer showed that the film was made of iridium containing 1 mol % of cobalt. Moreover, the composition of the orientation control layer (lead lanthanum titanate film) was analyzed with an X-ray photoelectron spectroscopy (XPS) apparatus while comparing the composition with that of the target. The analysis showed that the thin film had the same composition (molar ratio) of Pb:La:Ti=1.12:0.08:1.00 as that of the target. Furthermore, a composition analysis of the piezoelectric layer (a PZT film) with an X-ray microanalyzer showed that the cation composition ratio of the PZT film was Pb:Zr:Ti=1.00:0.53:0.47 and thus the PZT film had a chemical composition that can be expressed as $Pb(Zr_{0.53}Ti_{0.47})O_3$.

Moreover, an analysis with an X-ray diffraction method showed that the piezoelectric layer was a thin film having a perovskite crystalline structure and preferentially oriented along the (001) plane with a degree of (001) orientation of 99.5% (a thin film in which the <001> axis is oriented perpendicular to the surface thereof).

Next, a triangular voltage of 0 V to −25 V was applied via lead wires between the first electrode layer and the second electrode layer of the piezoelectric element of Example 45 so as to measure the amount of displacement of the tip of the piezoelectric element vertically reciprocating in the Z axis direction in the coordinate system of FIG. 5.

Figure 9:
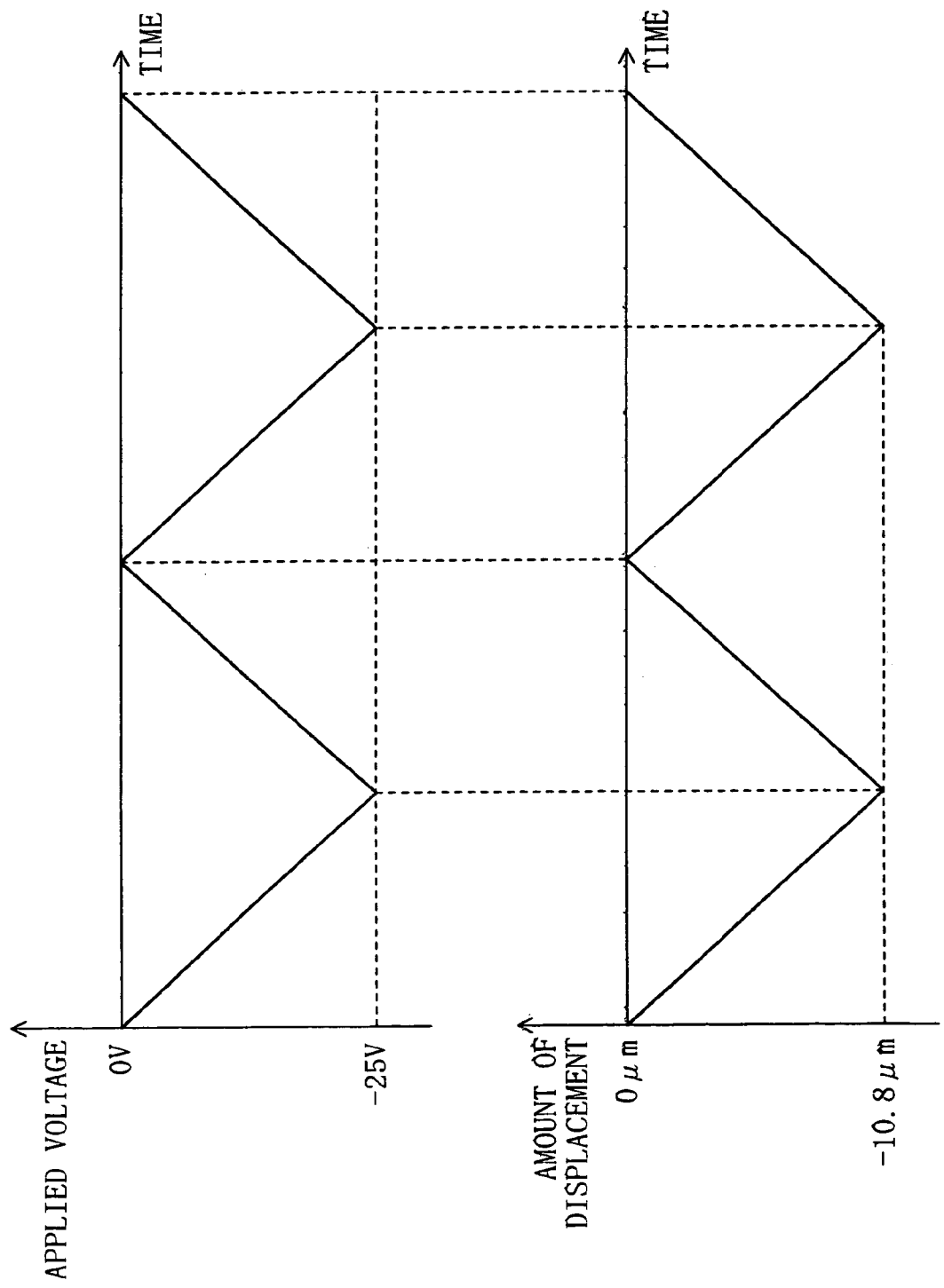
FIG. 9 is a diagram similar to FIG. 3 for the piezoelectric element of FIG. 5.

FIG. 9 illustrates the amount of displacement of the tip of the piezoelectric element in response to a voltage applied at a frequency of 50 Hz. As illustrated in FIG. 9, when a voltage of 0 V to −25 V was applied, the maximum amount of displacement of the tip of the piezoelectric element was 10.8 μm.

Moreover, the presence/absence of crack in the piezoelectric layer was examined after the application of each of a triangular voltage of 0 V to −30 V, a triangular voltage of 0 V to −40 V and a triangular voltage of 0 V to −50 V (all of these triangular voltages were applied at a frequency of 50 Hz for 2 hours). As a result, no crack was observed.

Three silicon substrates were prepared with the first electrode layer and the orientation control layer being formed thereon under the same conditions for the piezoelectric element of Example 45, and the same PZT films as that of the piezoelectric element of Example 45 were formed by using the three substrates. The three substrates were subjected to the sputtering process for 2, 5 and 20 minutes, respectively. The thicknesses of the obtained PZT films were 0.02 μm, 0.09 μm and 0.40 μm, respectively. The degree of (001) orientation of each of the PZT films was examined by an X-ray diffraction method.

As a result, the degrees of (001) orientation of the PZT films having the thicknesses of 0.02 μm, 0.09 μm and 0.40 μm were 93%, 98% and 99%, respectively. This shows that the crystal orientation of the PZT film is such that the (001) orientation becomes more dominant as the film growth proceeds, starting from the surface of the orientation control layer.

Next, piezoelectric elements of Example 46 to Example 56 whose first electrode layers and orientation control layers have different compositions and thicknesses were produced by changing the materials of the targets of the three-target RF magnetron sputtering apparatus and controlling the sputtering power and the sputtering time, while controlling the composition of the target of the sputtering apparatus and the sputtering time used for the deposition of the orientation control layers. Table 4 below shows the target material, the sputtering power and the sputtering time used for forming the first electrode layer, and the target material and the sputtering time used for forming the orientation control layer, for each of the piezoelectric elements.

TABLE 4

| | | First electrode layer | | | | Orientation control layer | |
|---|---|---|---|---|---|---|---|
| | | Target composition and sputtering power | | | | Target composition | |
| | | First target composition (sputtering power) | Second target composition (sputtering power) | Third target composition (sputtering power) | Dep. time (min) | Sputtering power: 300 W Target composition Sputtering power: 300 W | Dep. time (min) |
| Examples | 45 | Co (60 W) | Ir (200 W) | — | 35 | PLT Pb:La:Ti 1.12:0.08:1.00 | 10 |
| | 46 | Co (155 W) | Ir (200 W) | — | 12 | Mg-substituted PLT Pb:Mg:La:Ti 0.92:0.06:0.12:1.00 | 5 |
| | 47 | Co (140 W) | Ru (200 W) | — | 25 | PLT Pb:La:Ti 1.12:0.08:1.00 | 30 |

TABLE 4-continued

| | | First electrode layer | | | | Orientation control layer | |
|---|---|---|---|---|---|---|---|
| | | Target composition and sputtering power | | | | Target composition | |
| | | First target composition (sputtering power) | Second target composition (sputtering power) | Third target composition (sputtering power) | Dep. time (min) | Sputtering power: 300 W Target composition Sputtering power: 300 W | Dep. time (min) |
| | 48 | Co (120 W) | Ir (200 W) | Pt (200 W) | 4 | PLT Pb:La:Ti 1.12:0.08:1.00 | 20 |
| | 49 | Co (165 W) | Ir (200 W) | — | 11 | Mg-substituted PLT Pb:Mg:La:Ti 0.92:0.06:0.12:1.00 | 30 |
| | 50 | Ni (65 W) | Ir (200 W) | — | 35 | Mn-substituted PLT Pb:Mn:La:Ti 0.92:0.03:0.12:1.00 | 10 |
| | 51 | Ni (145 W) | Ir (200 W) | — | 26 | Mg-substituted PLT Pb:Mg:La:Ti 0.92:0.06:0.12:1.00 | 75 |
| | 52 | Ni (175 W) | Ir (200 W) | — | 11 | PLT Pb:La:Ti 1.12:0.08:1.00 | 20 |
| | 53 | Fe (135 W) | Ir (200 W) | — | 12 | Mg-substituted PLT Pb:Mg:La:Ti 0.92:0.06:0.12:1.00 | 20 |
| | 54 | Mn (155 W) | Ir (200 W) | — | 12 | Mg-substituted PLT Pb:Mg:La:Ti 0.92:0.06:0.12:1.00 | 30 |
| | 55 | Cu (120 W) | Ir (200 W) | — | 20 | Mn-substituted PLT Pb:Mn:La:Ti 0.92:0.03:0.12:1.00 | 10 |
| | 56 | Cu (90 W) | Ir (90 W) | Pd (180 W) | 19 | PLT Pb:La:Ti 1.08:0.12:1.00 | 10 |
| Comp. Examples | 4 | Co (0 W) | Ir (200 W) | — | 36 | PLT Pb:La:Ti 1.12:0.08:1.00 | 10 |
| | 5 | Co (60 W) | Ir (200 W) | — | 35 | — | — |

As in Example 45, for each of the piezoelectric elements of Example 46 to Example 56, the thickness and the composition of the first electrode layer and the orientation control layer and the degree of (001) orientation of the piezoelectric layer were examined, and the amount of displacement (maximum amount of displacement) of the tip of the piezoelectric element in response to an applied triangular voltage of 0 V to −25 V was measured. Moreover, the presence/absence of crack in the piezoelectric layer was examined after the application of each of a triangular voltage of 0 V to −30 V, a triangular voltage of 0 V to −40 V and a triangular voltage of 0 V to −50 V (all of these triangular voltages were applied at a frequency of 50 Hz for 2 hours). The results are shown in Table 5 below.

TABLE 5

| | | First electrode layer | | Orientation control layer | | Degree of (001) orientation of PZT film (%) | Evaluation of piezoelectric elements | | | | |
|---|---|---|---|---|---|---|---|---|---|---|---|
| | | | | Film composition | | | Displacement in response to application of −25 V (µm) | Crack caused by voltage application (50 Hz) | | | Overall quality |
| | | Material | Thickness (µm) | Composition with respect to Ti being 1.00 | Thickness (µm) | | | (Applied voltage per 2.5 µm of PZT film) | | | |
| | | | | | | | | 30 V | 40 V | 50 V | |
| Examples | 45 | Co—Ir 1%:99% | 0.22 | Pb:La:Ti = 1.12:0.08:1.00 | 0.02 | 99.5 | 10.8 | None | None | None | Good |
| | 46 | Co—Ir 26%:74% | 0.10 | Pb:Mg:La:Ti 0.92:0.06:0.12:1.00 | 0.01 | 100 | 11.0 | None | None | None | Good |
| | 47 | Co—Ru 20%:80% | 0.20 | Pb:La:Ti 1.12:0.08:1.00 | 0.06 | 99.5 | 10.4 | None | None | None | Good |
| | 48 | Co—Ir—Pt 6%:40%:56% | 0.06 | Pb:La:Ti 1.12:0.08:1.00 | 0.04 | 100 | 11.4 | None | None | None | Good |
| | 49 | Co—Ir 30%:70% | 0.10 | Pb:Mg:La:Ti 0.92:0.06:0.12:1.00 | 0.06 | 72.0 | 8.0 | None | None | None | Fair |

TABLE 5-continued

| | First electrode layer | | Orientation control layer Film composition | | Degree of (001) orientation of PZT film (%) | Evaluation of piezoelectric elements | | | | |
|---|---|---|---|---|---|---|---|---|---|---|
| | | | | | | Displacement in response to application of −25 V (μm) | Crack caused by voltage application (50 Hz) (Applied voltage per 2.5 μm of PZT film) | | | Overall quality |
| | Material | Thickness (μm) | Composition with respect to Ti being 1.00 | Thickness (μm) | | | 30 V | 40 V | 50 V | |
| | 50 Ni—Ir 1%:99% | 0.22 | Pb:Mn:La:Ti 0.92:0.03:0.12:1.00 | 0.02 | 100 | 10.8 | None | None | None | Good |
| | 51 Ni—Ir 20%:80% | 0.20 | Pb:Mg:La:Ti 0.92:0.06:0.12:1.00 | 0.15 | 100 | 11.0 | None | None | None | Good |
| | 52 Ni—Ir 30%:70% | 0.10 | Pb:La:Ti 1.12:0.08:1.00 | 0.04 | 68.5 | 8.2 | None | None | None | Fair |
| | 53 Fe—Ir 25%:75% | 0.10 | Pb:Mg:La:Ti 0.92:0.06:0.12:1.00 | 0.04 | 99.5 | 10.7 | None | None | None | Good |
| | 54 Mn—Ir 25%:75% | 0.10 | Pb:Mg:La:Ti 0.92:0.06:0.12:1.00 | 0.06 | 99.0 | 10.7 | None | None | None | Good |
| | 55 Cu—Ir 15%:85% | 0.15 | Pb:Mn:La:Ti 0.92:0.03:0.12:1.00 | 0.02 | 99.0 | 10.8 | None | None | None | Good |
| | 56 Cu—Ir—Pd 8%:10%:82% | 0.15 | Pb:La:Ti 1.08:0.12:1.00 | 0.02 | 99.5 | 10.8 | None | None | None | Good |
| Comp. Examples | 4 Ir 100% | 0.22 | Pb:La:Ti 1.12:0.08:1.00 | 0.02 | 65.0 | 7.7 | None | None | None | Poor |
| | 5 Co—Ir 1%:99% | 0.22 | — | — | 99.0 | 12.5 | None | Crack observed | Crack observed | Poor |

It can be seen that the degree of (001) orientation of the piezoelectric layer of each example of the present invention is higher than that of Comparative Example 4 to be described later. Particularly, when the content of at least one metal selected from the group consisting of cobalt, nickel, iron, manganese and copper in the first electrode layer is 26 mol % or less, a degree of (001) orientation of 90% or more can reliably be obtained, and the maximum amount of displacement of the tip of the piezoelectric element can be large.

Moreover, it can be seen that a piezoelectric element similar to that of Example 45, which uses a lead lanthanum titanate, can be obtained even when an Mn-added lead lanthanum titanate film or an Mg-added lead lanthanum titanate film is used as the orientation control layer.

Note that while a PZT film of the same composition was used as the piezoelectric layer for all the piezoelectric elements of Example 45 to Example 56, similar results were obtained with PZT films of different Ti/Zr molar ratios. Moreover, the piezoelectric layer may be an La-containing PZT film (PLZT film) or a PZT film containing ion of Nb, Mg, or the like, and a (001)-oriented film was obtained as in the piezoelectric elements of Example 45 to Example 56 as long as the film was an oxide film having a perovskite crystalline structure. Furthermore, a (001)-oriented film was obtained also when a strontium titanate film was used as the orientation control layer.

Next, piezoelectric elements of Comparative Example 4 and Comparative Example 5 were produced as follows.

The piezoelectric element of Comparative Example 4 differs from those of the examples of the present invention in that the iridium film of the first electrode layer does not contain a metal such as cobalt. Specifically, the first electrode layer is formed by a sputtering process for 16 minutes while setting the sputtering power to the first, cobalt target to 0 W and setting the sputtering power to the second, iridium target to 200 W. Thus, the piezoelectric element was produced as in Example 45 except that the first electrode layer was an iridium film having a thickness of 0.10 μm, which is believed not to function as a crystal orientation control layer.

The orientation control layer of the piezoelectric element of Comparative Example 4 was analyzed by an X-ray diffraction method, showing an X-ray diffraction pattern with high-intensity diffraction peaks for the (111) and (110) planes other than the (100) plane and the (001) plane, indicating that it was not a (100)- or (001)-oriented thin film. The degree of (001) orientation of the piezoelectric layer in the piezoelectric element of Comparative Example 4 was examined by an X-ray diffraction method to be 65%. It is believed that the orientation of the PZT film on the orientation control layer was poor due to the poor crystal orientation of the orientation control layer.

Moreover, the amount of displacement of the tip of the piezoelectric element of Comparative Example 1 in response to an applied triangular voltage was measured, indicating that the maximum amount of displacement was 7.7 μm.

Next, a piezoelectric element similar to that of Example 45 except that the orientation control layer was absent was produced. The piezoelectric element was identical to that of Example 45 except that the piezoelectric element was not provided with the orientation control layer. Specifically, as the piezoelectric layer, a PZT film having a thickness of 2.50 μm was formed through a sputtering process by applying a high-frequency power of 700 W for 50 minutes while heating the substrate to a temperature of 500° C. in a mixed gas of argon and oxygen (gas volume ratio: Ar:$O_2$=19:1) as a sputtering gas whose total gas pressure was kept at 0.3 Pa.

However, an X-ray diffraction analysis of the piezoelectric layer showed that the piezoelectric layer was not a PZT film having a perovskite crystalline structure and exhibiting intended piezoelectric characteristics, but was an oxide film (thickness: 3.5 μm) of a pyrochlore crystal phase made of lead, titanium and zircon, which does not exhibit piezoelectric characteristics and which can typically be formed at lower temperatures. Thus, it was found that in the absence of the orientation control layer, it is not possible, at a temperature of 500° C., to form a piezoelectric layer made of a PZT film having a perovskite crystalline structure.

In view of this, a piezoelectric element of Comparative Example 5 in which the orientation control layer was absent was produced while forming the piezoelectric layer at a temperature of 600° C.

In the piezoelectric element of Comparative Example 5, the degree of (001) orientation was as good as 100%, and the amount of displacement (maximum amount of displacement) of the tip of the piezoelectric element in response to an applied triangular voltage of 0 V to −25 V was 12.5 μm. However, when the piezoelectric element was driven by applying a triangular voltage of 0 to −40 V, a minute crack appeared on the film surface, and the film broke due to peeling off after 40 minutes from the start of the driving of the piezoelectric element. It is believed that the break of the film occurred for the following reason. Since the piezoelectric layer was formed at a temperature of 600° C., 100° C. higher than that used when the orientation control layer is provided, the PZT film was brought under a greater tensile stress, due to the difference between the thermal expansion coefficient of the silicon substrate and that of the PZT film, during the step of cooling the structure to a room temperature following the formation of the PZT film. Moreover, when the piezoelectric element was driven, the PZT film was contracted, and these stresses together caused the break of the film.

Next, as a piezoelectric element of Example 57, the same piezoelectric element as that of FIG. 7 was produced by the same manufacturing method as that described above. Moreover, piezoelectric elements of Example 58 to Example 64 whose first electrode layers, orientation control layers and adhesive layers have different compositions and thicknesses were produced by changing the materials of the targets of the three-target RF magnetron sputtering apparatus and controlling the sputtering power and the sputtering time, while controlling the composition of the target of the sputtering apparatus and the sputtering time used for the deposition of the orientation control layers, and controlling the composition of the target of the sputtering apparatus and the sputtering time used for the deposition of the adhesive layers. Table 6 below shows the target material, the sputtering power and the sputtering time used for forming the first electrode layer, and the target material and the sputtering time used for forming the orientation control layer and the adhesive layer, for each of the piezoelectric elements, together with those of Example 57.

The piezoelectric elements of Example 57 to Example 64 were evaluated as Example 45 to Example 56. The results are shown in Table 7 below.

TABLE 6

| | | Adhesive layer | | First electrode layer | | | | Orientation control layer | |
| | | | | Target composition and sputtering power | | | | | |
| | | Target composition Sputtering power: 100 W | Dep. time (min) | First target composition (sputtering power) | Second target composition (sputtering power) | Third target composition (sputtering power) | Dep. time (min) | Target composition Sputtering power: 300 W | Dep. time (min) |
|---|---|---|---|---|---|---|---|---|---|
| Examples | 57 | Ti | 2 | Co (120 W) | Pt (180 W) | — | 20 | PLT Pb:La:Ti 1.12:0.08:1.00 | 10 |
| | 58 | Ti | 3 | Ni (130 W) | Pd (180 W) | — | 20 | Mg-substituted PLT Pb:Mg:La:Ti 0.92:0.06:0.12:1.00 | 5 |
| | 59 | Ti | 2 | Cu (45 W) | Pt (180 W) | — | 32 | PLT Pb:La:Ti 1.12:0.08:1.00 | 30 |
| | 60 | Ti | 2 | Ni (120 W) | Pt (180 W) | Pd (100 W) | 40 | PLT Pb:La:Ti 1.12:0.08:1.00 | 20 |
| | 61 | Ta | 3 | Ni (165 W) | Pt (180 W) | — | 24 | Mg-substituted PLT Pb:Mg:La:Ti 0.92:0.06:0.12:1.00 | 30 |
| | 62 | Ta | 2 | Mn (105 W) | Pt (180 W) | — | 29 | Mn-substituted PLT Pb:Mn:La:Ti 0.92:0.03:0.12:1.00 | 10 |
| | 63 | Ta | 3 | Co (120 W) | Pd (180 W) | — | 15 | Mg-substituted PLT Pb:Mg:La:Ti 0.92:0.06:0.12:1.00 | 75 |
| | 64 | Mo | 3 | Fe (60 W) | Pt (180 W) | — | 35 | PLT Pb:La:Ti 1.12:0.08:1.00 | 20 |

TABLE 7

| | | Adhesive layer | | First electrode layer | | Orientation control layer | | | Evaluation of piezoelectric elements | | | | |
|---|---|---|---|---|---|---|---|---|---|---|---|---|---|
| | | | | | | Film composition | | | Degree of (001) orientation of PZT film (%) | Displacement in response to application of −25 V (μm) | Crack caused by voltage application (50 Hz) (Applied voltage per 2.5 μm of PZT film) | | Overall Quality |
| | | Material | Thickness (μm) | Material | Thickness (μm) | Composition with respect to Ti being 1.00 | Thickness (μm) | | | | 30 V | 40 V | 50 V |
| Examples | 57 | Ti | 0.06 | Co—Pt 14%:86% | 0.15 | PLT Pb:La:Ti = 1.12:0.08:1.00 | 0.02 | | 99.5 | 10.5 | None | None | None | Good |
| | 58 | Ti | 0.09 | Ni—Pd 15%:85% | 0.15 | Mg-substituted PLT Pb:Mg:La:Ti 0.92:0.06:0.12:1.00 | 0.01 | | 99.5 | 10.3 | None | None | None | Good |
| | 59 | Ti | 0.06 | Cu—Pt 1%:99% | 0.20 | PLT Pb:La:Ti 1.12:0.08:1.00 | 0.06 | | 99.5 | 10.5 | None | None | None | Good |
| | 60 | Ti | 0.06 | Ni—Pt—P 10%:88%:10% | 0.30 | PLT Pb:La:Ti 1.12:0.08:1.00 | 0.04 | | 100 | 11.4 | None | None | None | Good |
| | 61 | Ta | 0.09 | Ni—Pt 25%:75% | 0.20 | Mg-substituted PLT Pb:Mg:La:Ti 0.92:0.06:0.12:1.00 | 0.06 | | 100 | 11.2 | None | None | None | Good |
| | 62 | Ta | 0.06 | Mn—Pt 8%:92% | 0.20 | Mn-substituted PLT Pb:Mn:La:Ti 0.92:0.03:0.12:1.00 | 0.02 | | 99.0 | 10.3 | None | None | None | Good |
| | 63 | Ta | 0.09 | Co—Pd 16%:84% | 0.10 | Mg-substituted PLT Pb:Mg:La:Ti 0.92:0.06:0.12:1.00 | 0.15 | | 99.5 | 10.3 | None | None | None | Good |
| | 64 | Mo | 0.07 | Fe—Pt 1%:99% | 0.22 | PLT Pb:La:Ti 1.12:0.08:1.00 | 0.04 | | 100 | 11.2 | None | None | None | Good |

It can be seen that even when the adhesive layer is provided between the substrate and the first electrode layer, if the content of at least one metal selected from the group consisting of cobalt, nickel, iron, manganese and copper in the first electrode layer is 26 mol % or less, a degree of (001) orientation of 90% or more can be obtained, and the maximum amount of displacement of the tip of the piezoelectric element can be large.

Moreover, it can be seen that a piezoelectric element having desirable characteristics similar to that of Example 57, which uses a lead lanthanum titanate, can be obtained even when an Mn-added lead lanthanum titanate film or an Mg-added lead lanthanum titanate film is used as the orientation control layer.

Furthermore, it can be seen that a piezoelectric element similar to that of Example 57 can be obtained even when tantalum or molybdenum is used instead of titanium as the material of the adhesive layer.

Note that while a PZT film of the same composition was used as the piezoelectric layer for all the piezoelectric elements of Example 57 to Example 64, similar results were obtained with PZT films of different Ti/Zr molar ratios. Moreover, the piezoelectric layer may be an La-containing PZT film (PLZT film) or a PZT film containing ion of Nb, Mg, or the like, and a (001)-oriented film was obtained as in the piezoelectric elements of Example 57 to Example 64 as long as the film was an oxide film having a perovskite crystalline structure. Furthermore, a (001)-oriented film was obtained also when a strontium titanate film was used as the orientation control layer.

Next, a piezoelectric element of Example 65 having the same shape as that of Example 45 was produced by the same method as that of Example 45 by using a substrate of a flat strip shape having a length of 15.0 mm and a width of 3.0 mm and made of a borosilicate glass (#7089, thermal expansion coefficient: $45 \times 10^{-7}/°$ C.) having a thickness of 0.30 mm as a substrate, instead of using a silicon substrate (having a flat strip shape having a length of 15.0 mm, a thickness of 0.30 mm and a width of 3.0 mm).

Moreover, using the same substrate as that of Example 65, a piezoelectric element of Example 66 was produced as in Example 46, a piezoelectric element of Example 67 was produced as in Example 47, a piezoelectric element of Example 68 was produced as in Example 48, a piezoelectric element of Example 69 was produced as in Example 50, a piezoelectric element of Example 70 was produced as in Example 51, a piezoelectric element of Example 71 was produced as in Example 53, a piezoelectric element of Example 72 was produced as in Example 54, a piezoelectric element of Example 73 was produced as in Example 55, and a piezoelectric element of Comparative Example 6 was produced as in Comparative Example 4 where the first electrode layer was made only of iridium.

Each of the piezoelectric elements of Example 65 to Example 73 and Comparative Example 6 produced by using a borosilicate glass substrate as described above was evaluated as in Example 45 to Example 56. The results are shown in Table 8 below.

TABLE 8

| | | First electrode layer | | Orientation control layer | | Degree of (001) orientation of PZT film (%) | Evaluation of piezoelectric elements | |
|---|---|---|---|---|---|---|---|---|
| | | Material | Thickness (μm) | Film composition Composition with respect to Ti being 1.00 | Thickness (μm) | | Displacement in response to application of −25 V (μm) | Overall quality |
| Examples | 65 | Co—Ir 1%:99% | 0.22 | PLT Pb:La:Ti = 1.12:0.08:1.00 | 0.02 | 99.0 | 18.0 | Good |
| | 66 | Co—Ir 26%:84% | 0.10 | Mg-substituted PLT Pb:Mg:La:Ti 0.92:0.06:0.12:1.00 | 0.01 | 100 | 20.3 | Good |
| | 67 | Co—Ru 20%:80% | 0.20 | PLT Pb:La:Ti 1.12:0.08:1.00 | 0.06 | 99.5 | 19.7 | Good |
| | 68 | Co—Ir—Pt 6%:40%:56% | 0.06 | PLT Pb:La:Ti 1.12:0.08:1.00 | 0.04 | 100 | 20.2 | Good |
| | 69 | Ni—Ir 1%:99% | 0.22 | Mn-substituted PLT Pb:Mn:La:Ti 0.92:0.03:0.12:1.00 | 0.02 | 100 | 19.8 | Good |
| | 70 | Ni—Ir 20%:80% | 0.20 | Mg-substituted PLT Pb:Mg:La:Ti 0.92:0.06:0.12:1.00 | 0.15 | 100 | 19.5 | Good |
| | 71 | Fe—Ir 25%:75% | 0.10 | Mg-substituted PLT Pb:Mg:La:Ti 0.92:0.06:0.12:1.00 | 0.04 | 100 | 18.6 | Good |
| | 72 | Mn—Ir 25%:75% | 0.10 | Mg-substituted PLT Pb:Mg:La:Ti 0.92:0.06:0.12:1.00 | 0.06 | 99.0 | 18.0 | Good |
| | 73 | Cu—Ir 15%:85% | 0.15 | Mn-substituted PLT Pb:Mn:La:Ti 0.92:0.03:0.12:1.00 | 0.02 | 100 | 19.2 | Good |
| Comp. Examples | 6 | Ir 100% | 0.22 | PLT Pb:La:Ti 1.12:0.08:1.00 | 0.02 | 62.0 | 10.6 | Poor |

It can be seen that even when the substrate is made of a glass different from silicon, the piezoelectric element of the present invention has a piezoelectric layer having a high degree of (001) orientation, whereby it is possible to realize a high degree of piezoelectric displacement. Moreover, it was found that although the amount of displacement in response to an applied voltage varies depending on the hardness of the substrate material, it is possible to realize stable displacement characteristics.

Note that while a piezoelectric element similar to that of Example 65 except that the orientation control layer was absent was produced, an X-ray diffraction analysis of the piezoelectric layer showed that the piezoelectric layer was not a PZT film having a perovskite crystalline structure and exhibiting intended piezoelectric characteristics, but was an oxide film (thickness: 3.5 μm) of a pyrochlore crystalline structure made of lead, titanium and zircon, which does not exhibit piezoelectric characteristics and which can typically be formed at lower temperatures. Thus, it was found that also when the substrate is made of a glass, in the absence of the orientation control layer, it is not possible, at a temperature of 500° C., to form a piezoelectric layer made of a PZT film having a perovskite crystalline structure.

Embodiment 3

Next, an ink jet head using the layered structure of the piezoelectric element of the present invention will be described.

Figure 10:
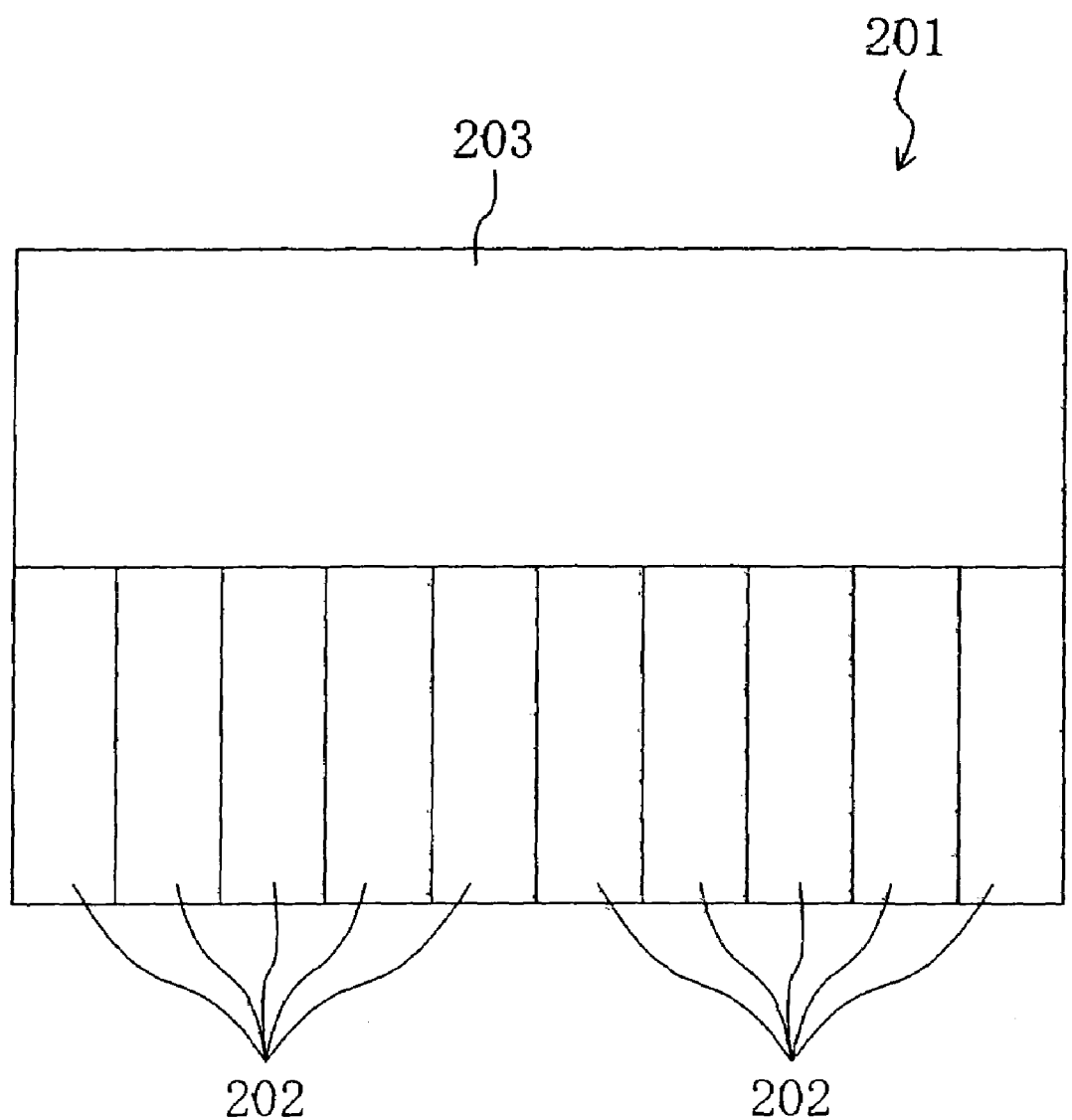
FIG. 10 is a schematic diagram illustrating an ink jet head according to an embodiment of the present invention.

FIG. 10 is a schematic diagram illustrating an ink jet head according to an embodiment of the present invention. As illustrated in FIG. 10, an ink jet head 201 of the present embodiment includes a plurality of (10 in FIG. 10) ink discharging elements 202 of the same shape arranged in a row, and a driving power supply element 203 such as an IC chip for driving the ink discharging elements 202.

Figure 11:
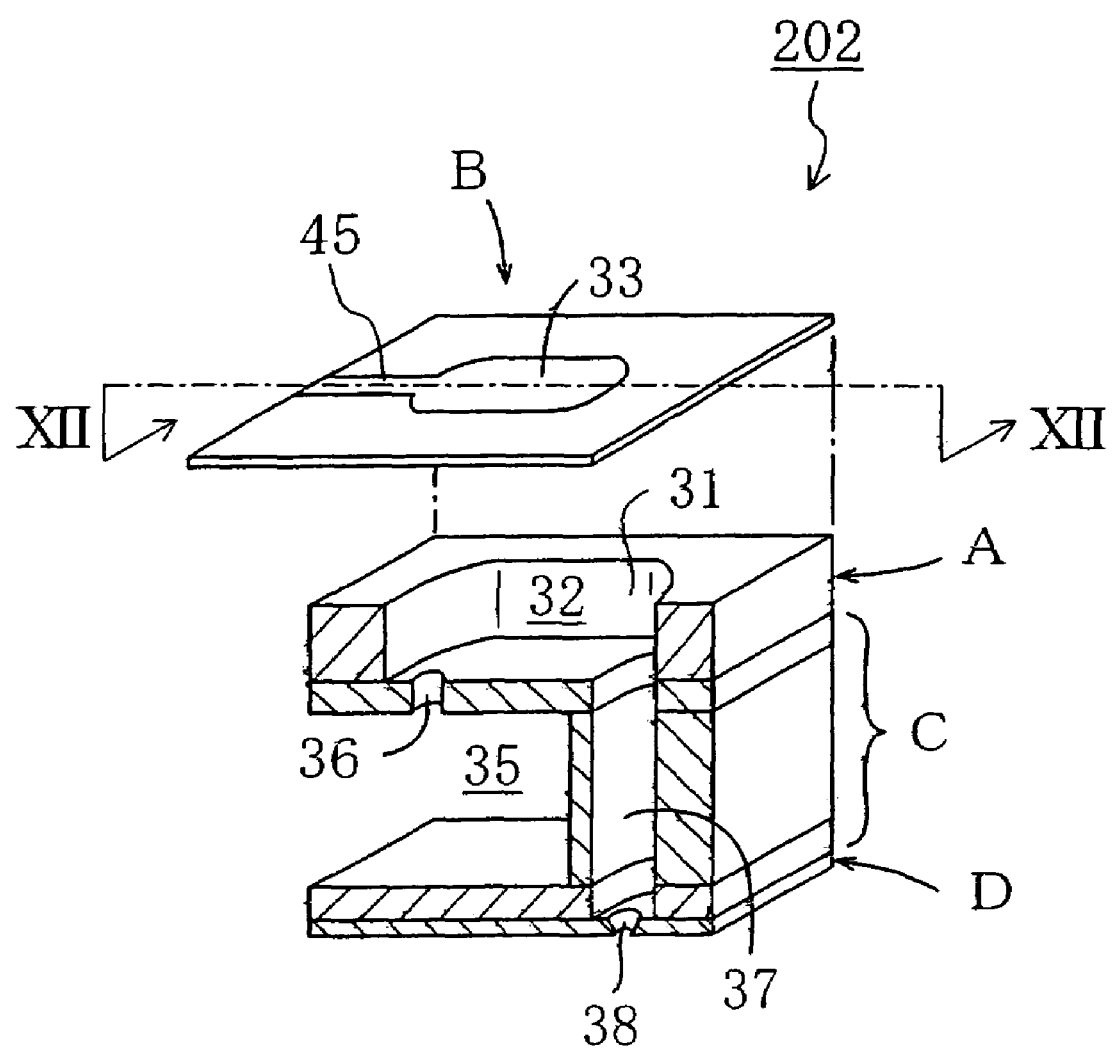
FIG. 11 is a partially-cutaway perspective view illustrating an ink discharging element of the ink jet head of FIG. 10.

FIG. 11 is a partially-cutaway perspective view illustrating the structure of one ink discharging element 202. In FIG. 11, the reference character A denotes a pressure chamber member made of a glass, and a pressure chamber cavity 31 is formed in the pressure chamber member A. The reference character B denotes an actuator section placed so as to cover the upper opening (having an elliptical shape whose minor axis is 200 μm long and whose major axis is 400 μm long) of the pressure chamber cavity 31, and the reference character C denotes an ink channel member placed so as to cover the lower opening of the pressure chamber cavity 31. Thus, the pressure chamber cavity 31 of the pressure chamber member A is defined by the actuator section B and the ink channel member C, placed on and under the pressure chamber member A, respectively, thereby forming a pressure chamber 32 (depth: 0.2 mm).

The actuator section B includes a first electrode layer 33 (separate electrode) above each pressure chamber 32. The position of the first electrode layer 33 generally corresponds to that of the pressure chamber 32. Moreover, the ink channel member C includes a common ink chamber 35 shared by the pressure chambers 32 of a number of ink discharging elements 202 arranged in the ink supply direction, a supply port 36 via which the common ink chamber 35 is communicated to the pressure chamber 32 so that ink in the common ink chamber 35 is supplied into the pressure chamber 32, and an ink channel 37 through which ink in the pressure chamber 32 is discharged. Furthermore, the reference character D denotes a nozzle plate. The nozzle plate D includes nozzle holes 38 (diameter: 30 µm) each of which is communicated to the ink channel 37. The pressure chamber member A, the actuator section B, the ink channel member C and the nozzle plate D are bonded together by an adhesive, thus forming the ink discharging element 202.

In the present embodiment, the pressure chamber member A, the actuator section B (except for the first electrode layer 33 and a piezoelectric layer 41 (see FIG. 12)), the ink channel member C and the nozzle plate D are formed as an integral member across all the ink discharging elements 202, and each ink discharging element 202 is defined as a portion of the integral member including one pressure chamber 32, and the nozzle hole 38, the first electrode layer 33 and the piezoelectric layer 41 that correspond to the pressure chamber 32. Note that the ink discharging elements 202 may alternatively be formed separately and then attached together. Moreover, it is not necessary that the ink jet head 201 is formed by a plurality of ink discharging elements 202, but may alternatively be formed by a single ink discharging element 202.

The driving power supply element 203 is connected to the first electrode layers 33 of the actuator sections B of a plurality of ink discharging elements 202 via bonding wires, so that a voltage is supplied to each first electrode layer 33 from the driving power supply element 203.

Figure 12:
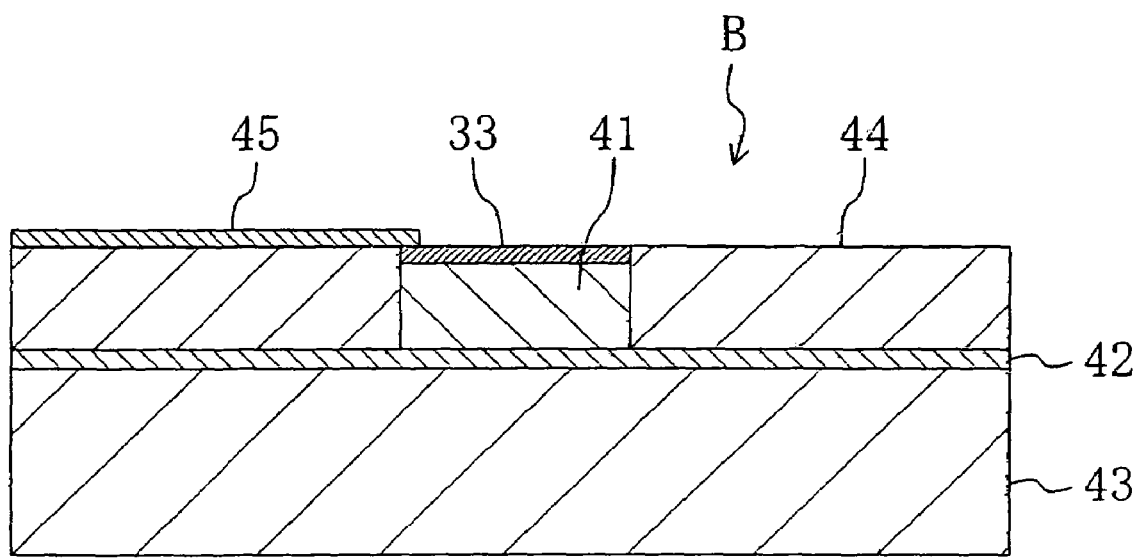
FIG. 12 is a cross-sectional view taken along line XII—XII of FIG. 11.

Next, the structure of the actuator section B will be described with reference to FIG. 12. FIG. 12 is a cross-sectional view, taken along line XII—XII of FIG. 11, illustrating the actuator section B of the ink discharging element 202 illustrated in FIG. 11. As illustrated in FIG. 12, the actuator section B includes the first electrode layers 33 each located above one pressure chamber 32 so that the position of the first electrode layer 33 generally corresponds to that of the pressure chamber 32, the piezoelectric layer 41 provided on (under, as shown in the figure) each first electrode layer 33, a second electrode layer 42 (common electrode) provided on (under) the piezoelectric layer 41 and shared by all the piezoelectric layers 41 (all the ink discharging elements 202), and a vibration layer 43 provided on (under) the second electrode layer 42 across the entire surface thereof, which is displaced and vibrates in the thickness direction by the piezoelectric effect of the piezoelectric layer 41. As is the second electrode layer 42, the vibration layer 43 is also shared by the pressure chambers 32 of all the ink discharging elements 202 (i.e., formed as an integral member across all the ink discharging elements 202).

The first electrode layer 33, the piezoelectric layer 41 and the second electrode layer 42 are arranged in this order to form a piezoelectric element. Moreover, the vibration layer 43 is provided on one surface of the piezoelectric element that is closer to the second electrode layer 42.

As in Embodiment 1, the first electrode layer 33 is made of an iridium (Ir) film having a thickness of 0.10 µm and containing 6 mol % of cobalt (Co), and forms an electrode/crystal orientation control layer that has a function of controlling the crystal orientation of the piezoelectric layer 41, in addition to the function as an electrode.

As in Embodiment 1, the piezoelectric layer 41 is made of a rhombohedral or tetragonal perovskite oxide that is preferentially oriented along a (001) plane, and is again a PZT film having a thickness of 2.50 µm and having a chemical composition that can be expressed as $Pb(Zr_{0.53}Ti_{0.47})O_3$.

As in Embodiment 1, the second electrode layer 42 is made of a platinum thin film (note however that the thickness thereof is 0.10 µm).

The vibration layer 43 is made of a chromium (Cr) film having a thickness of 3.5 µm. Note that the material of the vibration layer 43 is not limited to Cr, but may alternatively be nickel, aluminum, tantalum, tungsten, silicon, an oxide or nitride thereof (e.g., silicon dioxide, aluminum oxide, zirconium oxide, silicon nitride), or the like. Moreover, the thickness of the vibration layer 43 is not limited to any particular thickness as long as it is in the range of 2 to 5 µm.

On the second electrode layer 42, an electrically insulative organic film 44 made of a polyimide resin is provided so as to surround the layered, structure of the first electrode layer 33 and the piezoelectric layer 41 and so that the upper surface thereof is flush with the upper surface of the first electrode layer 33. On the upper surface of the electrically insulative organic film 44, an extraction electrode film 45 made of a gold thin film (thickness: 0.10 µm) having a lead wire shape extends from the first electrode layer 33.

Next, a method for manufacturing the ink jet head 201 will be described with reference to FIG. 13A to FIG. 13I.

First, as illustrated in FIG. 13A, the first electrode layer 33, the piezoelectric layer 41 and the second electrode layer 42 are deposited in this order on a silicon substrate 51 having a length of 20 mm, a width of 20 mm and a thickness of 0.3 mm, thereby obtaining a structure 54, as in Embodiment 1. Note that an adhesive layer made of at least one material selected from the group consisting of titanium, tantalum and molybdenum may be formed between the silicon substrate 51 and the first electrode layer 33, as in Embodiment 1.

Then, as illustrated in FIG. 13B, the vibration layer 43 made of a chromium (Cr) film (thickness: 3.5 µm) is formed on the second electrode layer 42 of the structure 54 by an RF sputtering method at a room temperature.

Next, as illustrated in FIG. 13C, the structure 54, on which the vibration layer 43 has been formed, is bonded to the pressure chamber member A by using an adhesive (acrylic resin) 55. In this process, the pressure chamber member A, in which the pressure chamber cavity 31 has been formed in advance, is bonded on one surface of the vibration layer 43 that is away from the second electrode layer 42.

Then, as illustrated in FIG. 13D, the silicon substrate 51 is removed by dry etching with an $SF_6$ gas using a plasma reactive etching apparatus. Note that in a case where an adhesive layer is formed between the silicon substrate 51 and the first electrode layer 33, the adhesive layer is also removed.

Then, as illustrated in FIG. 13E, a photoresist resin film 57 is applied on a portion of the surface of the first electrode layer 33 that is not to be etched, in preparation for patterning the layered structure of the first electrode layer 33 and the piezoelectric layer 41 into an elliptical pattern (an elliptical shape whose minor axis is 180 µm long and whose major axis is 380 µm long).

Then, as illustrated in FIG. 13F, the first electrode layer 33 and the piezoelectric layer 41 are patterned into individual portions by etching with dilute hydrogen fluoride. Then, as illustrated in FIG. 13G, the photoresist resin film 57 is removed by using a resist stripper solution.

Then, as illustrated in FIG. 13H, the electrically insulative organic film 44 made of a polyimide resin is formed by a printing method on a portion of the second electrode layer 42 that has been exposed through the patterning process described above. Then, as illustrated in FIG. 13I, the extraction electrode film 45 made of a gold thin film having a lead wire shape is formed by a DC sputtering method on the upper surface of the electrically insulative organic film 44, thus obtaining the actuator section B.

On the other hand, although not shown in the figure, the ink channel member C, in which the common ink chamber 35, the supply port 36 and the ink channel 37 have been formed in advance, and the nozzle plate D, in which the nozzle hole 38 has been formed in advance, are bonded to each other by using an adhesive. Then, the pressure chamber member A, which has been bonded to the actuator section B, and the ink channel member C, to which the nozzle plate D has been bonded, are aligned with each other and then bonded together by using an adhesive. Thus, the ink jet head 201 is obtained.

Note that if the first electrode layer 33, the piezoelectric layer 41 and the second electrode layer 42 are formed by using any of the materials set forth in Embodiment 1, it is possible to produce the actuator section B having desirable characteristics. Moreover, the thickness of each of these layers is not limited to any particular thickness as long as it is in the range set forth in Embodiment 1.

In the ink jet head 201 having such a structure as described above, a voltage is supplied to each of the first electrode layers 33 of the plurality of ink discharging elements 202 from the driving power supply element 203 via a bonding wire, and the vibration layer 43 bonded to the second electrode layer 42 (common electrode) is displaced and vibrates by the piezoelectric effect of the piezoelectric layer 41, whereby ink in the common ink chamber 35 is discharged through the nozzle hole 38 via the supply port 36, the pressure chamber 32 and the ink channel 37. In the ink jet head 201, the piezoelectric layer 41, which forms the actuator section B of the ink discharging element 202, has a uniform crystal orientation along the (001) plane and has high and uniform piezoelectric displacement characteristics, whereby a large piezoelectric displacement (amount of displacement) can be obtained with little deviation in the piezoelectric displacement characteristics among the plurality of ink discharging elements 202. Since a large piezoelectric displacement can be obtained, the ink-discharge performance is high, and it is possible to provide a large margin with which to adjust the power supply voltage, whereby it is possible to easily make an adjustment so as to suppress the deviation in the ink discharge among the plurality of ink discharging elements 202.

The ink jet head 201 including 250 ink discharging elements 202 of the same shape was actually produced by the manufacturing method as described above, and a sine-wave voltage (200 Hz) of 0 V to −10 V was applied between the two electrode layers 33 and 42 interposing the piezoelectric layer 41 therebetween so as to measure the deviation in the vibration amplitude of the vibration layer 43 in the thickness direction, indicating that the deviation was as small as σ=1.5%.

Embodiment 4

Figure 14:
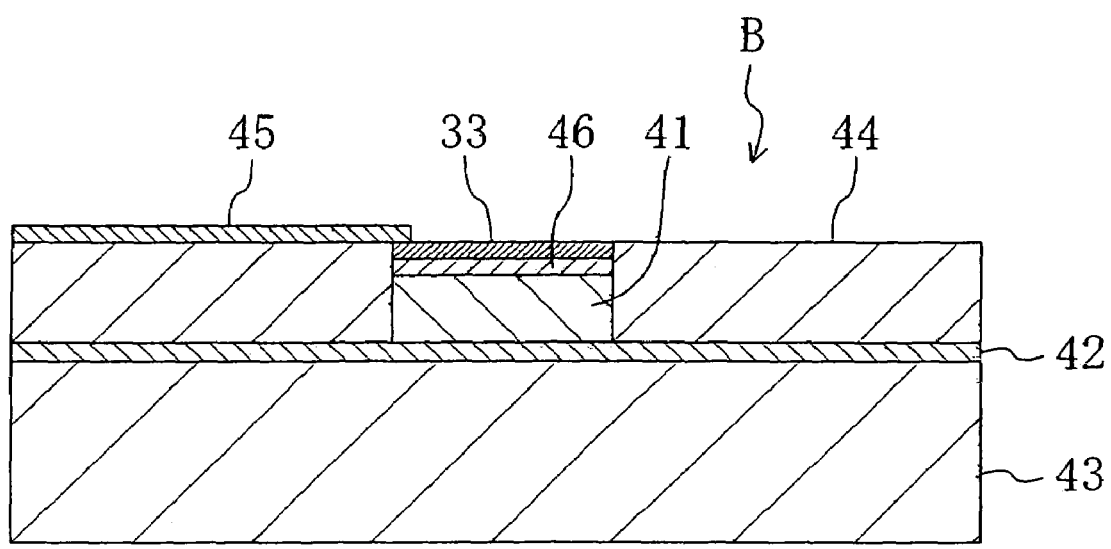
FIG. 14 is a view similar to FIG. 12, illustrating an important part (actuator section) of another ink jet head according to an embodiment of the present invention.

FIG. 14 illustrates the actuator section B of the ink discharging element 202 in another ink jet head 201 according to an embodiment of the present invention (note that the same components as those of FIG. 12 will be denoted by the same reference numerals and will not be further described below). The piezoelectric element of the present embodiment is similar to that illustrated in FIG. 12 (Embodiment 3) except that it further includes an orientation control layer 46 between the first electrode layer 33 and the piezoelectric layer 41 as in Embodiment 2. Other than this, the structure is similar to that illustrated in FIG. 12.

Specifically, in the present embodiment, the actuator section B includes the first electrode layers 33 each located above one pressure chamber 32 so that the position of the first electrode layer 33 generally corresponds to that of the pressure chamber 32, the orientation control layer 46 provided on (under, as shown in FIG. 14) each first electrode layer 33, the piezoelectric layer 41 provided on (under) the orientation control layer 46, the second electrode layer 42 provided on (under) the piezoelectric layer 41, and the vibration layer 43 provided on (under) the second electrode layer 42 across the entire surface thereof, which is displaced and vibrates in the thickness direction by the piezoelectric effect of the piezoelectric layer 41.

The first electrode layer 33, the orientation control layer 46, the piezoelectric layer 41 and the second electrode layer 42 are arranged in this order to form a piezoelectric element. Moreover, the vibration layer 43 is provided on one surface of the piezoelectric element that is closer to the second electrode layer 42.

As in Embodiment 2, the first electrode layer 33 is made of an iridium (Ir) film having a thickness of 0.22 μm and containing 1 mol % of cobalt (Co), and forms an electrode/crystal orientation control layer that has a function of controlling the crystal orientation of the piezoelectric layer 41, in addition to the function as an electrode.

As in Embodiment 2, the orientation control layer 46 is made of a cubic or tetragonal perovskite oxide that is preferentially oriented along a (100) or (001) plane, and is again a lead lanthanum titanate film (composition ratio: Pb:La:Ti=1.12:0.08:1.00) having a thickness of 0.02 μm.

As in Embodiment 2, the piezoelectric layer 41 is made of a rhombohedral or tetragonal perovskite oxide that is preferentially oriented along a (001) plane, and is again a PZT film having a thickness of 2.50 μm and having a chemical composition that can be expressed as $Pb(Zr_{0.53}Ti_{0.47})O_3$.

As in Embodiment 2, the second electrode layer 42 is made of a platinum thin film (note however that the thickness thereof is 0.10 μm).

As in Embodiment 3, the vibration layer 43 is made of a chromium film having a thickness of 3.5 μm.

On the second electrode layer 42, the electrically insulative organic film 44 made of a polyimide resin is provided so as to surround the layered structure of the first electrode layer 33 and the piezoelectric layer 41 and so that the upper surface thereof is flush with the upper surface of the first electrode layer 33. On the upper surface of the electrically insulative organic film 44, the extraction electrode film 45 made of a gold thin film (thickness: 0.10 μm) having a lead wire shape extends from the first electrode layer 33.

Next, a method for manufacturing the ink jet head 201 will be described with reference to FIG. 15A to FIG. 15I.

Figure 15A:
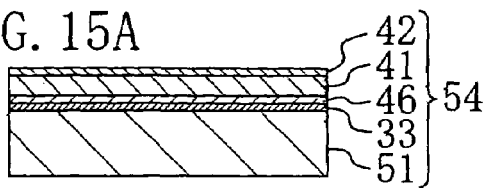
FIG. 15A to FIG. 15I illustrate steps in a method for manufacturing the ink jet head of FIG. 14.
Figure 15B:
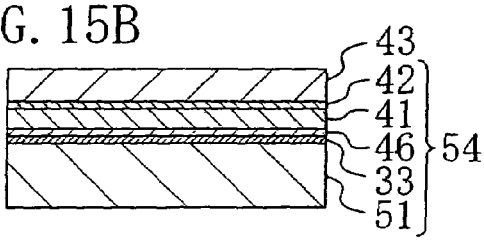

First, the first electrode layer 33, the orientation control layer 46, the piezoelectric layer 41 and the second electrode layer 42 are deposited in this order on the silicon substrate 51 having a length of 20 mm, a width of 20 mm and a thickness of 0.3 mm, thereby obtaining the structure 54, as in Embodiment 2 (or 3) (see FIG. 15A). Note that an adhesive layer made of at least one material selected from the group consisting of titanium, tantalum and molybdenum may be formed between the silicon substrate 51 and the first electrode layer 33, as in Embodiment 3.

Figure 15C:
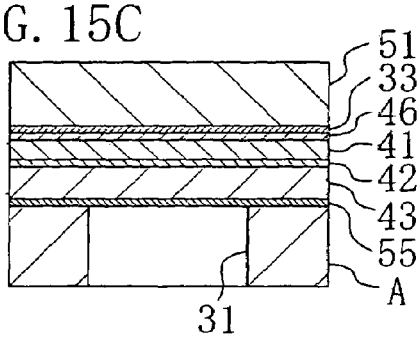

Then, as in Embodiment 3, the vibration layer 43 made of a chromium film (thickness: 3.5 μm) is formed on the second electrode layer 42 of the structure 54 by an RF sputtering method at a room temperature (see FIG. 15B), and then the structure 54, on which the vibration layer 43 has been formed, is bonded to the pressure chamber member A by using the adhesive 55 (see FIG. 15C).

Figure 15D:
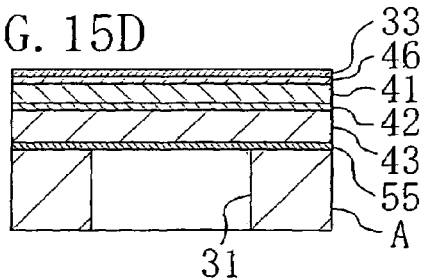

Then, as in Embodiment 3, the silicon substrate 51 is removed by dry etching (see FIG. 15D). Note that in a case where an adhesive layer is formed between the silicon substrate 51 and the first electrode layer 33, the adhesive layer is also removed.

Figure 15E:
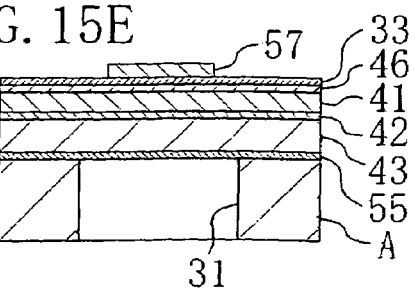
Figure 15F:
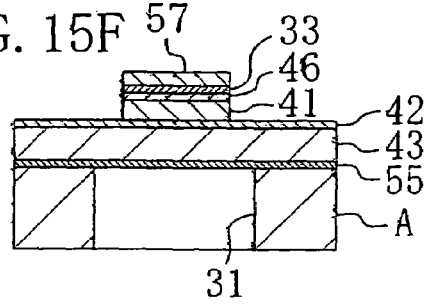
Figure 15G:
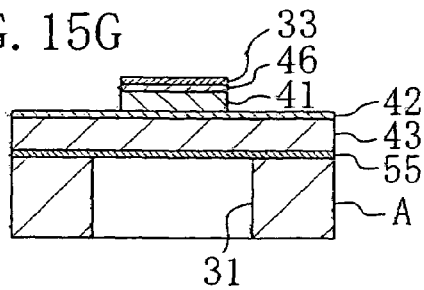
Figure 15H:
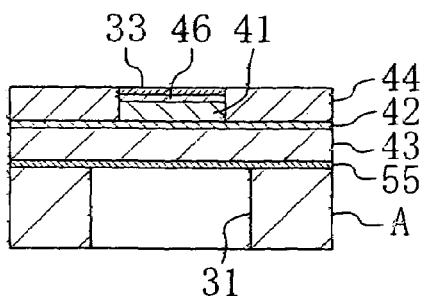
Figure 15I:
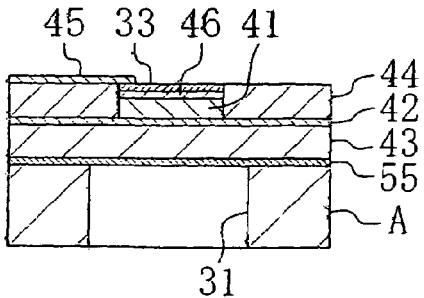

Then, as in Embodiment 3, the photoresist resin film 57 is applied on a portion of the surface of the first electrode layer 33 that is not to be etched, in preparation for patterning the layered structure of the first electrode layer 33, the orientation control layer 46 and the piezoelectric layer 41 (see FIG. 15E). Then, an etching process is performed to pattern the first electrode layer 33, the orientation control layer 46 and the piezoelectric layer 41 into individual portions (see FIG. 15F). Then, the photoresist resin film 57 is removed by using a resist stripper solution (see FIG. 15G).

Then, as in Embodiment 3, the electrically insulative organic film 44 is formed on a portion of the second electrode layer 42 that has been exposed through the patterning process described above (see FIG. 15H), and the extraction electrode film 45 is formed on the upper surface of the electrically insulative organic film 44 (see FIG. 15I), thus obtaining the actuator section B.

On the other hand, as in Embodiment 3, the ink channel member C, in which the common ink chamber 35, the supply port 36 and the ink channel 37 have been formed in advance, and the nozzle plate D, in which the nozzle hole 38 has been formed in advance, are bonded to each other by using an adhesive. Then, the pressure chamber member A, which has been bonded to the actuator section B, and the ink channel member C, to which the nozzle plate D has been bonded, are aligned with each other and then bonded together by using an adhesive. Thus, the ink jet head 201 is obtained.

Note that the first electrode layer 33, the orientation control layer 46, the piezoelectric layer 41 and the second electrode layer 42 may be formed by using any of the materials set forth in Embodiment 2, and the vibration layer 43 may be formed by using any of the materials set forth in Embodiment 3. Moreover, the thickness of each of these layers is not limited to any particular thickness as long as it is in the range set forth in Embodiments 2 and 3.

Also in the ink jet head 201 having such a structure as described above, as in Embodiment 3, the piezoelectric layer 41, which forms the actuator section B, has a uniform crystal orientation along the (001) plane and has high and uniform piezoelectric displacement characteristics, whereby a large piezoelectric displacement (amount of displacement) can be obtained with little deviation in the piezoelectric displacement characteristics among the plurality of ink discharging elements 202. Since a large piezoelectric displacement can be obtained, the ink-discharge performance is high, and it is possible to provide a large margin with which to adjust the power supply voltage, whereby it is possible to easily make an adjustment so as to reduce the deviation in the ink discharge among the plurality of ink discharging elements 202.

The ink jet head 201 including 250 ink discharging elements 202 of the same shape was actually produced by the manufacturing method as described above so as to measure the deviation in the vibration amplitude of the vibration layer 43 in the thickness direction, as in Embodiment 3, indicating that the deviation was as small as σ=1.2%.

Embodiment 5

Figure 16:
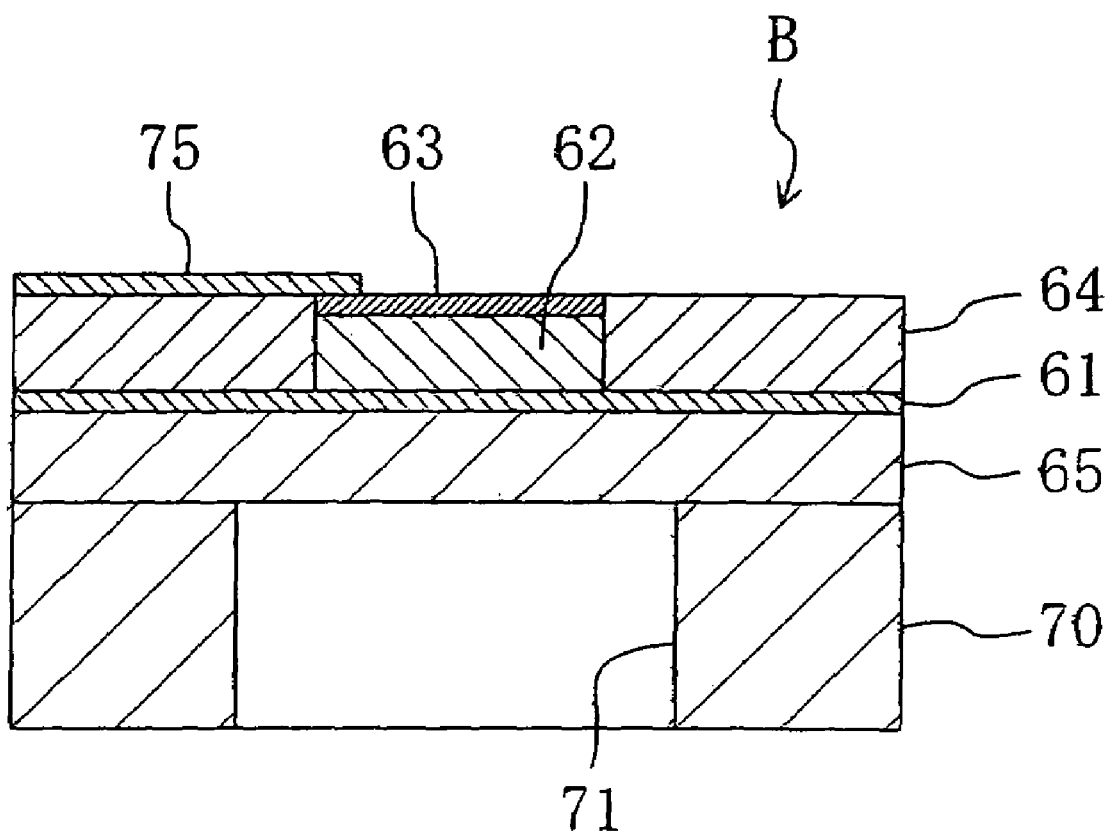
FIG. 16 is a view similar to FIG. 12, illustrating an important part (actuator section) of still another ink jet head according to an embodiment of the present invention.

FIG. 16 illustrates the actuator section B of the ink discharging element 202 in still another ink jet head 201 according to an embodiment of the present invention. In the present embodiment, the substrate used for forming layered films (referred to as "pressure chamber substrate 70" in the present embodiment and in Embodiment 6 to follow) is etched to form the pressure chamber cavity 71, thereby obtaining a pressure chamber member similar to those of Embodiments 3 and 4. Thus, the present embodiment differs from Embodiments 3 and 4 in that the pressure chamber substrate 70 (the pressure chamber member) and the actuator section B are provided as an integral member.

The ink discharging element 202 having a similar shape as that of FIG. 11 can be obtained by bonding an ink channel member and a nozzle plate similar to those of Embodiments 3 and 4 to the integral member including the pressure chamber substrate 70 and the actuator section B.

Specifically, in the present embodiment, a vibration layer 65 made of an amorphous aluminum oxide and having a thickness of 2.50 µm is provided on the pressure chamber substrate 70, in which the pressure chamber cavity 71 has been formed, a first electrode layer 61 (common electrode) made of a cobalt-containing iridium film (thickness: 0.10 µm) is provided on the vibration layer 65, a piezoelectric layer 62 made of a PZT thin film (thickness: 2.50 µm) is provided on the first electrode layer 61, and a second electrode layer 63 (separate electrode) made of a platinum thin film (thickness: 0.10 µm) that has been formed through a separation process into an elliptical shape similar to that of the first electrode layer 33 of Embodiments 3 and 4 is provided on the piezoelectric layer 62. The first electrode layer 61, the piezoelectric layer 62 and the second electrode layer 63 are arranged in this order to form a piezoelectric element. Moreover, the vibration layer 65 is provided on one surface of the piezoelectric element that is closer to the first electrode layer 61. Note that an adhesive layer for improving the adhesion between the vibration layer 65 and the first electrode layer 61 may be provided between the vibration layer 65 and the first electrode layer 61. Again, the adhesive layer may be made of at least one material selected from the group consisting of titanium, tantalum and molybdenum.

The piezoelectric layer 62 and the second electrode layer 63 are formed through a separation process so that they are present only above a portion of the pressure chamber substrate 70 where the pressure chamber cavity 71 is formed (i.e., a portion where silicon has been removed) via the vibration layer 65 and the first electrode layer 61, and a portion of the upper surface of the first electrode layer 61 surrounding the piezoelectric layer 62 and the second electrode layer 63 is covered by an electrically insulative organic film 64 made of a polyimide resin as in Embodiments 3 and 4. Moreover, an extraction electrode film 75 made of a gold thin film (thickness: 0.1 µm) is provided on the second electrode layer 63, which has been formed through a separation process.

Next, a method for manufacturing the ink jet head will be described with reference to FIG. 17A to FIG. 17H.

Figure 17A:
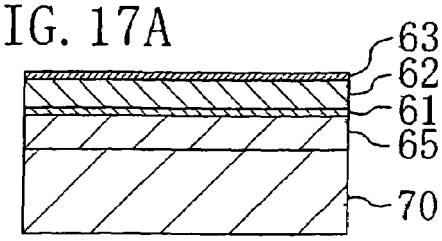
FIG. 17A to FIG. 17H illustrate steps in a method for manufacturing the ink jet head of FIG. 16.

As illustrated in FIG. 17A, the vibration layer 65, the first electrode layer 61, the piezoelectric layer 62 and the second electrode layer 63 are deposited in this order on the surface of the pressure chamber substrate 70 having a thickness of 0.3 mm and made of silicon by a sputtering method.

The vibration layer 65 can be obtained as follows. Using an RF magnetron sputtering apparatus, an aluminum oxide target is sputtered for 3 hours with a sputtering power of 700 W while keeping the substrate temperature at 400° C. in a mixed gas of argon and oxygen (Ar:$O_2$=14:1) as a sputtering gas whose gas pressure was kept at 0.2 Pa. Moreover, the first electrode layer 61, the piezoelectric layer 62 and the second electrode layer 63 can be obtained in a manner similar to that described in Embodiment 1.

Figure 17E:
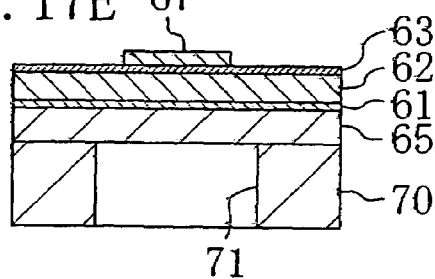
Figure 17B:
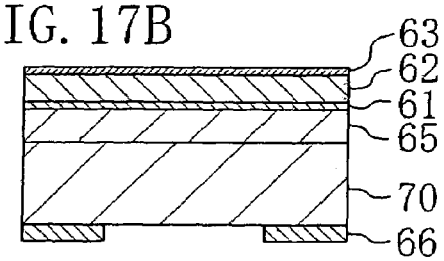

Then, as illustrated in FIG. 17B, a photoresist resin film 66 is applied in a predetermined pattern on one surface of the pressure chamber substrate 70 that is away from the layered structure formed thereon as described above, in preparation for the formation of the pressure chamber cavity 71 (having an elliptical shape whose minor axis is 200 µm long and whose major axis is 400 µm long).

Figure 17F:
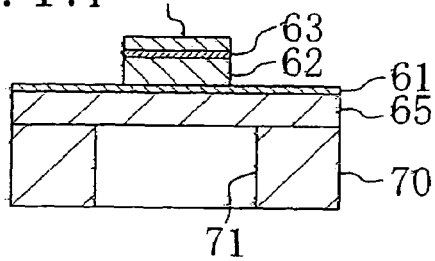
Figure 17C:
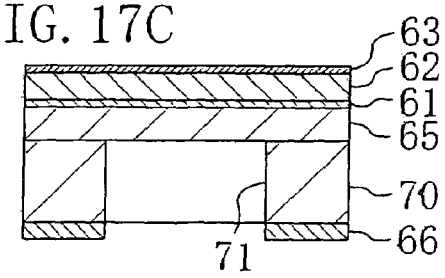

Then, as illustrated in FIG. 17C, the pressure chamber cavity 71 is formed in the pressure chamber substrate 70 by dry etching with an $SF_6$ gas using a plasma reactive etching apparatus.

Figure 17G:
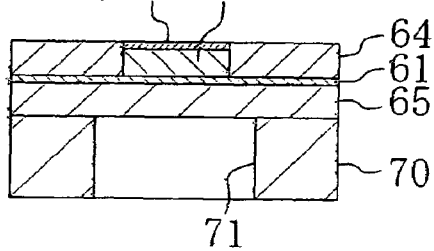
Figure 17D:
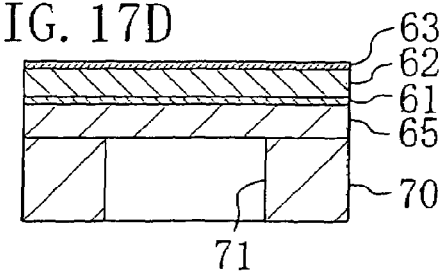

Next, as illustrated in FIG. 17D, the photoresist resin film 66 is removed. Then, as illustrated in FIG. 17E, a photoresist resin film 67 is formed in an elliptical pattern (an elliptical shape whose minor axis is 180 µm long and whose major axis is 380 µm long) on the second electrode layer 63 (at a position corresponding to the position of the pressure chamber cavity 71).

Then, as illustrated in FIG. 17F, a layered structure of the piezoelectric layer 62 and the second electrode layer 63 is obtained through a separation process into an elliptical pattern of the same shape as that of the photoresist resin film 67 by dry etching with a mixed gas of an argon gas and a $CF_4$ gas using a parallel-plate plasma reactive etching apparatus. In this dry etching process, the first electrode layer 61 can be used as an etching stop layer since the etching rate thereof is lower than those of the other layers.

Then, as illustrated in FIG. 17G, the photoresist resin film 67 having an elliptical shape is removed, and a polyimide resin film is formed by a printing method so as to surround the separated layered structure, after which the film is cured at 180° C., thus forming the electrically insulative organic film 64 made of a polyimide resin.

Figure 17H:
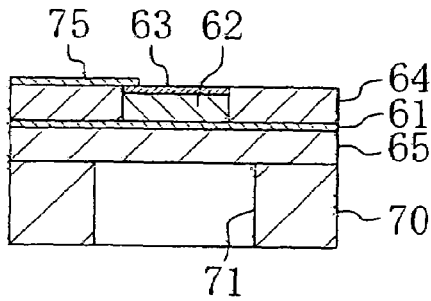

Next, as illustrated in FIG. 17H, the extraction electrode 75 made of a gold thin film (thickness: 0.1 µm) is formed by a sputtering method on the electrically insulative organic film 64 so as to partially overlap with the second electrode layer 63, thus obtaining the actuator section B integrated with the pressure chamber substrate 70.

Then, an ink channel member and a nozzle plate are bonded to the pressure chamber substrate 70 (pressure chamber member) as in Embodiments 3 and 4, thus obtaining the ink jet head 201.

Also in the present embodiment, as in Embodiment 3, the piezoelectric layer 62 has a uniform crystal orientation along the (001) plane, whereby a large piezoelectric displacement (amount of displacement) can be obtained with little deviation in the piezoelectric displacement characteristics among the plurality of ink discharging elements 202.

Note that the first electrode layer 61, the piezoelectric layer 62 and the second electrode layer 63 may be formed by using any of the materials set forth in Embodiment 1, and the vibration layer 65 may be formed by using any of the materials set forth in Embodiment 3. Moreover, the thickness of each of these layers is not limited to any particular thickness as long as it is in the range set forth in Embodiments 1 and 3.

The ink jet head 201 including 150 ink discharging elements 202 of the same shape was actually produced by the manufacturing method as described above so as to measure the deviation in the vibration amplitude of the vibration layer 65 in the thickness direction, as in Embodiment 3, indicating that the deviation was as small as σ=2.0%.

Embodiment 6

Figure 18:
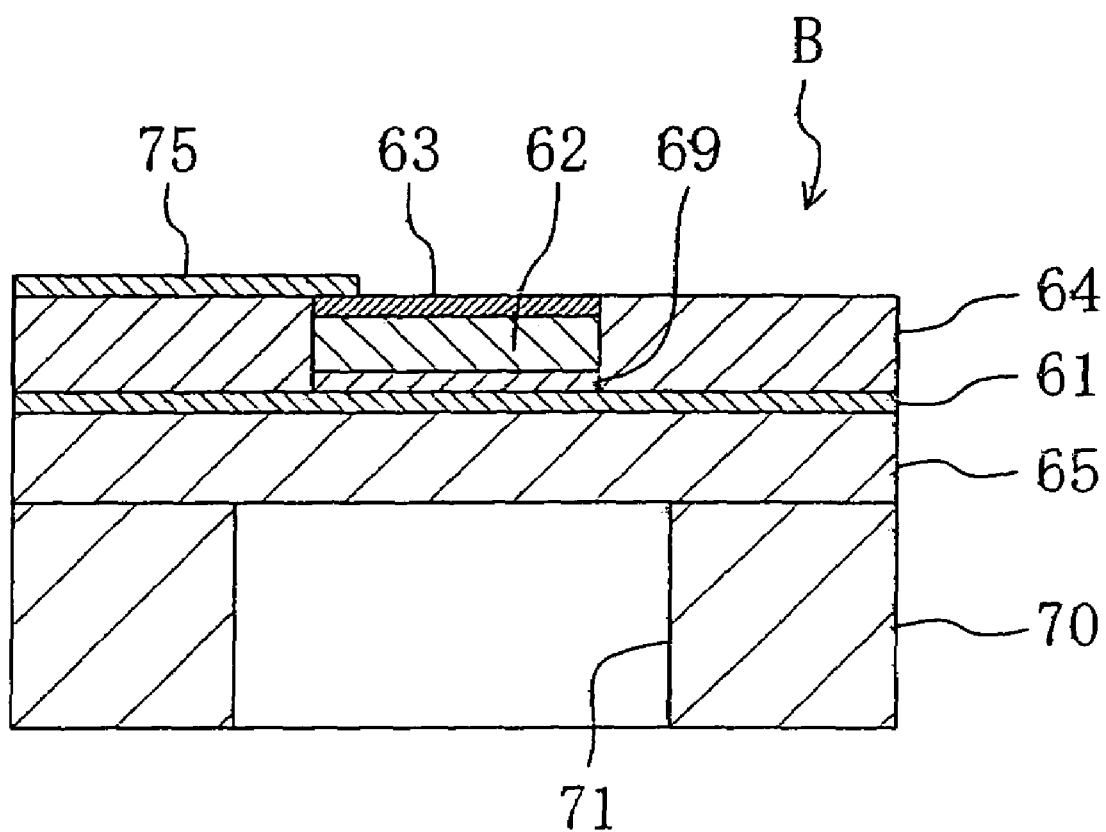
FIG. 18 is a view similar to FIG. 12, illustrating an important part (actuator section) of still another ink jet head according to an embodiment of the present invention.

FIG. 18 illustrates the actuator section B of the ink discharging element 202 in still another ink jet head 201 according to an embodiment of the present invention (note that the same components as those of FIG. 16 will be denoted by the same reference numerals and will not be further described below). The piezoelectric element of the present embodiment is similar to that illustrated in FIG. 16 (Embodiment 5) except that it further includes an orientation control layer 69 between the first electrode layer 61 and the piezoelectric layer 62 as in Embodiments 2 and 4. Other than this, the structure is similar to that illustrated in FIG. 16.

Specifically, in the present embodiment, the vibration layer 65 is provided on the pressure chamber substrate 70, in which the pressure chamber cavity 71 has been formed, the first electrode layer 61 is provided on the vibration layer 65, the orientation control layer 69 is provided on the first electrode layer 61, the piezoelectric layer 62 is provided on the orientation control layer 69, and the second electrode layer 63 is provided on the piezoelectric layer 62. The first electrode layer 61, the orientation control layer 69, the piezoelectric layer 62 and the second electrode layer 63 are arranged in this order to form a piezoelectric element. Moreover, the vibration layer 65 is provided on one surface of the piezoelectric element that is closer to the first electrode layer 61. Note that an adhesive layer for improving the adhesion between the vibration layer 65 and the first electrode layer 61 may be provided between the vibration layer 65 and the first electrode layer 61. Again, the adhesive layer may be made of at least one material selected from the group consisting of titanium, tantalum and molybdenum.

As the piezoelectric layer 62 and the second electrode layer 63, tire orientation control layer 69 is also formed through a separation process so that it is present only above a portion of the pressure chamber substrate 70 where the pressure chamber cavity 71 is formed.

Next, a method for manufacturing the ink jet head will be described with reference to FIG. 19A to FIG. 19H.

Figure 19A:
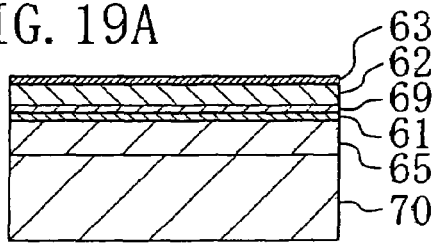
FIG. 19A to FIG. 19H illustrate steps in a method for manufacturing the ink jet head of FIG. 18.

As in Embodiment 2 (or 5), the vibration layer 65, the first electrode layer 61, the orientation control layer 69, the piezoelectric layer 62 and the second electrode layer 63 are deposited in this order on the surface of the pressure chamber substrate 70 having a thickness of 0.3 mm and made of silicon by a sputtering method (see FIG. 19A).

The vibration layer 65 can be obtained in a manner similar to that described in Embodiment 5. Moreover, the first electrode layer 61, the orientation control layer 69, the piezoelectric layer 62 and the second electrode layer 63 can be obtained in a manner similar to that described in Embodiment 2.

Figure 19B:
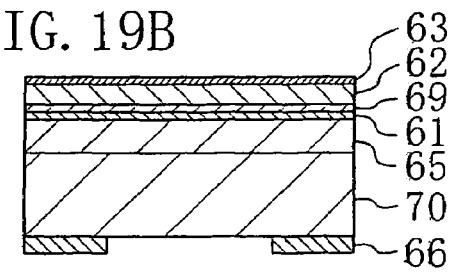
Figure 19C:
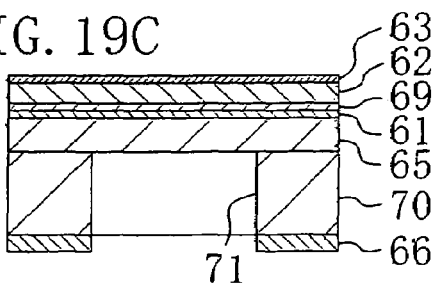

Then, as in Embodiment 5, the photoresist resin film 66 is applied in a predetermined pattern on one surface of the pressure chamber substrate 70 that is away from the layered structure formed thereon as described above, in preparation for the formation of the pressure chamber cavity 71 (see FIG. 19B). Then, the pressure chamber cavity 71 is formed in the pressure chamber substrate 70 by dry etching (see FIG. 19C).

Figure 19D:
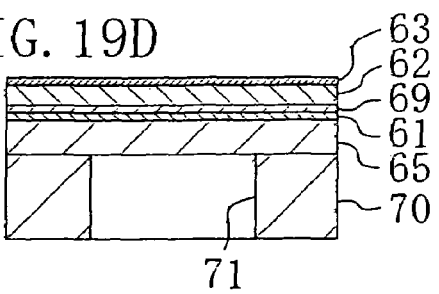
Figure 19E:
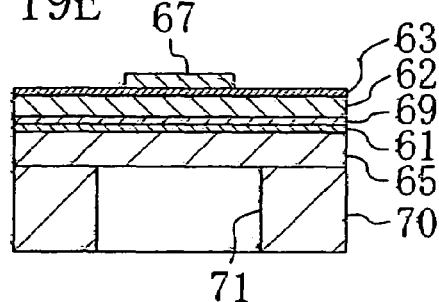

Then, as in Embodiment 5, the photoresist resin film 66 is removed (see FIG. 19D). Then, the photoresist resin film 67 is formed in an elliptical pattern on the second electrode layer 63 (at a position corresponding to the position of the pressure chamber cavity 71) (see FIG. 19E).

Figure 19F:
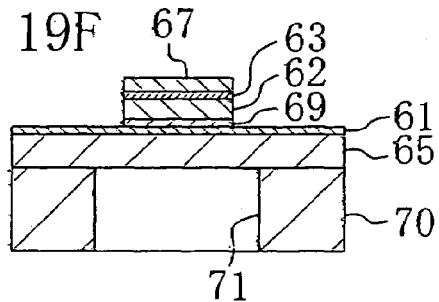

Then, as in Embodiment 5, a layered structure of the orientation control layer 69, the piezoelectric layer 62 and the second electrode layer 63 is obtained through a separation process into an elliptical pattern of the same shape as that of the photoresist resin film 67 by dry etching (see FIG. 19F).

Figure 19G:
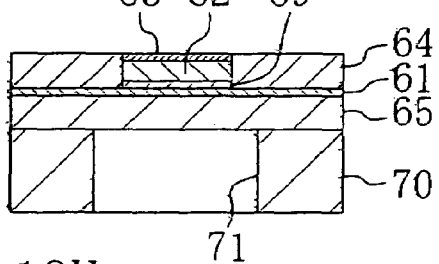
Figure 19H:
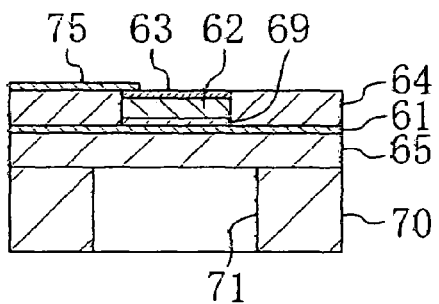

Then, as in Embodiment 5, the photoresist resin film 67 having an elliptical shape is removed, and a polyimide resin film is formed so as to surround the separated layered structure, after which the film is cured at 180° C., thus forming the electrically insulative organic film 64 made of a polyimide resin (see FIG. 19G). Then, the extraction electrode 75 is formed on the electrically insulative organic film 64 (see FIG. 19H), thus obtaining the actuator section B integrated with the pressure chamber substrate 70.

Then, an ink channel member and a nozzle plate are bonded to the pressure chamber substrate 70 (pressure chamber member) as in Embodiment 5, thus obtaining the ink jet head 201.

Also in the present embodiment, as in Embodiment 4, the piezoelectric layer 62 has a uniform crystal orientation along the (001) plane, whereby a large piezoelectric displacement (amount of displacement) can be obtained with little deviation in the piezoelectric displacement characteristics among the plurality of ink discharging elements 202.

Note that the first electrode layer 61, the orientation control layer 69, the piezoelectric layer 62 and the second electrode layer 63 may be formed by using any of the materials set forth in Embodiment 2, and the vibration layer 65 may be formed by using any of the materials set forth in Embodiment 3. Moreover, the thickness of each of these layers is not limited to any particular thickness as long as it is in the range set forth in Embodiments 2 and 3.

The ink jet head 201 including 150 ink discharging elements 202 of the same shape was actually produced by the manufacturing method as described above so as to measure the deviation in the vibration amplitude of the vibration layer 65 in the thickness direction, as in Embodiment 3, indicating that the deviation was as small as σ=2.3%.

Embodiment 7

Figure 20:
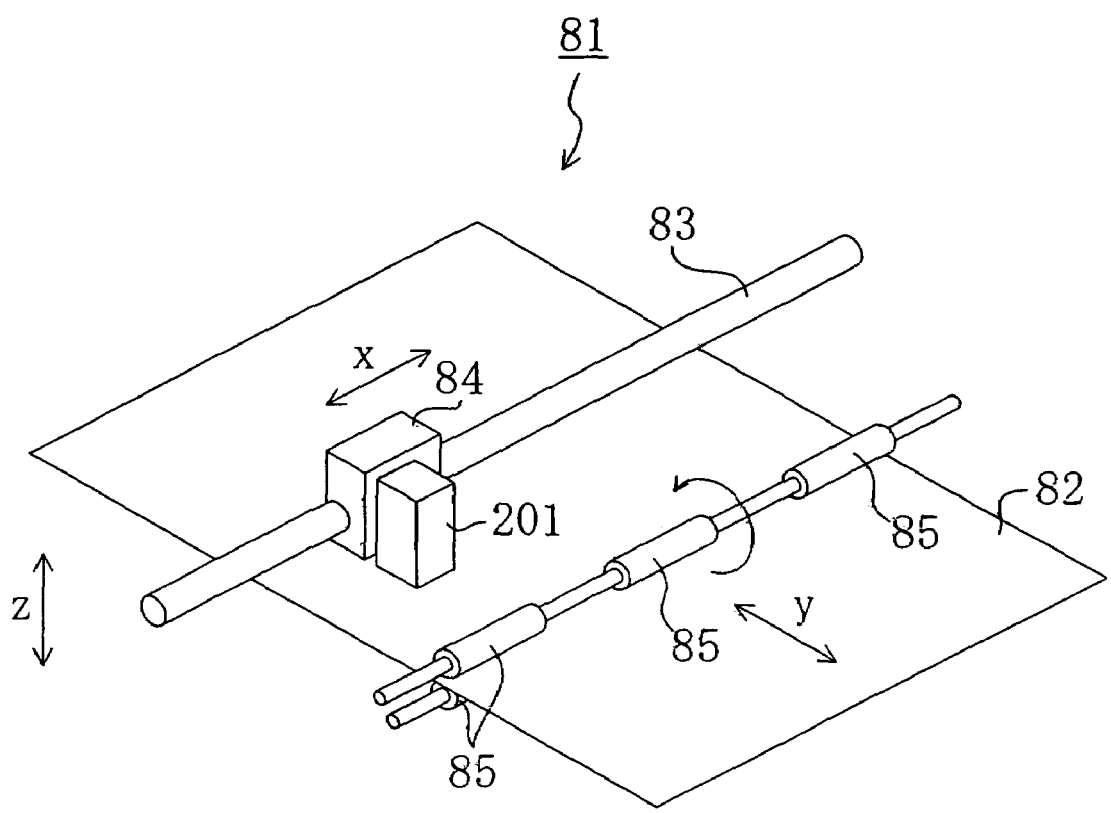
FIG. 20 is a schematic perspective view illustrating an ink jet recording apparatus according to an embodiment of the present invention.

FIG. 20 illustrates an ink jet recording apparatus 81 according to an embodiment of the present invention. The ink jet recording apparatus 81 includes the ink jet head 201 similar to that of any of Embodiments 3 to 6. In the ink jet head 201, ink in the pressure chamber is discharged through the nozzle hole (the nozzle hole 38 described in Embodiment 3) provided so as to be communicated to the pressure chamber (the pressure chamber 32 described in Embodiment 3) so as to land on a recording medium 82 (e.g., recording paper), thus recording information thereon.

The ink jet head 201 is mounted on a carriage 84, which is provided on a carriage shaft 83 extending in the primary scanning direction x, and is reciprocated in the primary scanning direction x as the carriage 84 reciprocates along the carriage shaft 83. Thus, the carriage 83 forms relative movement means for relatively moving the ink jet head 201 and the recording medium 82 with respect to each other in the primary scanning direction x.

Moreover, the ink jet recording apparatus 81 includes a plurality of rollers 85 for moving the recording medium 82 in the secondary scanning direction y, which is substantially perpendicular to the primary scanning direction x (width direction) of the ink jet head 201. Thus, the plurality of rollers 85 together form relative movement means for relatively moving the ink jet head 201 and the recording medium 82 with respect to each other in the secondary scanning direction y. Note that in FIG. 20, arrow z represents the vertical direction.

While the ink jet head 201 is moved by the carriage 84 from one side to the other in the primary scanning direction x, ink is discharged through the nozzle holes of the ink jet head 201 onto the recording medium 29. After one scan of recording operation, the recording medium 82 is moved by the rollers 85 by a predetermined amount, and then the next scan of recording operation is performed.

Thus, by manufacturing the ink jet recording apparatus 81 by using the ink jet head 201 of any of Embodiments 3 to 6, with which it is possible to easily control the deviation in the ink discharge among the plurality of ink discharging elements 202, it is possible to suppress the deviation in the recording operation onto the recording medium 82 such as paper, thus improving the reliability of the apparatus.

Embodiment 8

Figure 21:
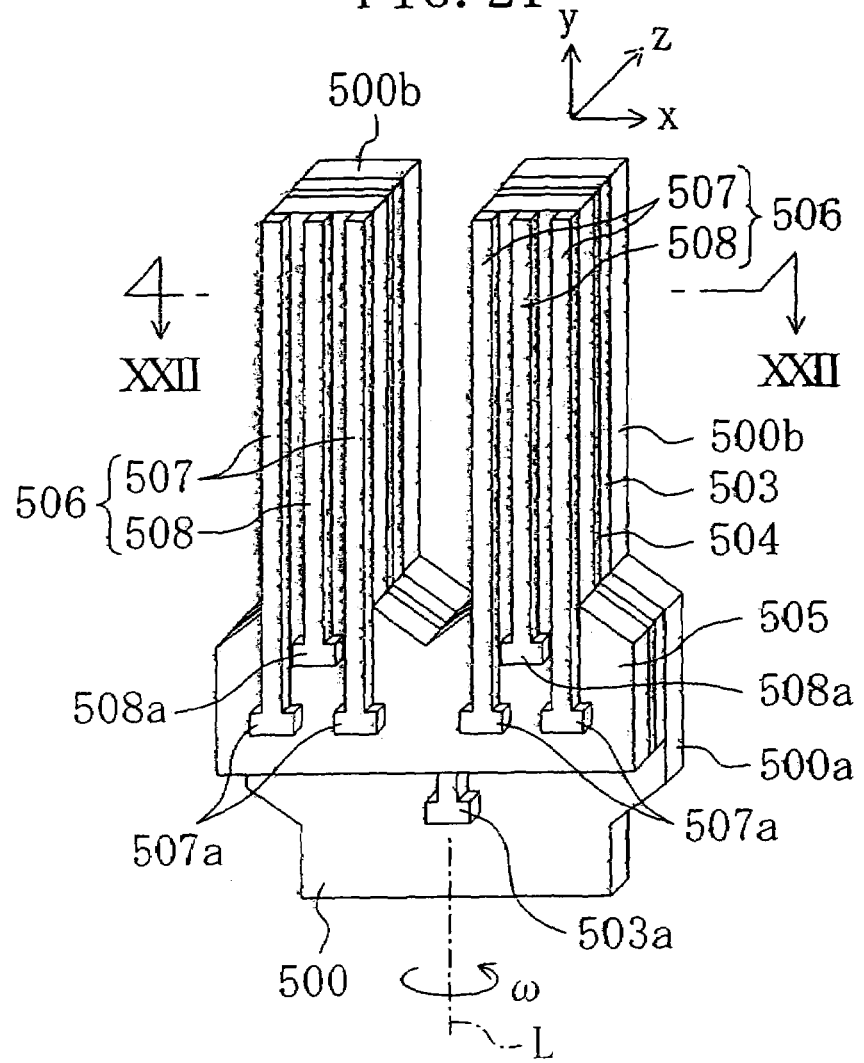
FIG. 21 is a schematic perspective view illustrating an angular velocity sensor according to an embodiment of the present invention.
Figure 22:
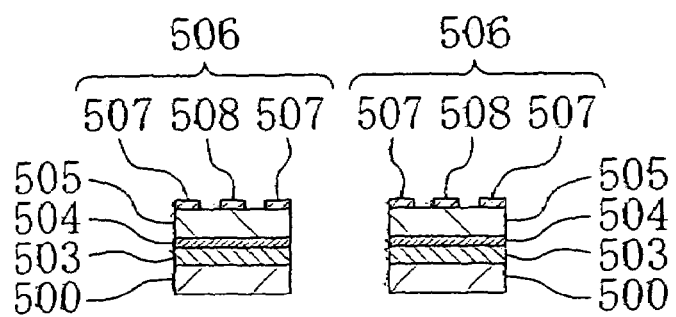
FIG. 22 is a cross-sectional view taken along line XXII—XXII of FIG. 21.

FIG. 21 and FIG. 22 illustrate an angular velocity sensor according to an embodiment of the present invention. The angular velocity sensor has a shape of a tuning fork, and can suitably be used in a vehicle-mounted navigation system, or the like.

The angular velocity sensor includes a substrate 500 made of a silicon wafer having a thickness of 0.3 mm (the substrate 500 may alternatively be a glass substrate, a metal substrate or a ceramic substrate). The substrate 500 includes a fixed portion 500a, and a pair of vibrating portions 500b extending from the fixed portion 500a in a predetermined direction (the direction of the rotation axis with respect to which the angular velocity is to be detected; the y direction in FIG. 21 in the present embodiment). The fixed portion 500a and the pair of vibrating portions 500b together form a shape of a tuning fork as viewed in the thickness direction of the substrate 500 (the z direction in FIG. 21), and the pair of vibrating portions 500b, corresponding to the arms of a tuning fork, extend in parallel to each other while being arranged next to each other in the width direction of the vibrating portions 500b.

A first electrode layer 503, an orientation control layer 504, a piezoelectric layer 505 and a second electrode layer 506 are layered in this order on the vibrating portions 500b of the substrate 500 and a portion of the fixed portion 500a close to the vibrating portions 500b. Note that also in the angular velocity sensor, it is preferred that an adhesive layer is provided between the substrate 500 and the first electrode layer 503, as in the piezoelectric element according to the variation of Embodiment 2.

The materials and the thicknesses of the first electrode layer 503, the orientation control layer 504, the piezoelectric layer 505 and the second electrode layer 506 are similar to those of the first electrode layer 2, the orientation control layer 11, the piezoelectric layer 3 and the second electrode layer 4, respectively, of Embodiment 2. Moreover, the structures of the orientation control layer 504 and the piezoelectric layer 505 are similar to those of the orientation control layer 11 and the piezoelectric layer 3, respectively. In the vicinity of one surface of the orientation control layer 504 that is closer to the first electrode layer 503, a (100)- or (001)-oriented region extends over a metal (e.g., cobalt) located on one surface of the first electrode layer 503 that is closer to the orientation control layer 504 so that the cross-sectional area of such a region in the direction perpendicular to the thickness direction gradually increases in the direction away from the first electrode layer 503 toward the piezoelectric layer 505.

On each vibrating portion 500b, the second electrode layer 506 is patterned into three portions, i.e., two driving electrodes 507 for vibrating the vibrating portion 500b in the width direction thereof (the x direction in FIG. 21), and a detection electrode 508 for detecting a displacement (deflection) of the vibrating portion 500b in the thickness direction thereof (the z direction).

The two driving electrodes 507 extend along the lateral edges of the vibrating portion 500b that are opposing each other with respect to the width direction thereof (the x direction) and entirely across the vibrating portion 500b in the longitudinal direction thereof (the y direction). One end of each driving electrode 507 that is closer to the fixed portion 500a forms a connection terminal 507a on the fixed portion 500a. Note that only one driving electrode 507 may alternatively be provided on one of the opposite edges of each vibrating portion 500b.

On the other hand, the detection electrode 508 extends in the central portion of the vibrating portion 500b with respect to the width direction thereof and entirely across the vibrating portion 500b in the longitudinal direction thereof. As does the driving electrode 507, one end of the detection electrode 508 that is closer to the fixed portion 500a forms a connection terminal 508a on the fixed portion 500a. Note that a plurality of detection electrodes 508 may alternatively be provided on each vibrating portion 500b.

Note that the first electrode layer 503 forms a connection terminal 503a, extending away from the vibrating portion 500b, on the fixed portion 500a between the pair of vibrating portions 500b.

Applied between the first electrode layer 503 and the two driving electrodes 507 on the vibrating portion 500b is a voltage having a frequency that is resonant with the proper oscillation of the vibrating portion 500b so that the vibrating portion 500b vibrates in the width direction thereof Specifically, two voltages of opposite polarity are applied to the two driving electrodes 507 while the ground voltage is applied to the first electrode layer 503, whereby when one lateral edge of the vibrating portion 500b expands, the other lateral edge contracts, and thus the vibrating portion 500b deforms toward the second lateral edge. On the other hand, when the first lateral edge of the vibrating portion 500b contracts, the second lateral edge expands, and thus the vibrating portion 500b deforms toward the first lateral edge. By repeating this operation, the vibrating portion 500b vibrates in the width direction thereof Note that by applying a voltage to only one of the two driving electrodes 507 on each vibrating portion 500b, the vibrating portion 500b can be vibrated in the width direction thereof The pair of vibrating portions 500b are configured so that they deform in opposite directions with respect to the width direction thereof and in symmetry with each other with respect to the center line L, which extends in the longitudinal direction of the vibrating portion 500b between the pair of vibrating portions 500b.

In the angular velocity sensor having such a configuration, if an angular velocity $\omega$ about the center line L is applied while the pair of vibrating portions 500b are being vibrated in the width direction thereof (the x direction) symmetrically with respect to the center line L, the two vibrating portions 500b are bent and deformed in the thickness direction (the z direction) by the Coriolis force (the pair of vibrating portions 500b are bent by the same amount but in opposite directions), thereby also bending the piezoelectric layer 505, and thus generating a voltage according to the magnitude of the Coriolis force between the first electrode layer 503 and the detection electrode 508. Then, the angular velocity $\omega$ can be calculated based on the magnitude of the voltage (the Coriolis force).

The Coriolis force Fc is expressed as follows: $Fc=2\,mv\omega$, where v denotes the velocity of each vibrating portion 500b in the width direction, and m denotes the mass of each vibrating portion 500b.

Thus, the value of the angular velocity $\omega$ can be obtained from the Coriolis force Fc.

Next, a method for manufacturing the angular velocity sensor will be described with reference to FIG. 23A to FIG. 23F and FIG. 24.

Figure 23A:
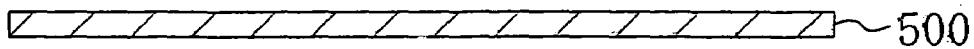
FIG. 23A to FIG. 23F illustrate steps in a method for manufacturing the angular velocity sensor of FIG. 21.
Figure 23B:
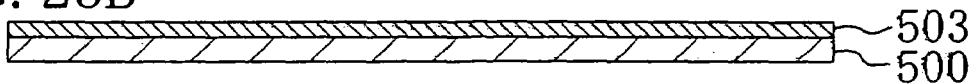
Figure 24:
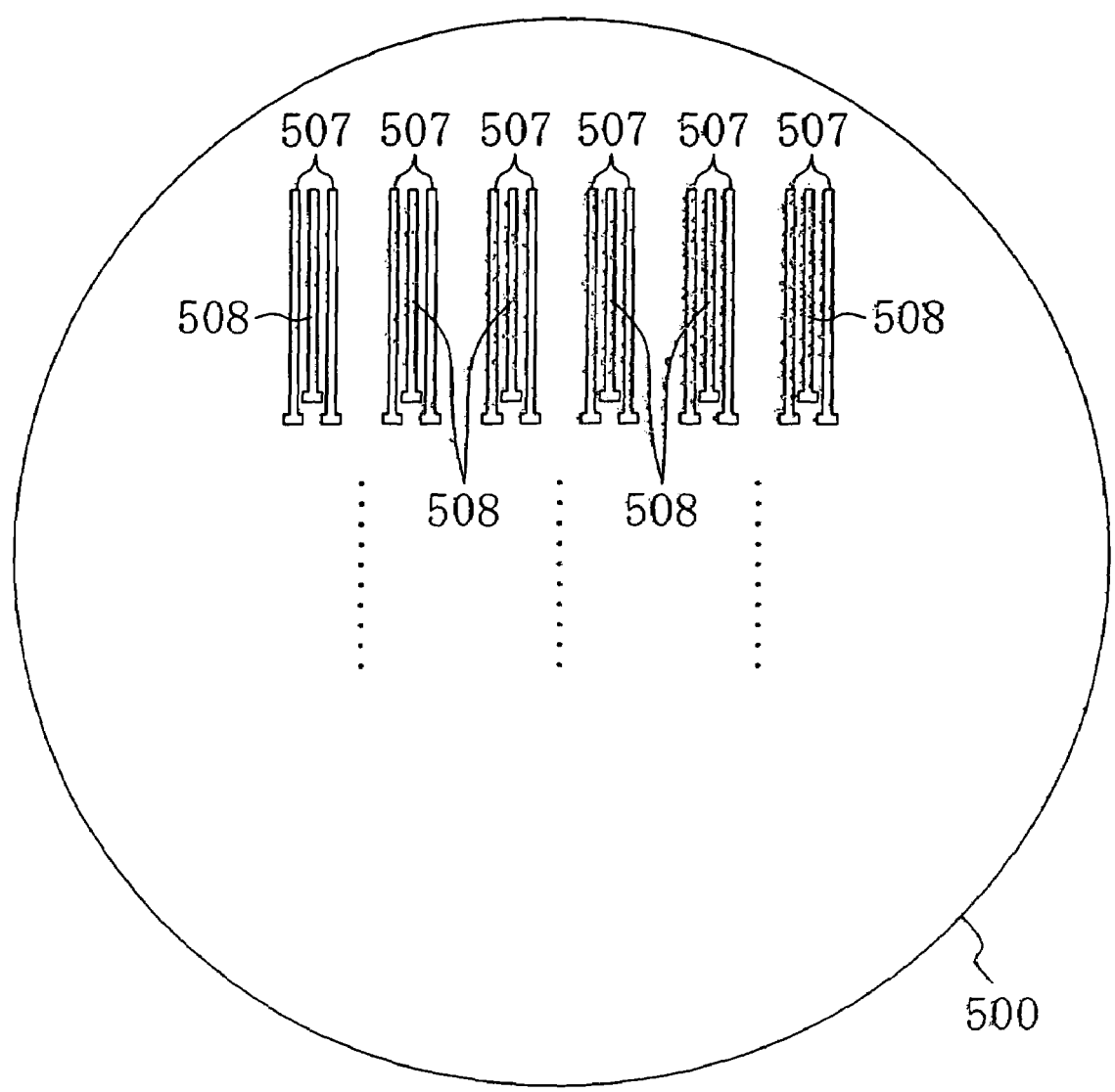
FIG. 24 is a plan view illustrating the method for manufacturing the angular velocity sensor of FIG. 21 after a second electrode layer is patterned.

As illustrated in FIG. 23A, the substrate 500 made of a 4-inch silicon wafer having a thickness of 0.3 mm is provided (see the plan view of FIG. 24). Then, as illustrated in FIG. 23B, the first electrode layer 503 is formed on the substrate 500 by a sputtering method under similar conditions to those of Embodiment 2.

Figure 23C:
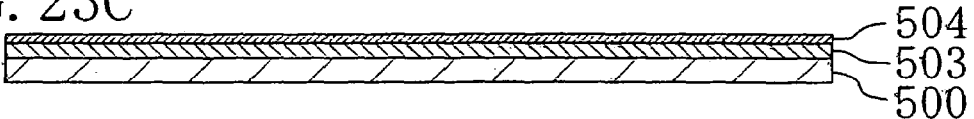

Then, as illustrated in FIG. 23C, the orientation control layer 504 is formed on the first electrode layer 503 by a sputtering method under similar conditions to those of Embodiment 2. As described in Embodiment 2 above, in the vicinity of one surface of the orientation control layer 504 that is closer to the first electrode layer 503, a (100)- or (001)-oriented region extends over titanium so that the cross-sectional area of the region in the direction perpendicular to the thickness direction gradually increases in the upward direction away from the first electrode layer 503.

Figure 23D:
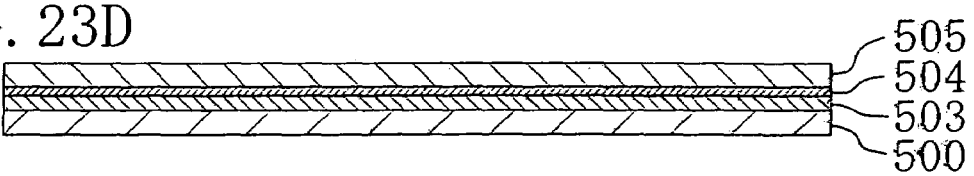

Then, as illustrated in FIG. 23D, the piezoelectric layer 505 is formed on the orientation control layer 504 by a sputtering method under similar conditions to those of Embodiment 2. As described in Embodiment 2, the piezoelectric layer 505 is rhombohedral, with the degree of (001) orientation thereof being 90% or more.

Figure 23E:
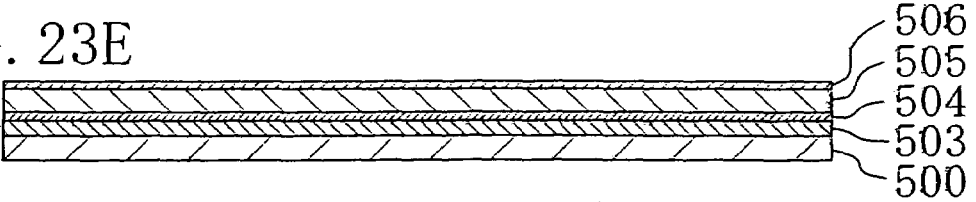

Then, as illustrated in FIG. 23E, the second electrode layer 506 is formed on the piezoelectric layer 505 by a sputtering method under similar conditions to those of Embodiment 2.

Figure 23F:
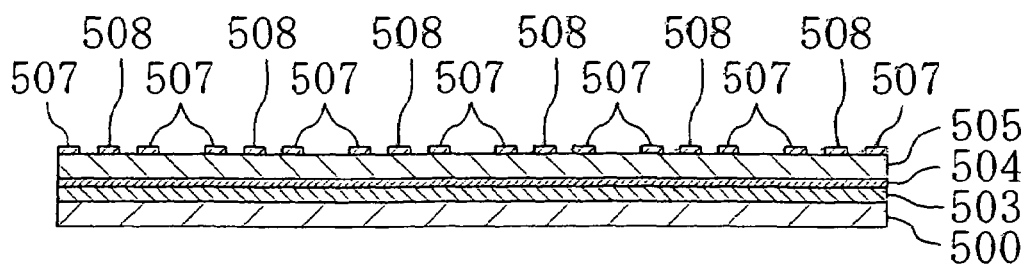

Next, as illustrated in FIG. 23F and FIG. 24, the second electrode layer 506 is patterned so as to form the driving electrodes 507 and the detection electrode 508. Specifically, a photosensitive resin is applied on the second electrode layer 506 and is exposed to light to form the pattern of the driving electrodes 507 and the detection electrode 508, and the unexposed portions of the photosensitive resin are removed. The second electrode layer 506 is etched and removed in locations where the photosensitive resin has been removed. Then, the photosensitive resin on the driving electrodes 507 and the detection electrode 508 is removed.

After patterning the second electrode layer 506, the piezoelectric layer 505, the orientation control layer 504 and the first electrode layer 503 are patterned in similar steps, and the substrate 500 is patterned, thereby forming the fixed portion 500a and the vibrating portions 500b. Thus, the angular velocity sensor is obtained.

Note that the deposition method for the various layers is not limited to a sputtering method, but may alternatively be any other suitable deposition method as long as a crystalline thin film is directly formed without the crystallization step using a heat treatment (e.g., a CVD method).

Figure 25:
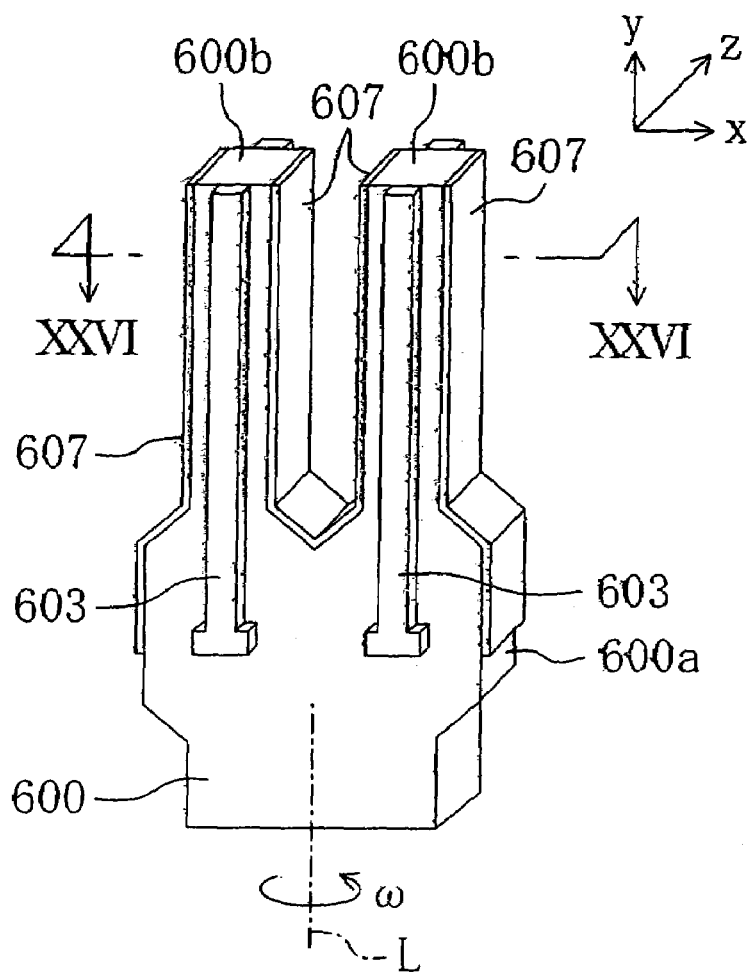
FIG. 25 is a schematic perspective view illustrating a conventional angular velocity sensor using quartz.
Figure 26:
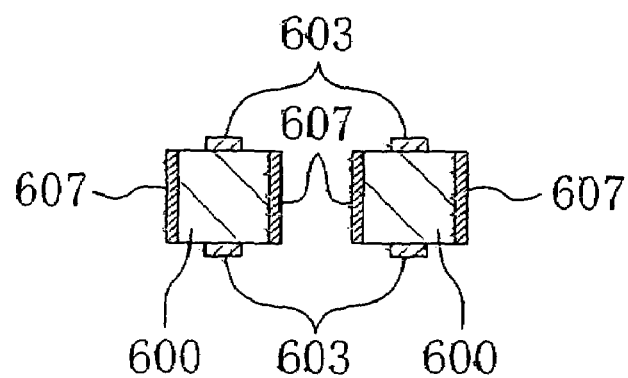
FIG. 26 is a cross-sectional view taken along line XXVI—XXVI of FIG. 25.

Now, a conventional angular velocity sensor will be described with reference to FIG. 25 and FIG. 26.

The conventional angular velocity sensor includes a piezoelectric member 600 made of quartz having a thickness of 0.3 mm. As does the substrate 500 of the angular velocity sensor of the present embodiment, the piezoelectric member 600 includes a fixed portion 600a, and a pair of vibrating portions 600b extending from the fixed portion 600a in one direction (the y direction in FIG. 25) in parallel to each other. The driving electrodes 603 for vibrating the vibrating portion 600b in the width direction thereof (the x direction in FIG. 25) are provided respectively on two surfaces of the vibrating portion 600b opposing each other in the thickness direction thereof (the z direction in FIG. 25), and detection electrodes 607 for detecting the displacement of the vibrating portion 600b in the thickness direction are provided respectively on two side surfaces of the vibrating portion 600b.

In the conventional angular velocity sensor, a voltage having a frequency that is resonant with the proper oscillation of the vibrating portion 600b is applied between the two driving electrodes 603 of each vibrating portion 600b so as to vibrate the pair of vibrating portions 600b in the width direction thereof (the x direction) symmetrically with respect to the center line L between the pair of vibrating portions 600b, as in the angular velocity sensor of the present embodiment. If an angular velocity ω about the center line L is applied in this state, the pair of vibrating portions 600b are bent and deformed in the thickness direction (the z direction) by the Coriolis force, thereby generating a voltage according to the magnitude of the Coriolis force between the two the detection electrodes 607 of each vibrating portion 600b. Then, the angular velocity ω can be calculated based on the magnitude of the voltage (the Coriolis force).

Since the conventional angular velocity sensor uses the piezoelectric member 600 made of quartz, the piezoelectric constant is as low as −3 pC/N. Moreover, since the fixed portion 600b and the vibrating portion 600b are machined, it is difficult to reduce the size thereof, and the dimensional precision thereof is low.

In contrast, in the angular velocity sensor of the present embodiment, the portion for detecting the angular velocity (the vibrating portion 500b) is the piezoelectric element having a similar structure to that of Embodiment 2. Therefore, the piezoelectric constant can be increased to be about 40 times as large as that of the conventional angular velocity sensor, and thus the size thereof can be reduced significantly. Moreover, minute processing with thin film formation techniques can be used, thereby significantly improving the dimensional precision. Furthermore, even if the angular velocity sensors are mass-produced industrially, it is possible to obtain angular velocity sensors with a high characteristics reproducibility and a small characteristics deviation, and with a high breakdown voltage and a high reliability.

Note that also in the angular velocity sensor of the present embodiment, the first electrode layer 503, the orientation control layer 504, the piezoelectric layer 505 and the second electrode layer 506 may be formed by using any of the materials set forth in Embodiment 2. Moreover, even when the orientation control layer 504 is absent as in Embodiment 1, a high-performance angular velocity sensor can be obtained.

Furthermore, while only one pair of vibrating portions 500b is provided in the substrate 500 in the angular velocity sensor of the present embodiment, a plurality of pairs of vibrating portions may alternatively be provided so as to detect angular velocities with respect to a plurality of axes extending in different directions.

Furthermore, while the first electrode layer 503, the orientation control layer 504, the piezoelectric layer 505 and the second electrode layer 506 are layered in this order on the vibrating portions 500b of the substrate 500 and a portion of the fixed portion 500a close to the vibrating portions 500b in the angular velocity sensor of the present embodiment, these layers may alternatively be layered only on the vibrating portions 500b.

In addition, while the piezoelectric element of the present invention is applied to an ink jet head (an ink jet recording apparatus) and an angular velocity sensor in the embodiments described above, the piezoelectric element of the present invention may be used in various other applications including, but not limited to, thin film condensers, charge storage capacitors of non-volatile memory devices, various kinds of actuators, infrared sensors, ultrasonic sensors, pressure sensors, acceleration sensors, flow meters, shock sensors, piezoelectric transformers, piezoelectric igniters, piezoelectric speakers, piezoelectric microphones, piezoelectric filters, piezoelectric pickups, tuning-fork oscillators, and delay lines. Particularly, the piezoelectric element of the present invention may suitably be used in a thin film piezoelectric actuator for a disk apparatus provided in a head supporting mechanism, in which a head for recording or reproducing information to/from a disk being spun in a disk apparatus (a disk apparatus used as a storage device of a computer, etc.) is provided on a substrate, wherein the substrate is deformed and the head is displaced by a thin film piezoelectric element provided on the substrate (see, for example, Japanese Laid-Open Patent Publication No. 2001-332041). The thin film piezoelectric element has a similar structure to that described in the embodiments above, in which the first electrode layer, the orientation control layer, the piezoelectric layer and the second electrode layer are layered in this order, with the second electrode layer being bonded to the substrate.

The entire content of Priority Document Nos. 2002-180273 and 2002-180292 is incorporated herein by reference.

What is claimed is:

1. An angular velocity sensor, comprising a substrate including a fixed portion and at least a pair of vibrating portions extending from the fixed portion in a predetermined direction, in which a first electrode layer, a piezoelectric layer and a second electrode layer are layered in this order at least on each of the vibrating portions of the substrate, and the second electrode layer on each of the vibrating portions is patterned into at least one driving electrode for vibrating the vibrating portion in a width direction thereof and at least one detection electrode for detecting a displacement of the vibrating portion in a thickness direction thereof, wherein:

the first electrode layer is made of an alloyed noble metal containing at least one metal selected from the group consisting of cobalt, nickel, iron, manganese and copper;

the piezoelectric layer is made of a rhombohedral or tetragonal perovskite oxide that is preferentially oriented along a (001) plane;

a portion of the piezoelectric layer that is closer to the first electrode layer has a structure in which a (001)-oriented region extends over the at least one metal in a portion of a surface of the first electrode layer that is closer to the piezoelectric layer, and a cross-sectional area of the (001)-oriented region taken along a plane perpendicular to a thickness direction of the piezoelectric layer gradually increases in a direction away from the first electrode layer toward the second electrode layer; and the at least one metal forms pattern in the first electrode to control a growth direction of the piezoelectric layer.

2. An angular velocity sensor, comprising a substrate including a fixed portion and at least a pair of vibrating portions extending from the fixed portion in a predetermined direction, in which a first electrode layer, a piezoelectric layer and a second electrode layer are layered in this order at least on each of the vibrating portions of the substrate, and the second electrode layer on each of the vibrating portions is patterned into at least one driving electrode for vibrating the vibrating portion in a width direction thereof and at least one detection electrode for detecting a displacement of the vibrating portion in a thickness direction thereof, wherein:

the first electrode layer is made of an alloyed noble metal containing at least one metal selected from the group consisting of cobalt, nickel, iron, manganese and copper;

the piezoelectric layer is made of a rhombohedral or tetragonal perovskite oxide that is referentially oriented along a (001) plane;

an orientation control layer made of a cubic or tetragonal perovskite oxide that is preferentially oriented along a (100) or (001) plane is provided between the first electrode layer and the piezoelectric layer;

a portion of the orientation control layer that is closer to the first electrode layer has a structure in which a (100)- or (001)-oriented region extends over the at least one metal in a portion of a surface of the first electrode layer that is closer to the orientation control layer, and a cross-sectional area of the region in a direction perpendicular to a thickness direction gradually increases in a direction away from the first electrode layer toward the piezoelectric layer; and the at least one metal forms a pattern in the first electrode to control a growth direction of the orientation control layer.

* * * * *

UNITED STATES PATENT AND TRADEMARK OFFICE
CERTIFICATE OF CORRECTION

| | | |
|---|---|---|
| PATENT NO. | : 7,185,540 B2 | Page 1 of 1 |
| APPLICATION NO. | : 11/409469 | |
| DATED | : March 6, 2007 | |
| INVENTOR(S) | : Hideo Torii et al. | |

It is certified that error appears in the above-identified patent and that said Letters Patent is hereby corrected as shown below:

Title Page item 45

-- This patent is subject to a terminal disclaimer -- should be added under (*) Notice: section

Column 52

Line 53, Claim 1, insert -- a -- between "forms" and "pattern"

Column 53

Line 14, Claim 2, "referentially" should be -- preferentially --

Signed and Sealed this

Third Day of July, 2007

JON W. DUDAS
*Director of the United States Patent and Trademark Office*

UNITED STATES PATENT AND TRADEMARK OFFICE
CERTIFICATE OF CORRECTION

PATENT NO. : 7,185,540 B2  Page 1 of 1
APPLICATION NO. : 11/409469
DATED : March 6, 2007
INVENTOR(S) : Hideo Torii et al.

It is certified that error appears in the above-identified patent and that said Letters Patent is hereby corrected as shown below:

Title Page item 45

Notice: -- This patent is subject to a terminal disclaimer -- should be added under (*) section

Column 52

Line 63, Claim 1, insert -- a -- between "forms" and "pattern"

Column 53

Line 14, Claim 2, "referentially" should be -- preferentially --

This certificate supersedes the Certificate of Correction issued July 3, 2007.

Signed and Sealed this
Tenth Day of January, 2012

David J. Kappos
*Director of the United States Patent and Trademark Office*